(12) United States Patent
Miura

(10) Patent No.: US 8,884,349 B2
(45) Date of Patent: Nov. 11, 2014

(54) SEMICONDUCTOR DEVICE

(75) Inventor: Yuki Miura, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 703 days.

(21) Appl. No.: 13/084,116

(22) Filed: Apr. 11, 2011

(65) Prior Publication Data
US 2011/0254066 A1 Oct. 20, 2011

(30) Foreign Application Priority Data
Apr. 14, 2010 (JP) ................................ 2010-093557

(51) Int. Cl.
*H01L 29/94* (2006.01)
*H01L 27/02* (2006.01)
*H01L 27/118* (2006.01)

(52) U.S. Cl.
CPC ........... *H01L 29/94* (2013.01); *H01L 27/11803* (2013.01); *H01L 27/0207* (2013.01)
USPC .................. 257/296; 257/E29.345

(58) Field of Classification Search
USPC .......................................... 257/296, E29.345
See application file for complete search history.

(56) References Cited

U.S. PATENT DOCUMENTS

| | | | | | |
|---|---|---|---|---|---|
| 5,567,963 | A | * | 10/1996 | Rao | 257/296 |
| 5,903,023 | A | * | 5/1999 | Hoshi | 257/300 |
| 7,091,543 | B2 | * | 8/2006 | Tzeng et al. | 257/301 |
| 7,302,660 | B2 | | 11/2007 | Shimamura | |
| 7,589,361 | B2 | | 9/2009 | Takahata | |

FOREIGN PATENT DOCUMENTS

| | | |
|---|---|---|
| JP | 05-003252 | 1/1993 |
| JP | 2005-259842 | 9/2005 |
| JP | 2006-253393 | 9/2006 |

* cited by examiner

*Primary Examiner* — Matthew W Such
*Assistant Examiner* — Monica D Harrison
(74) *Attorney, Agent, or Firm* — Young & Thompson

(57) ABSTRACT

A semiconductor device includes, a semiconductor substrate, a first transistor of a first conductivity type, a second transistor of a second conductivity type, a capacitor, and a first wiring. The semiconductor substrate includes first, second, and third regions. The third region is sandwiched between the first and second regions. The first transistor of the first conductivity type is disposed in the first region. The second transistor of the second conductivity type is disposed in the second region. The first capacitor is disposed in the third region. The first wiring electrically couples one of main electrodes of the first transistor and one of main electrodes of the second transistor. The first wiring passes above the first capacitor.

20 Claims, 28 Drawing Sheets

FIG. 2

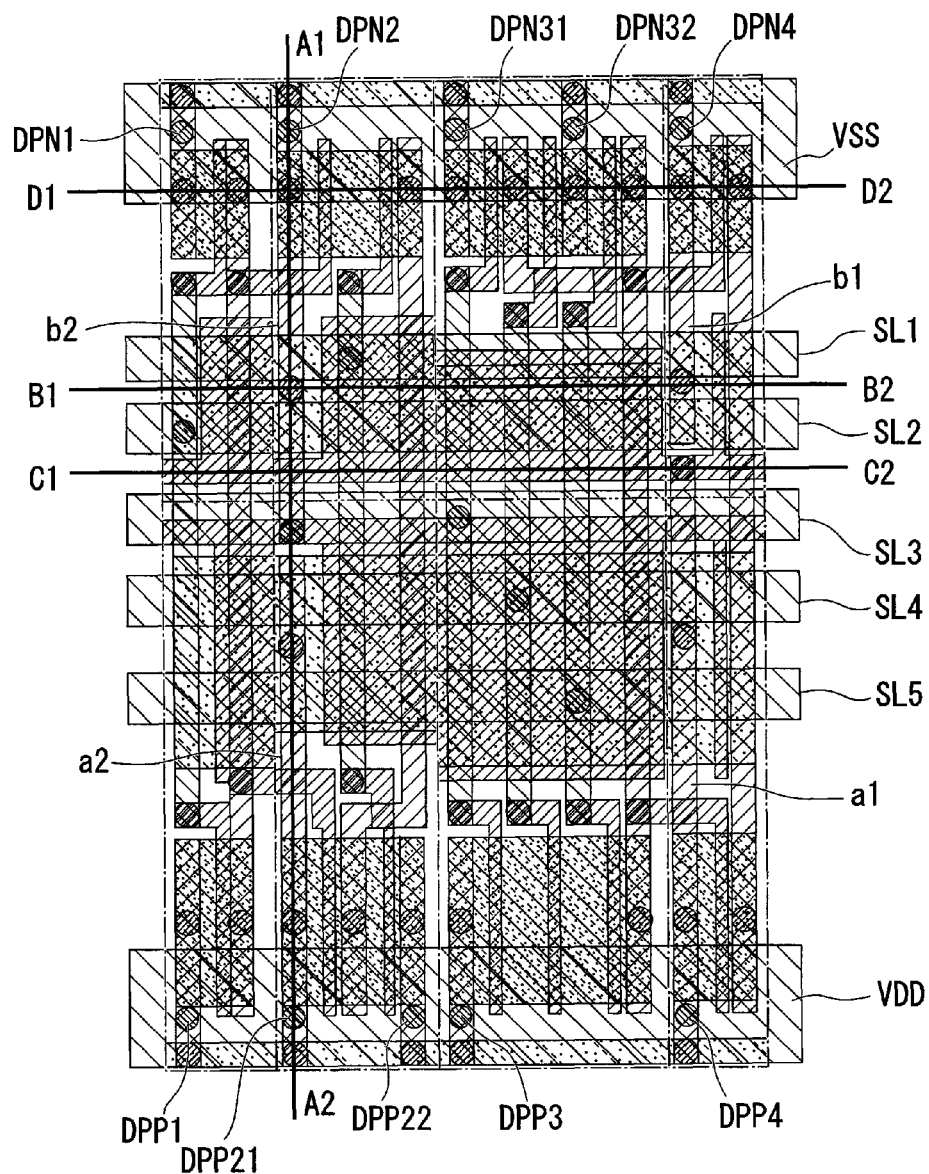

⊘ : CONTACT HOLE (CONNECTION BETWEEN FIRST LAYER WIRING AND DIFFUSION LAYER OR GATE)
⊚ : FIRST THROUGH HOLE (CONNECTION BETWEEN FIRST LAYER WIRING AND SECOND LAYER WIRING)
▨ : GATE WIRING (FIRST LAYER WIRING (W))
▨ : FIRST LAYER WIRING (W)
▨ : SECOND LAYER WIRING (1 Al)
▨ : GATE
▨ : DIFFUSION LAYER OF FUNCTIONAL ELEMENT TRANSISTOR
▨ : DIFFUSION LAYER (INCLUDING COMPENSATION CAPACITIVE ELEMENT DIFFUSION LAYER)

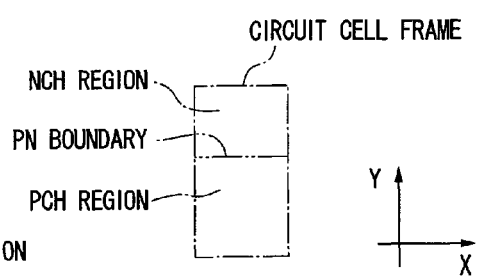

FIG. 3
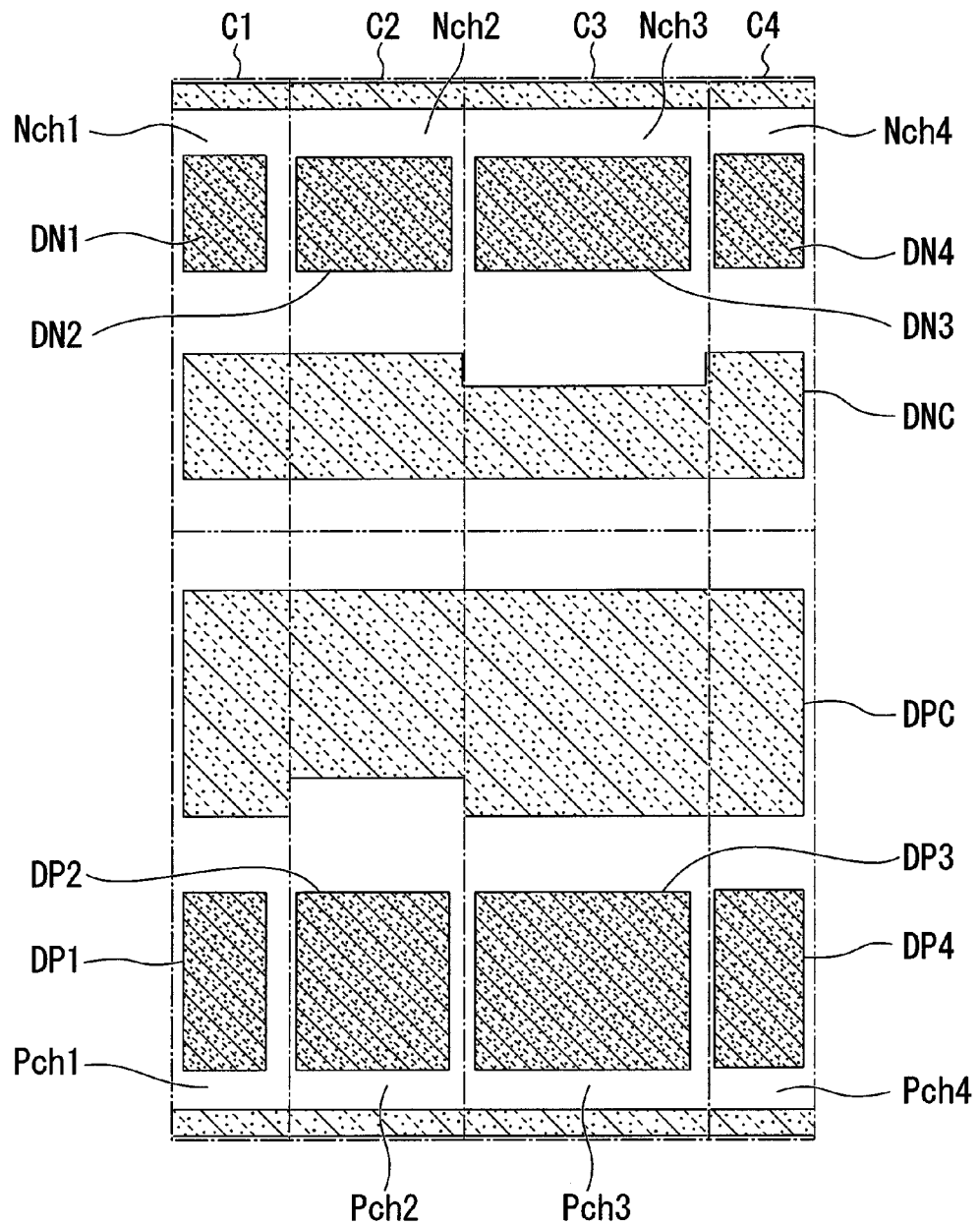
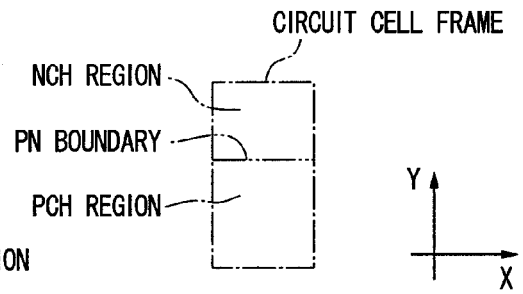
: DIFFUSION LAYER OF FUNCTIONAL ELEMENT TRANSISTOR
: DIFFUSION LAYER (INCLUDING COMPENSATION CAPACITIVE ELEMENT DIFFUSION LAYER)

FIG. 4
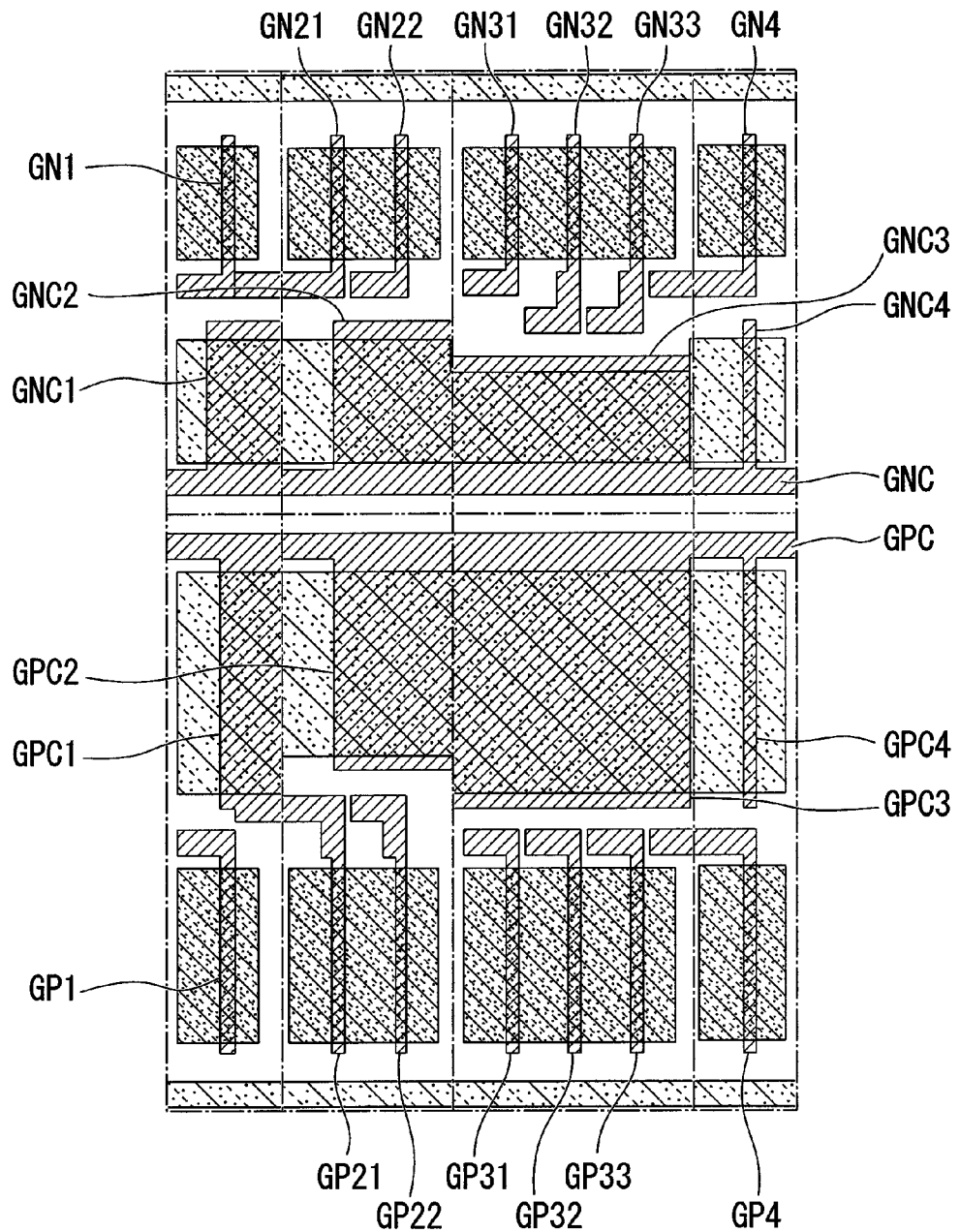
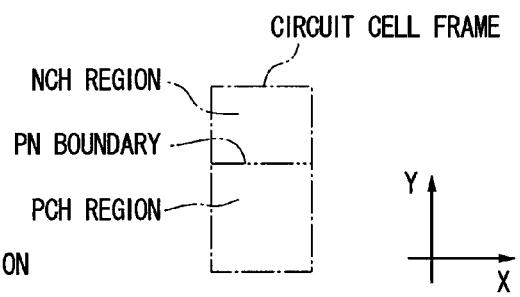

FIG. 6
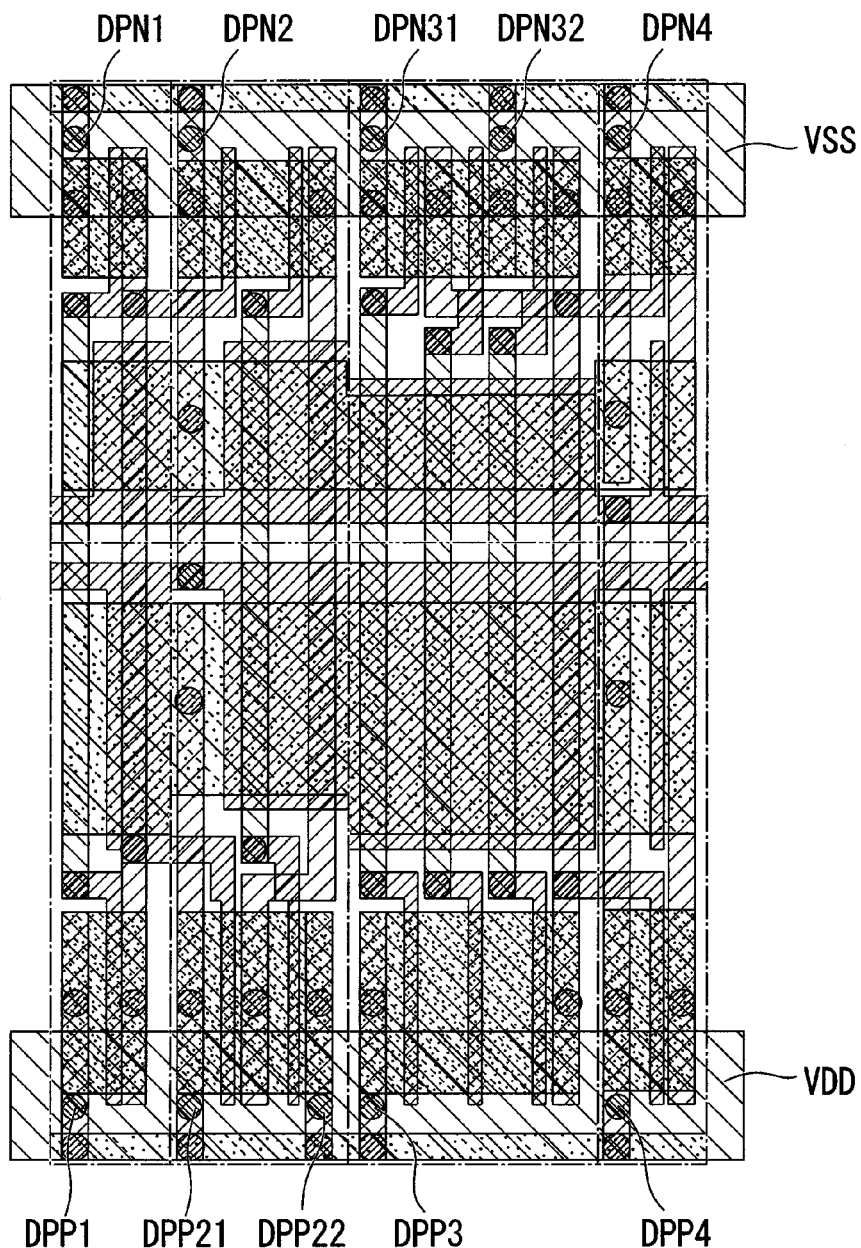
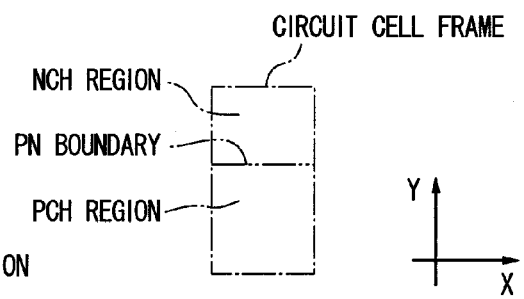

FIG. 7

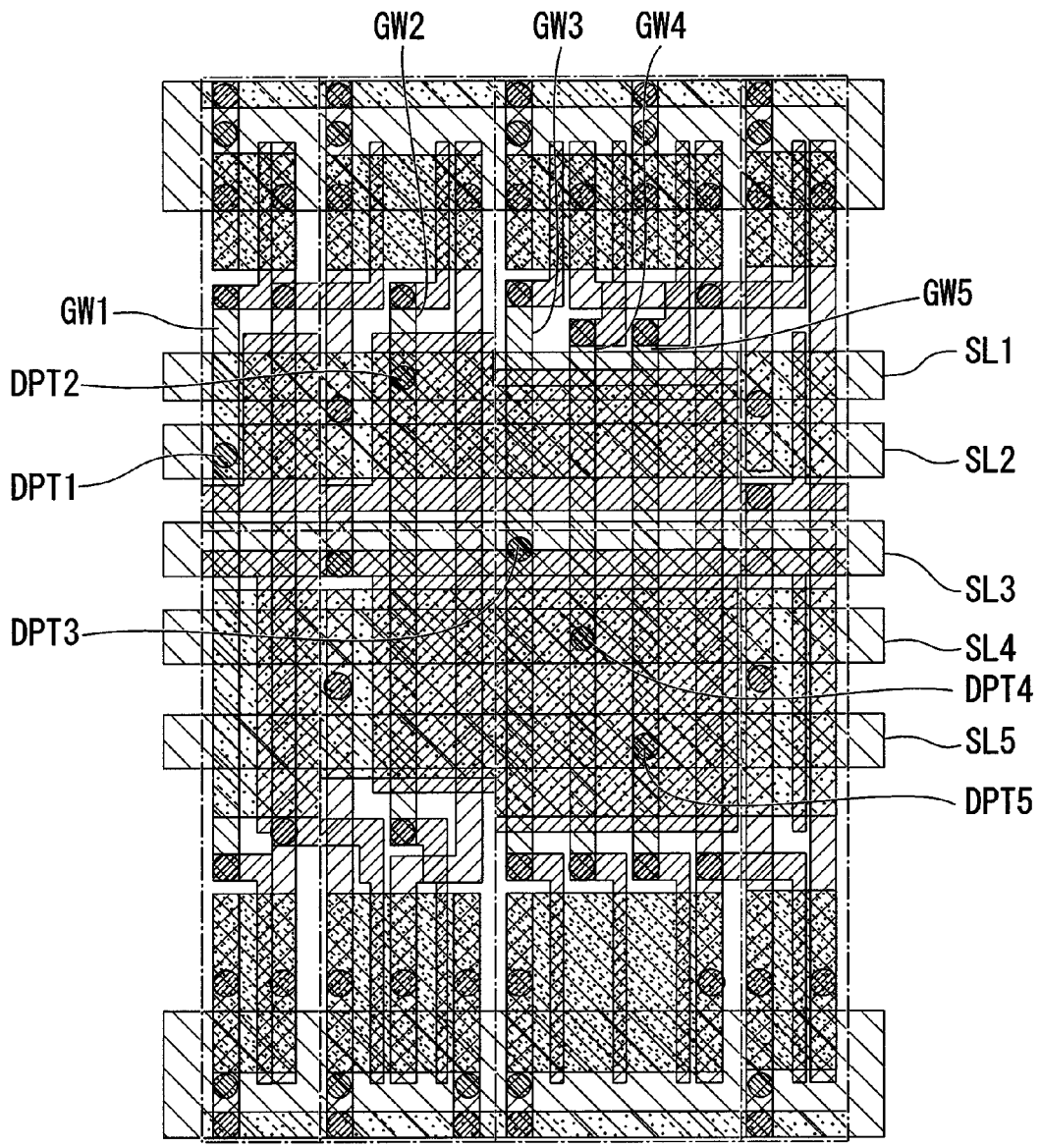

- ⊘ : CONTACT HOLE (CONNECTION BETWEEN FIRST LAYER WIRING AND DIFFUSION LAYER OR GATE)
- ⊚ : FIRST THROUGH HOLE (CONNECTION BETWEEN FIRST LAYER WIRING AND SECOND LAYER WIRING)
- ▨ : GATE WIRING (FIRST LAYER WIRING (W))
- ▨ : FIRST LAYER WIRING (W)
- ▨ : SECOND LAYER WIRING (1 Al)
- ▨ : GATE
- ▨ : DIFFUSION LAYER OF FUNCTIONAL ELEMENT TRANSISTOR
- ▨ : DIFFUSION LAYER (INCLUDING COMPENSATION CAPACITIVE ELEMENT DIFFUSION LAYER)

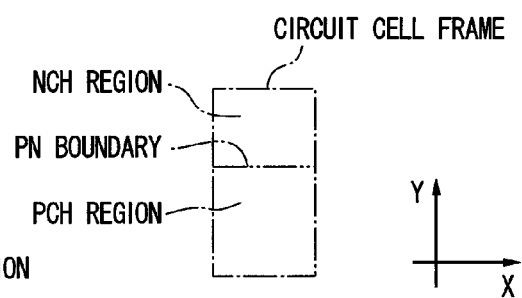

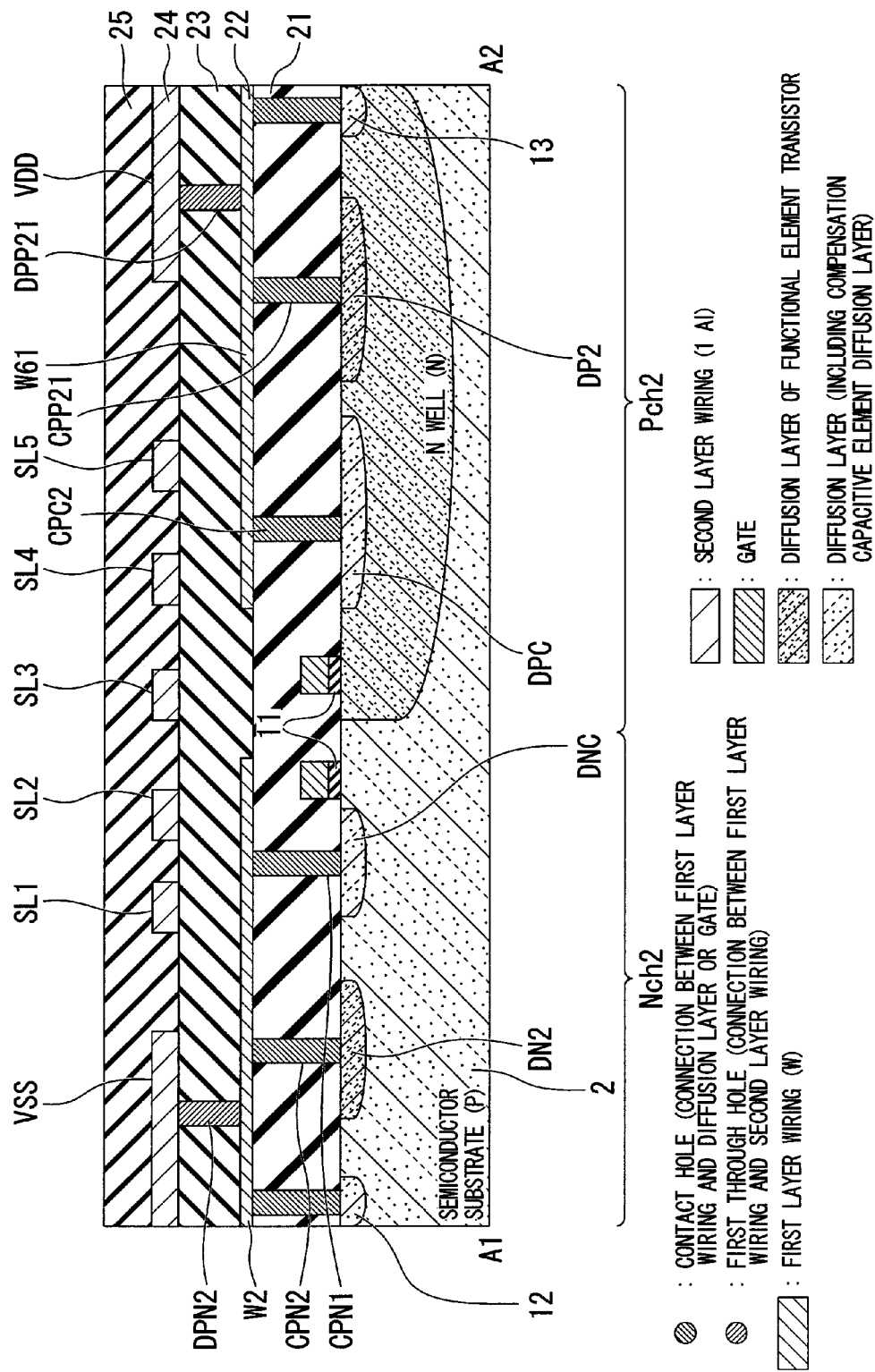

FIG. 13

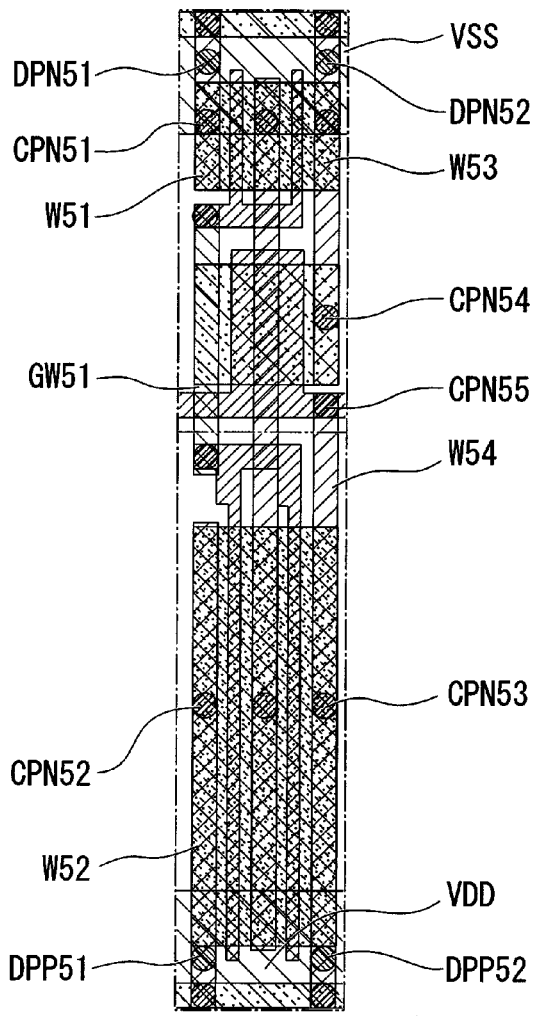

- ⊘ : CONTACT HOLE (CONNECTION BETWEEN FIRST LAYER WIRING AND DIFFUSION LAYER OR GATE)
- ⊚ : FIRST THROUGH HOLE (CONNECTION BETWEEN FIRST LAYER WIRING AND SECOND LAYER WIRING)
- ▨ : GATE WIRING (FIRST LAYER WIRING (W))
- ▨ : FIRST LAYER WIRING (W)
- ▨ : SECOND LAYER WIRING (1 Al)
- ▨ : GATE
- ▨ : DIFFUSION LAYER OF FUNCTIONAL ELEMENT TRANSISTOR
- ▨ : DIFFUSION LAYER (INCLUDING COMPENSATION CAPACITIVE ELEMENT DIFFUSION LAYER)

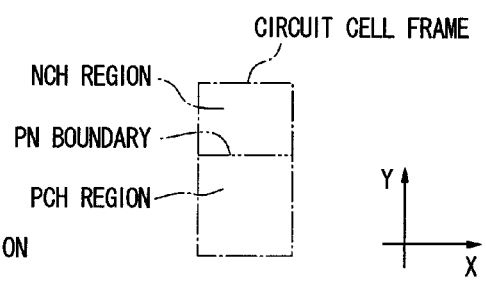

FIG. 14
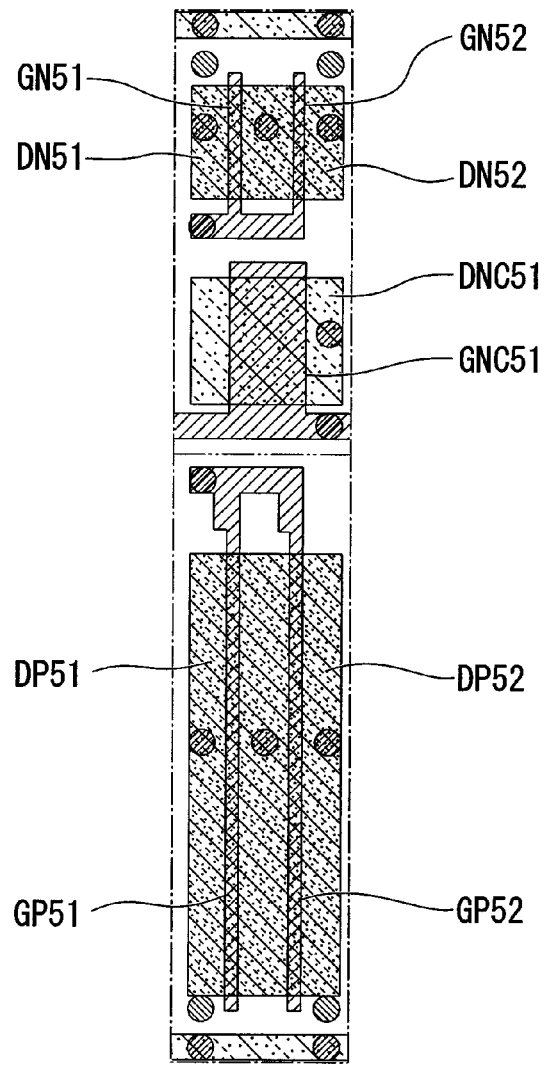
- ⊘ : CONTACT HOLE
  (CONNECTION BETWEEN FIRST LAYER
  WIRING AND DIFFUSION LAYER OR GATE)
- ⊗ : FIRST THROUGH HOLE
  (CONNECTION BETWEEN FIRST LAYER
  WIRING AND SECOND LAYER WIRING)
- ▨ : GATE
- ▧ : DIFFUSION LAYER OF FUNCTIONAL ELEMENT TRANSISTOR
- ▨ : DIFFUSION LAYER (INCLUDING COMPENSATION CAPACITIVE ELEMENT DIFFUSION LAYER)
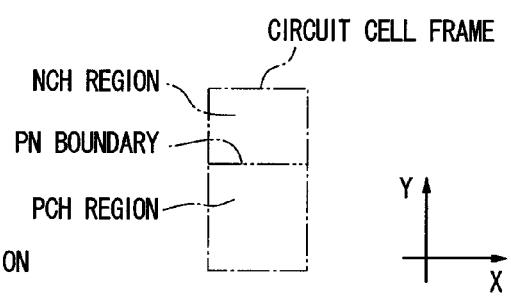

FIG. 15

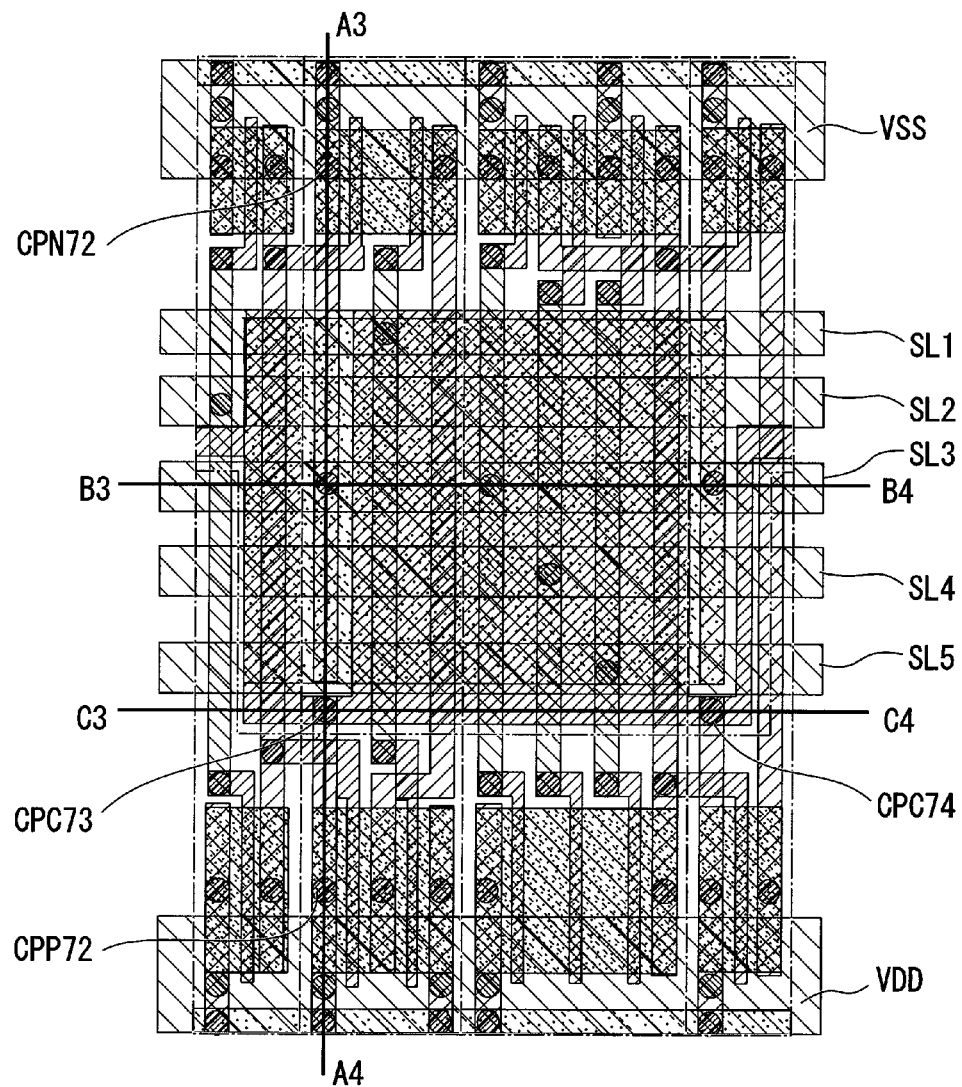

⊚ : CONTACT HOLE (CONNECTION BETWEEN FIRST LAYER WIRING AND DIFFUSION LAYER OR GATE)
⊛ : FIRST THROUGH HOLE (CONNECTION BETWEEN FIRST LAYER WIRING AND SECOND LAYER WIRING)
▨ : GATE WIRING (FIRST LAYER WIRING (W))
▨ : FIRST LAYER WIRING (W)
▨ : SECOND LAYER WIRING (1 Al)
▨ : GATE
▨ : DIFFUSION LAYER OF FUNCTIONAL ELEMENT TRANSISTOR
▨ : DIFFUSION LAYER (INCLUDING COMPENSATION CAPACITIVE ELEMENT DIFFUSION LAYER)

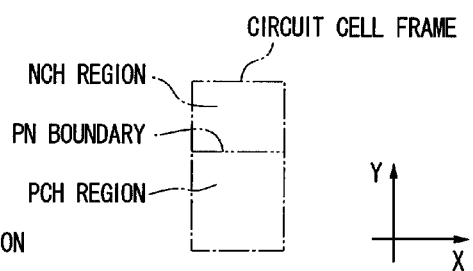

FIG. 16
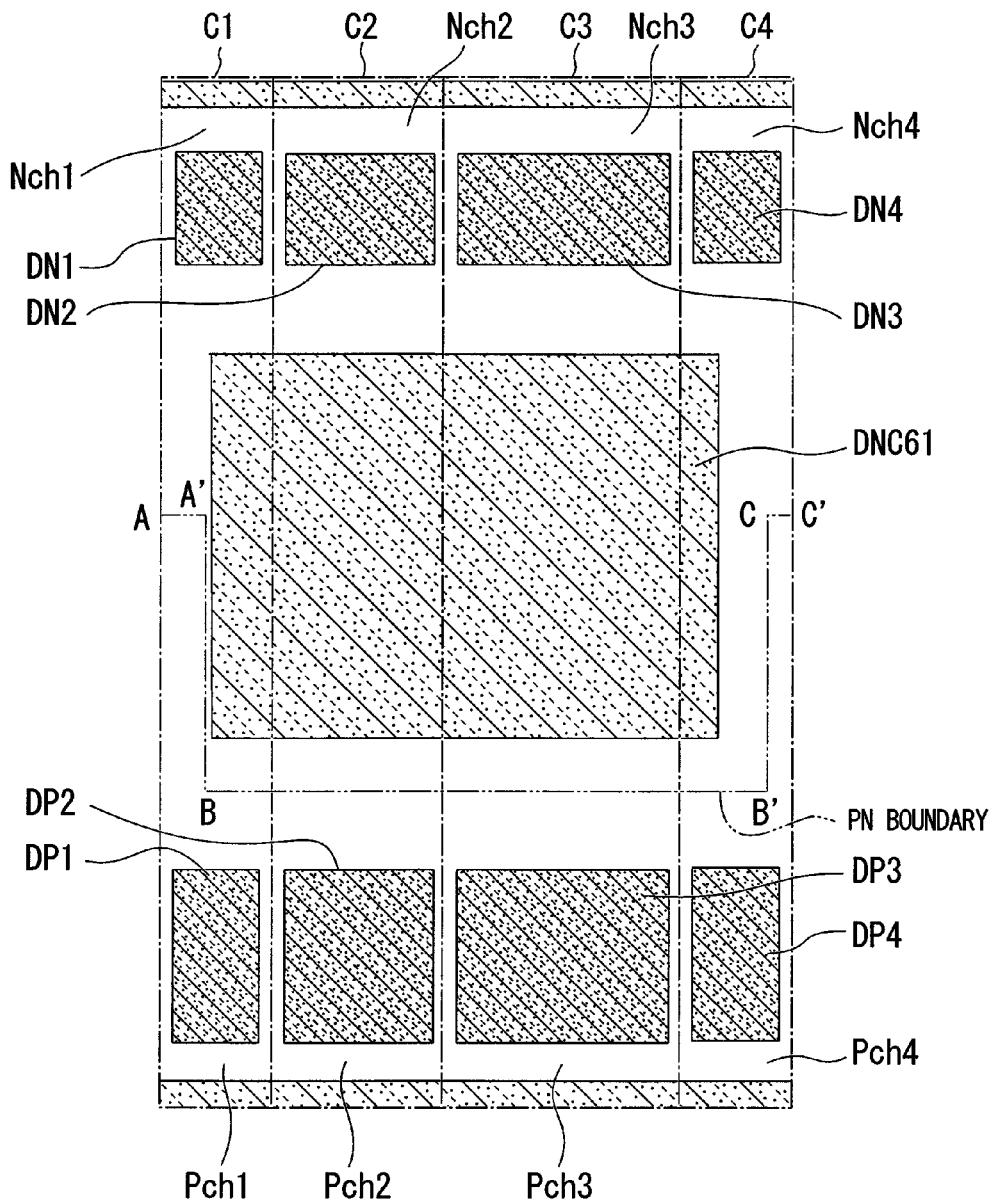

FIG. 17
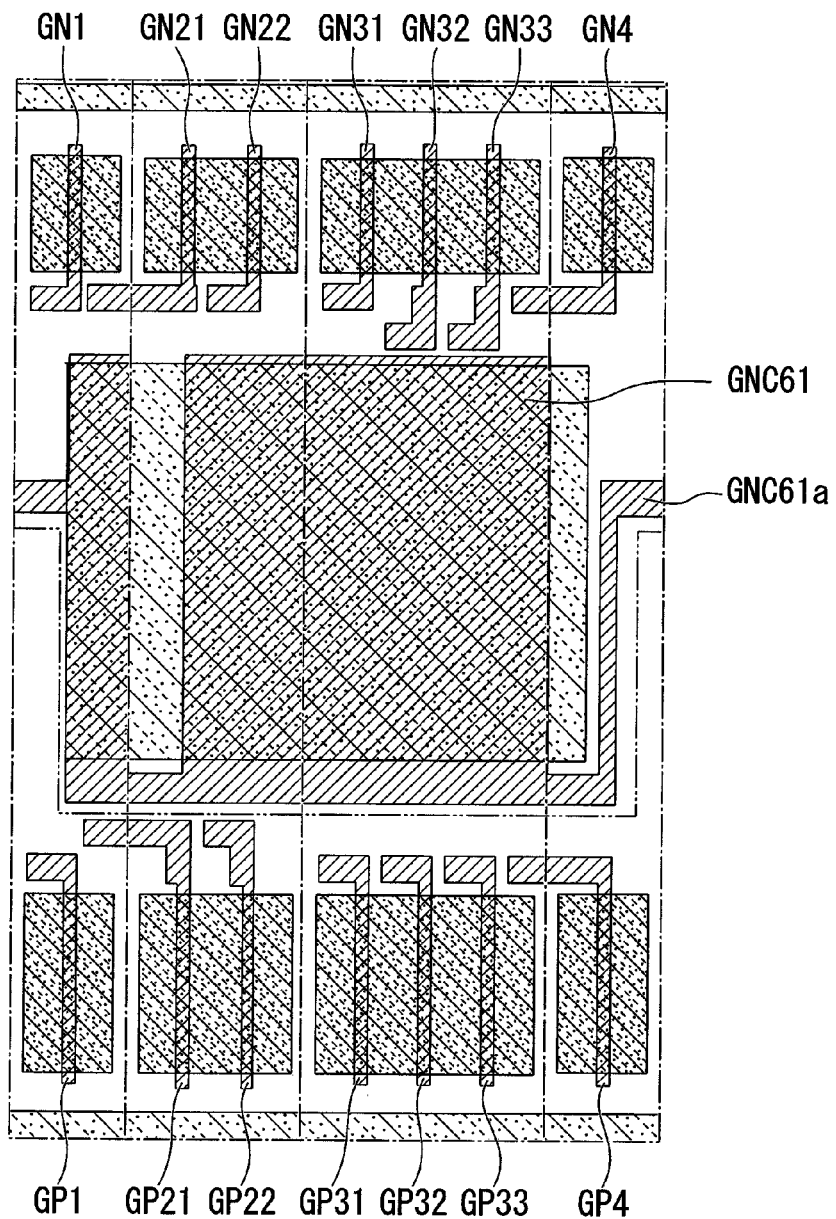
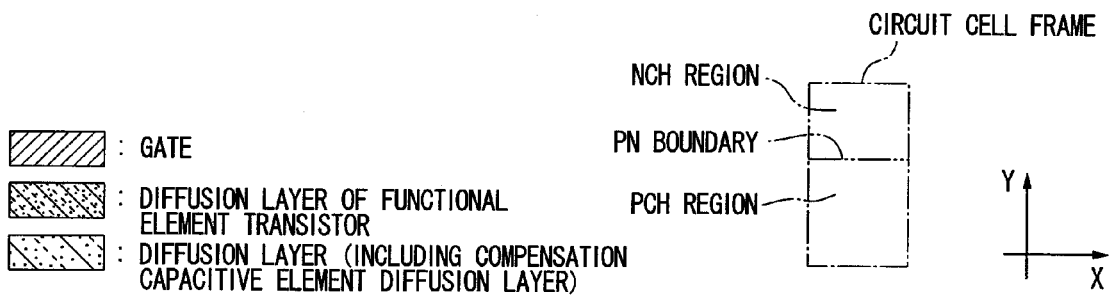

FIG. 18

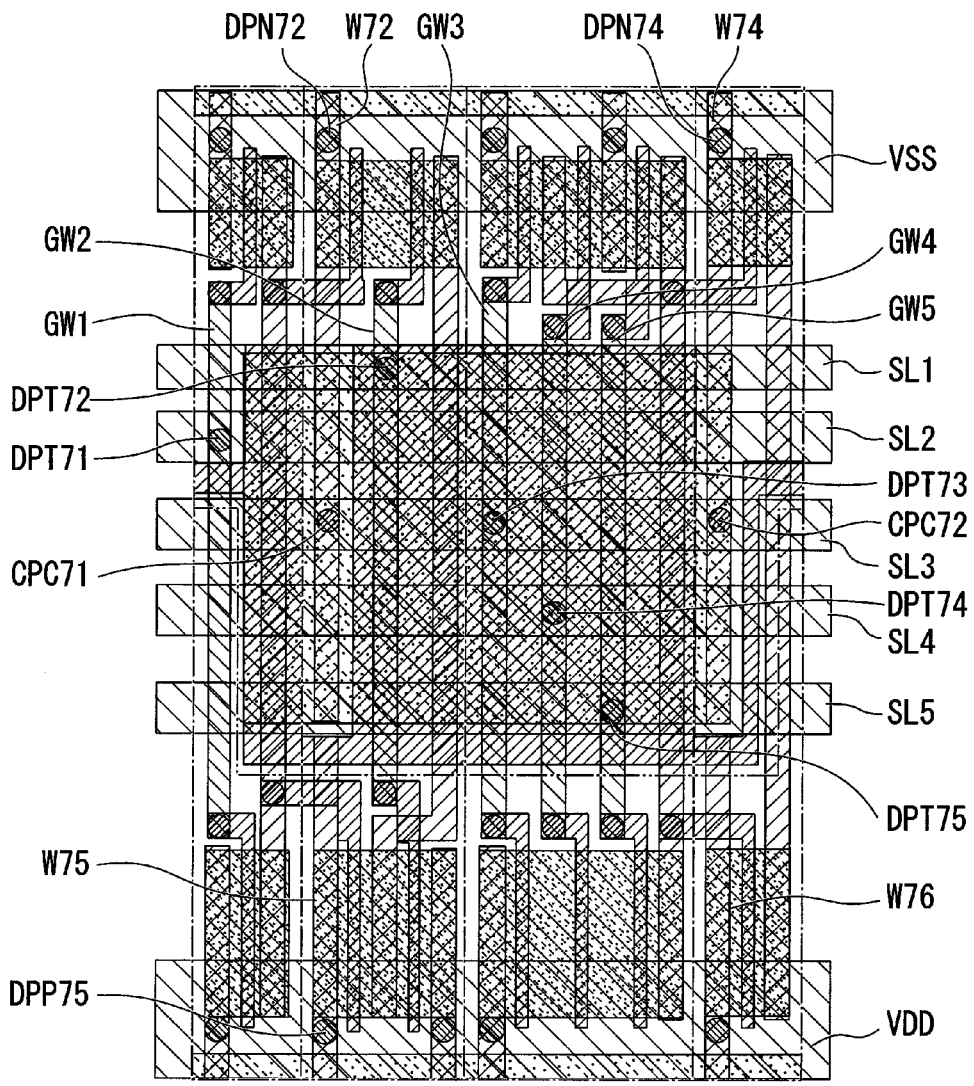

- ⊘ : CONTACT HOLE (CONNECTION BETWEEN FIRST LAYER WIRING AND DIFFUSION LAYER OR GATE)
- ⊗ : FIRST THROUGH HOLE (CONNECTION BETWEEN FIRST LAYER WIRING AND SECOND LAYER WIRING)
- ▨ : GATE WIRING (FIRST LAYER WIRING (W))
- ▨ : FIRST LAYER WIRING (W)
- ▨ : SECOND LAYER WIRING (1 Al)
- ▨ : GATE
- ▨ : DIFFUSION LAYER OF FUNCTIONAL ELEMENT TRANSISTOR
- ▨ : DIFFUSION LAYER (INCLUDING COMPENSATION CAPACITIVE ELEMENT DIFFUSION LAYER)

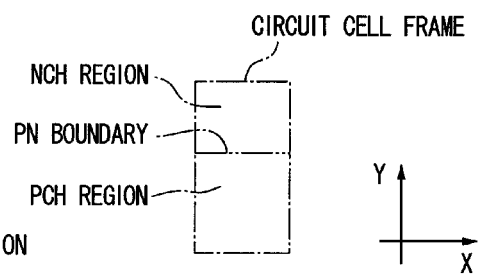

FIG. 22

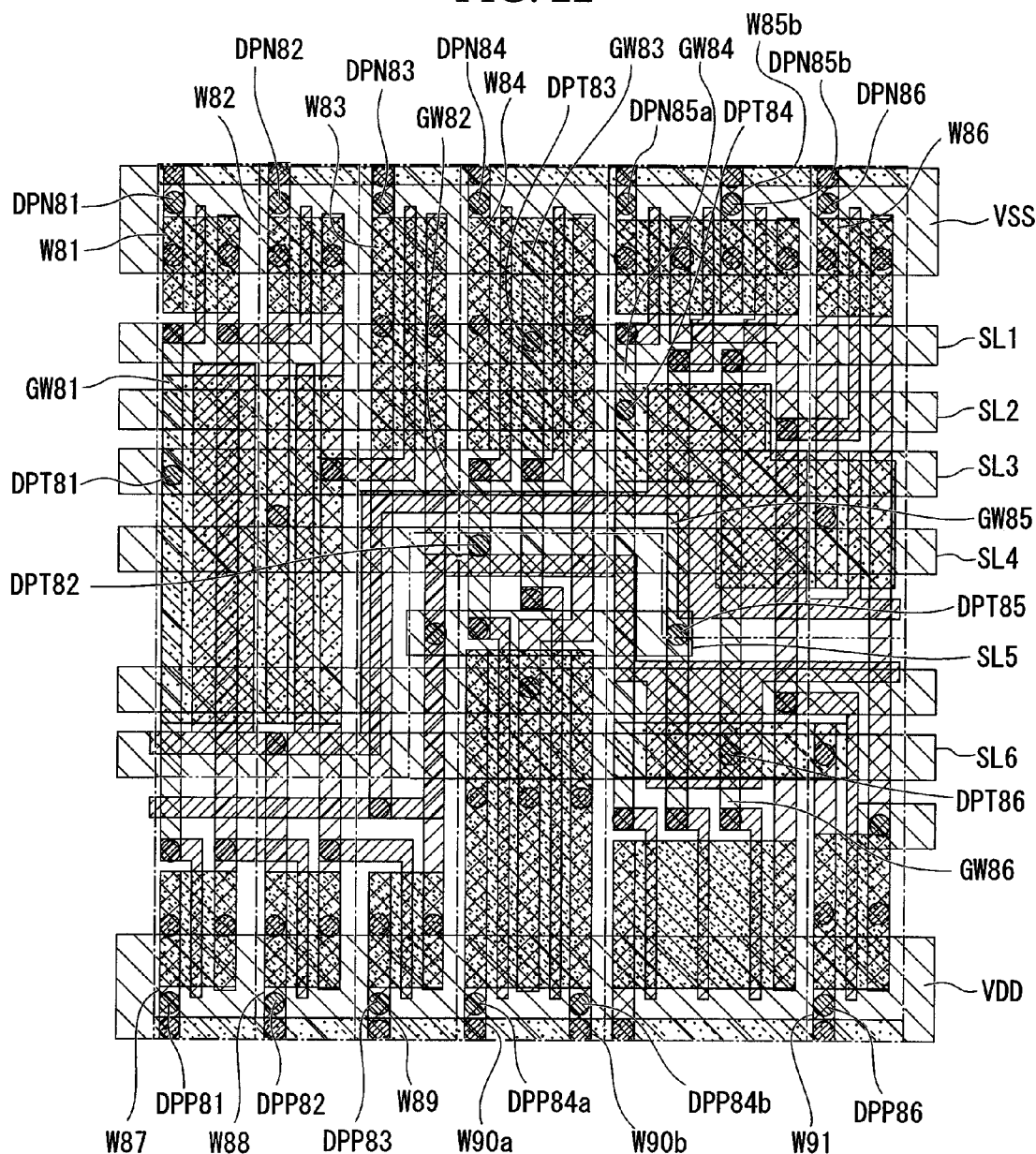

- ⊘ : CONTACT HOLE (CONNECTION BETWEEN FIRST LAYER WIRING AND DIFFUSION LAYER OR GATE)
- ⊛ : FIRST THROUGH HOLE (CONNECTION BETWEEN FIRST LAYER WIRING AND SECOND LAYER WIRING)
- ▨ : GATE WIRING (FIRST LAYER WIRING (W))
- ▨ : FIRST LAYER WIRING (W)
- ▨ : SECOND LAYER WIRING (1 Al)
- ▨ : GATE
- ▨ : DIFFUSION LAYER OF FUNCTIONAL ELEMENT TRANSISTOR
- ▨ : DIFFUSION LAYER (INCLUDING COMPENSATION CAPACITIVE ELEMENT DIFFUSION LAYER)

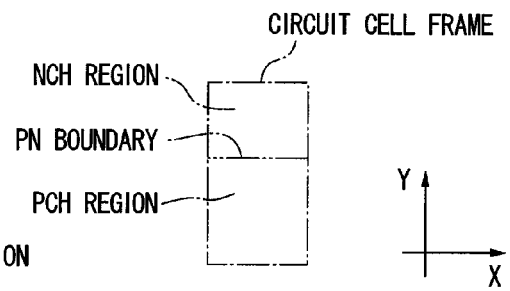

FIG. 23
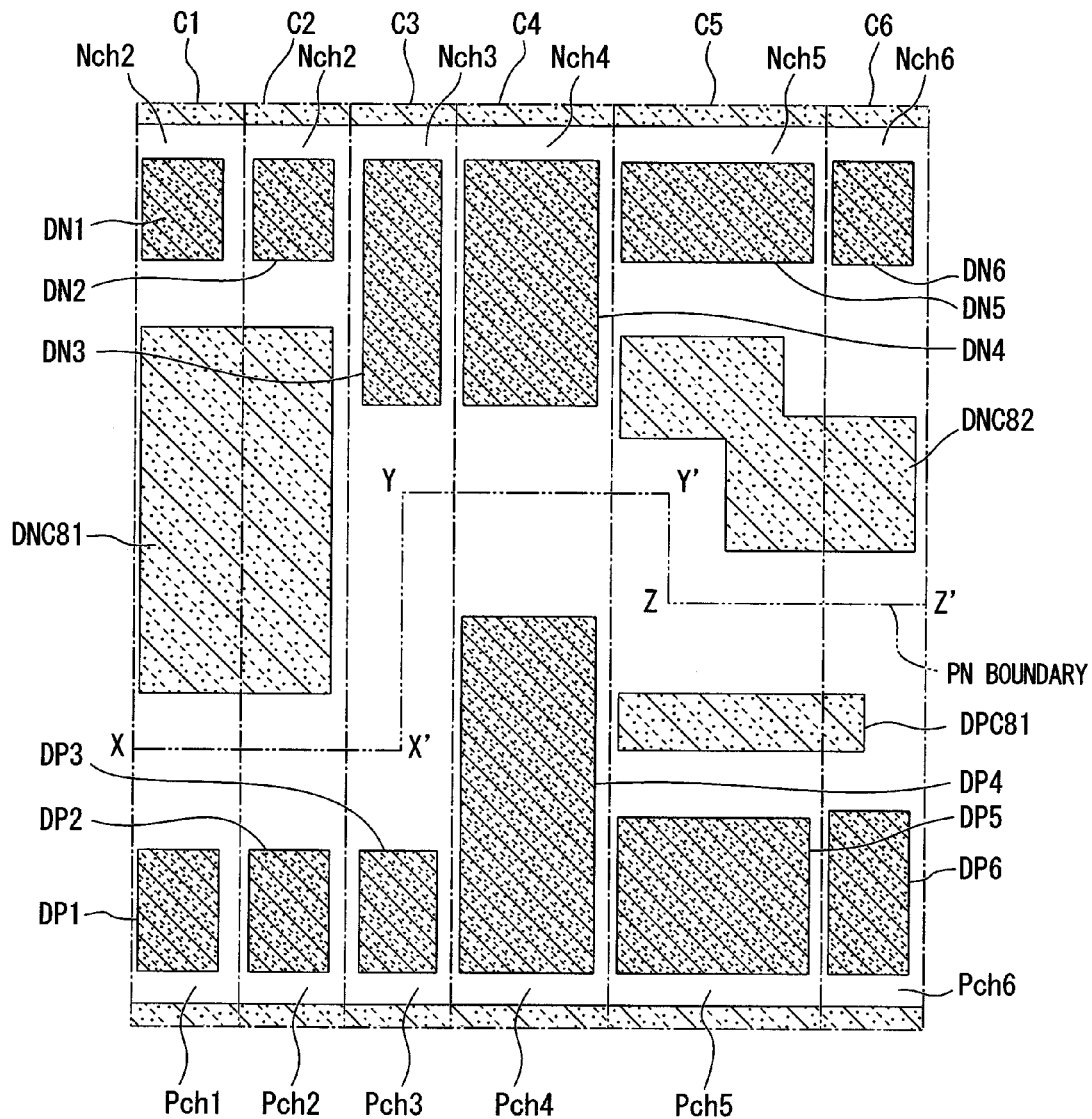
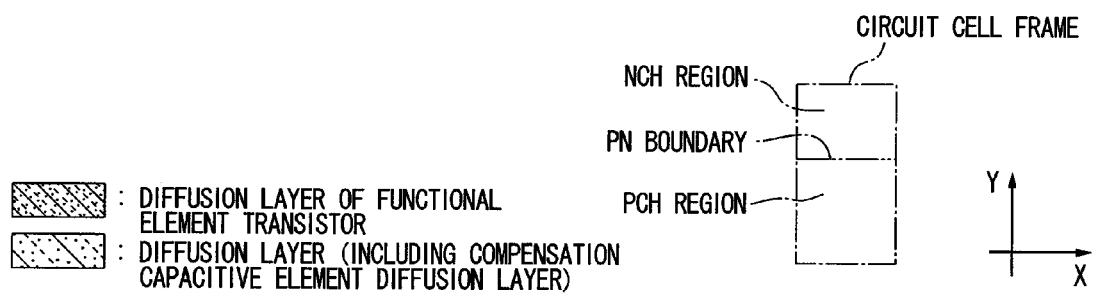

FIG. 24
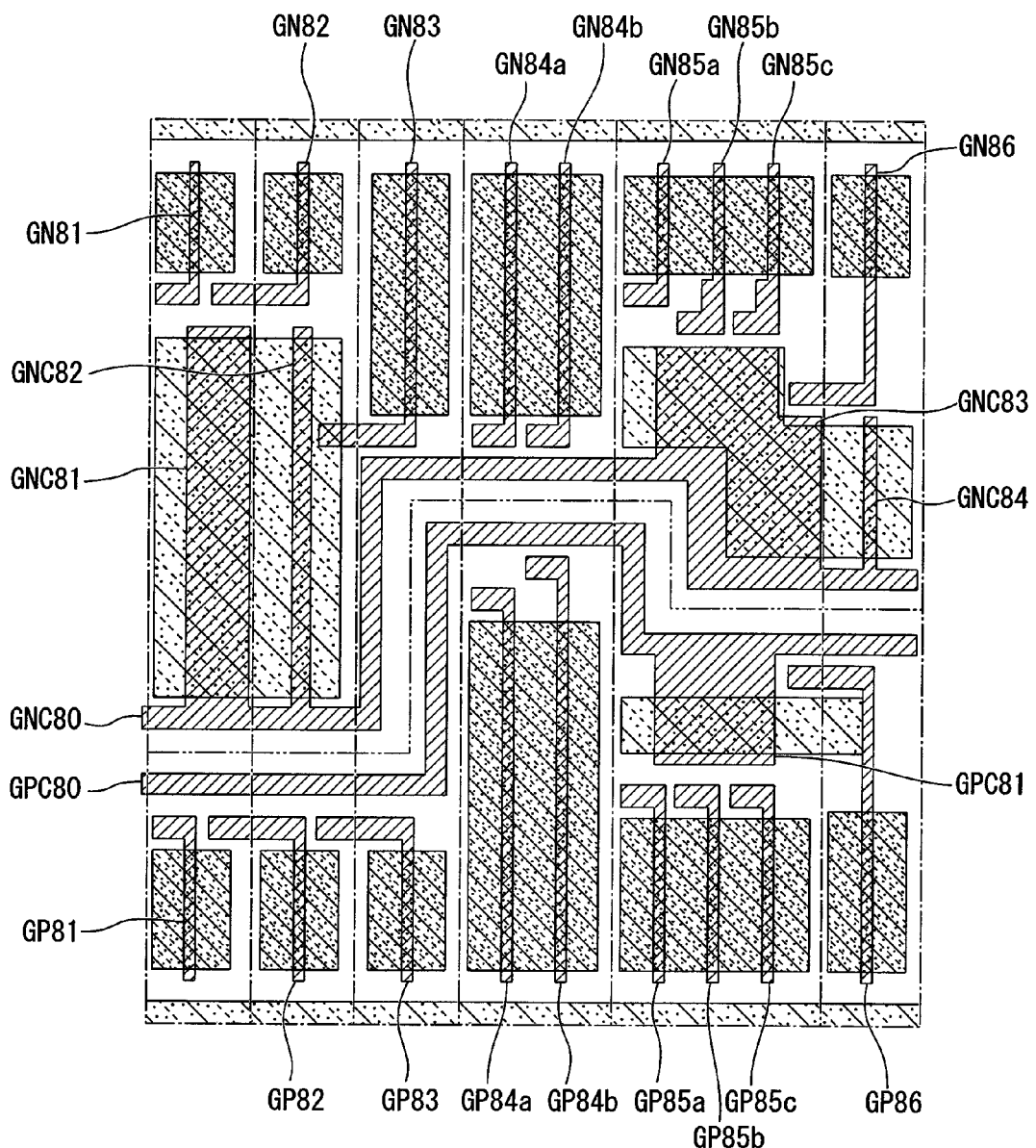
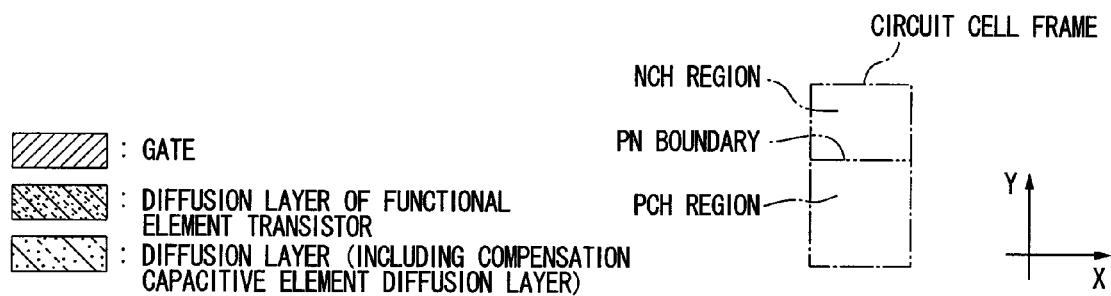

FIG. 26

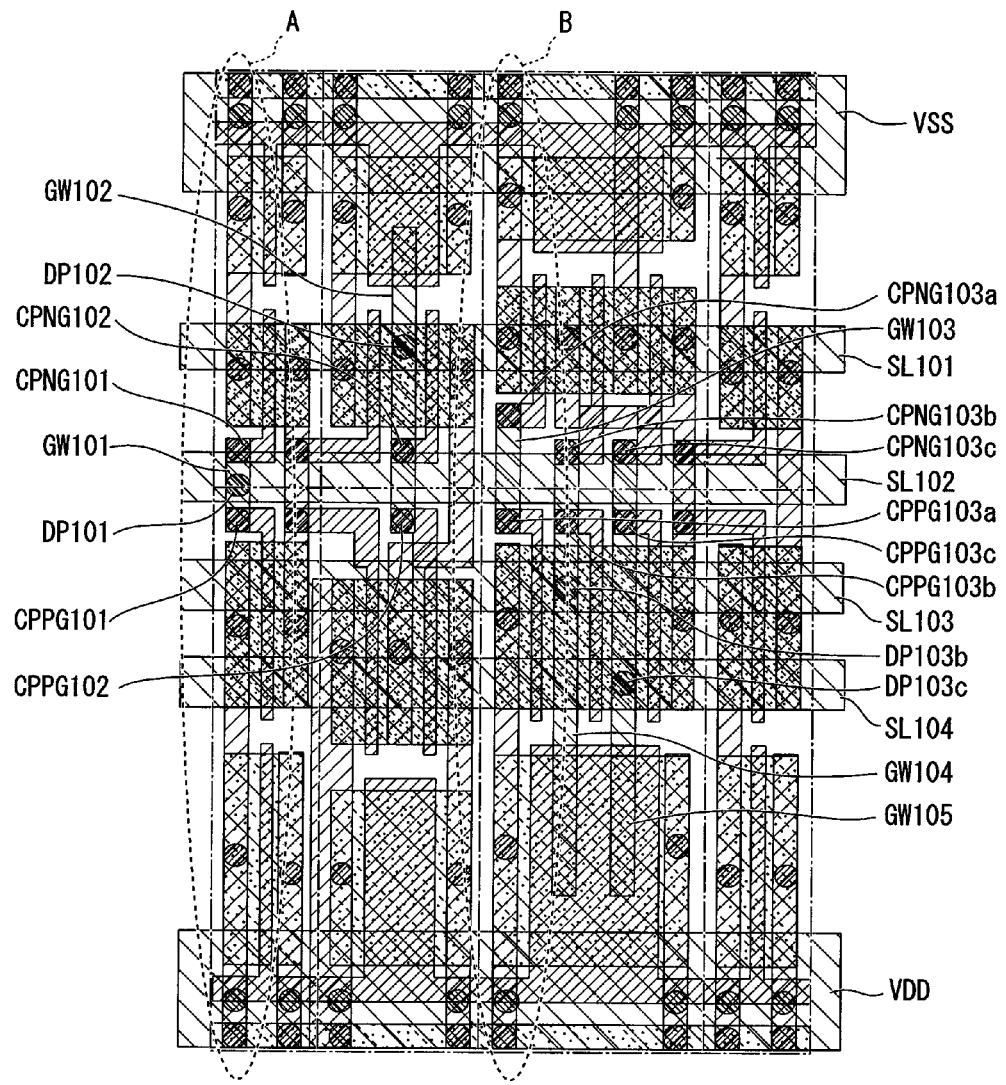

- ⊘ : CONTACT HOLE (CONNECTION BETWEEN FIRST LAYER WIRING AND DIFFUSION LAYER OR GATE)
- ⊗ : FIRST THROUGH HOLE (CONNECTION BETWEEN FIRST LAYER WIRING AND SECOND LAYER WIRING)
- ▨ : GATE WIRING (FIRST LAYER WIRING (W))
- ▨ : FIRST LAYER WIRING (W)
- ▨ : SECOND LAYER WIRING (1 Al)
- ▨ : GATE
- ▨ : DIFFUSION LAYER OF FUNCTIONAL ELEMENT TRANSISTOR
- ▨ : DIFFUSION LAYER (INCLUDING COMPENSATION CAPACITIVE ELEMENT DIFFUSION LAYER)

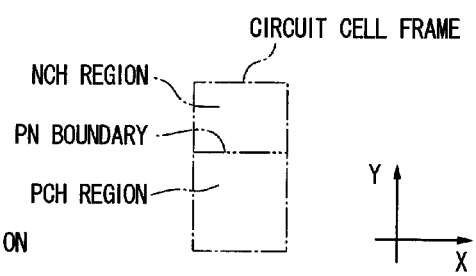

FIG. 27
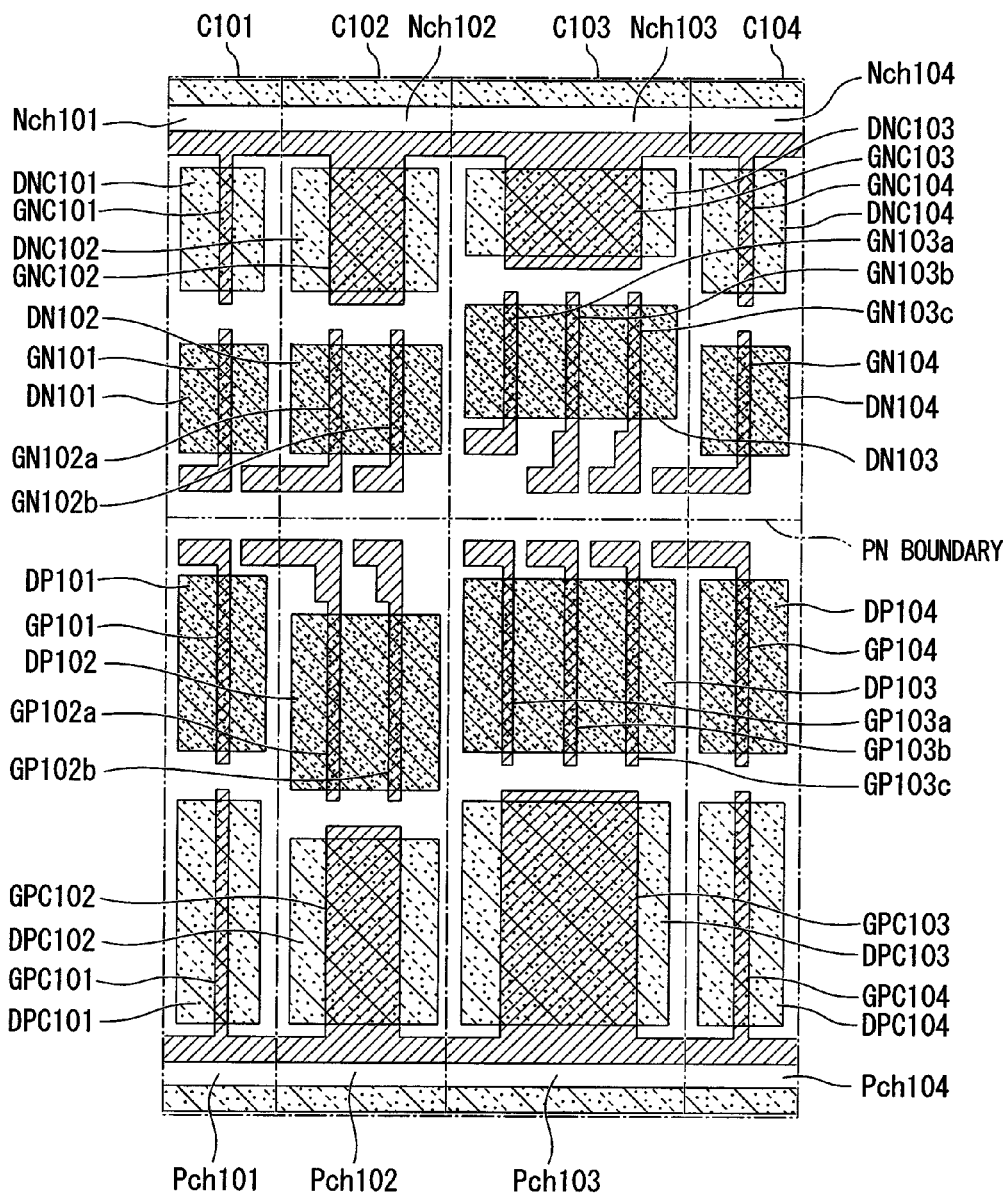
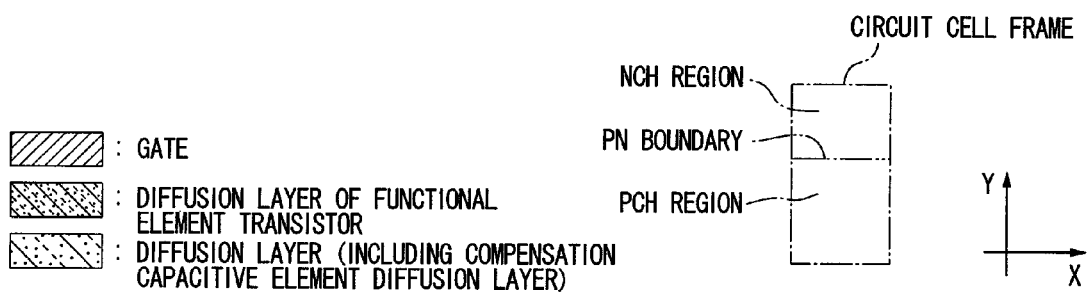

FIG. 28

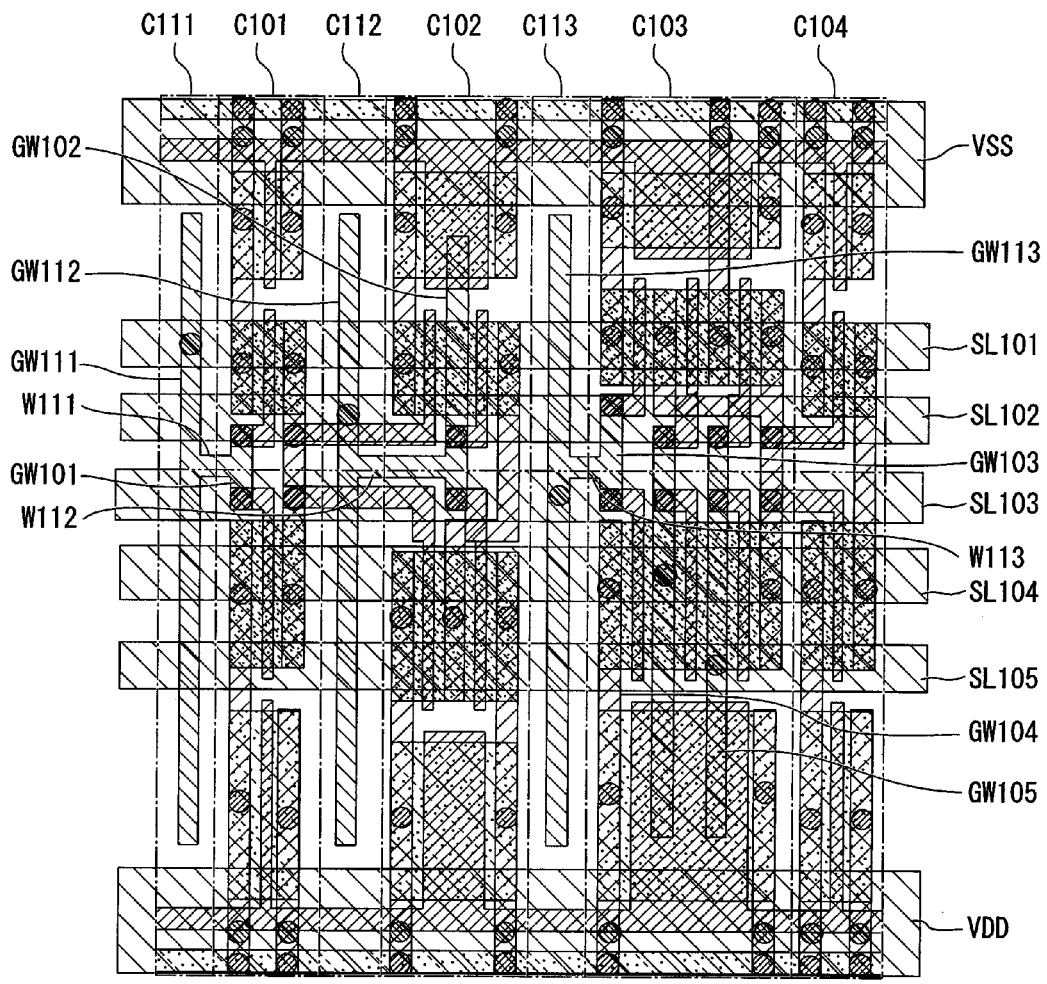

- ◎ : CONTACT HOLE (CONNECTION BETWEEN FIRST LAYER WIRING AND DIFFUSION LAYER OR GATE)
- ◎ : FIRST THROUGH HOLE (CONNECTION BETWEEN FIRST LAYER WIRING AND SECOND LAYER WIRING)
- ▨ : GATE WIRING (FIRST LAYER WIRING (W))
- ▨ : FIRST LAYER WIRING (W)
- ▨ : SECOND LAYER WIRING (1 Al)
- ▨ : GATE
- ▨ : DIFFUSION LAYER OF FUNCTIONAL ELEMENT TRANSISTOR
- ▨ : DIFFUSION LAYER (INCLUDING COMPENSATION CAPACITIVE ELEMENT DIFFUSION LAYER)

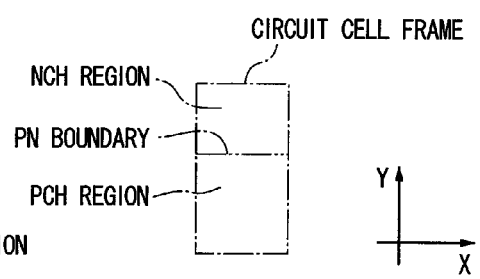

SEMICONDUCTOR DEVICE

BACKGROUND OF THE INVENTION

1. Field of the Invention

The present invention relates to a semiconductor device, and more specifically, to a semiconductor device including a compensation element.

Priority is claimed on Japanese Patent Application No. 2010-093557, Apr. 14, 2010, the content of which is incorporated herein by reference.

2. Description of the Related Art

Semiconductor devices are used in various fields, such as personal computers, communication equipment, home appliances, toys, and the like.

The semiconductor devices operate as key devices in a system used. The semiconductor device has been improved in large scale and high speed performance, causing a power supply line to increase its noise. The development period of the semiconductor device can be shortened by design automation and block solution is applied. The block solution includes the following steps. Circuit cells having a fixed height and constituting various logic circuits are arranged. The arranged circuit cells are connected to each other based on circuit connection information. A circuit design and a mask layout design are almost entirely automated and performed as a CAD by the block solution. However, a semiautomatic design of a compensation element such as a compensation capacitor for reducing noise of the power supply is performed.

For example, the variation of power supply voltage is suppressed by arranging a compensation capacitor between power supply lines so as to reduce noise of the power supply lines. Compensation elements such as compensation capacitors of the power supply voltages are not directly related to a logic operation. However, the compensation elements are indispensable elements for preventing erroneous operations and maintaining high reliability. Despite this, after transistors are designed on the basis of circuit information, the compensation elements are arranged and laid out under the power supply lines or around a chip, according to experiences of an engineer.

Japanese Unexamined Patent Application, First Publication, No. JP-A-2006-253393 discloses that transistors as functional elements are arranged adjacent to a boundary between a P-channel region and an N-channel region (hereinafter, referred to as a "PN boundary") of a circuit cell as shown in FIGS. 1 and 3 to 5. The P-channel region is a semiconductor region in which P-channel transistors are formed. The P-channel region is another semiconductor region in which P-channel transistors are formed. The P-channel region and N-channel region are bounded. The semiconductor region in which P-channel transistors are formed will hereinafter be referred to as "P-channel region". The semiconductor region in which N-channel transistors are formed will hereinafter be referred to as "N-channel region". Compensation capacitors are formed in spaces, in which the functional elements are not arranged, in each of the P-channel region and the N-channel region.

The functional element (transistor) is an element necessary to perform a predetermined operation of its circuit cell. More specifically, a P-type transistor is arranged as the functional element adjacent to the PN boundary in the P-channel region, and an N-type transistor is arranged as the functional element adjacent to the PN boundary in the N-channel region.

Japanese Unexamined Patent Application, First Publication, No. JP-A-2006-253393 suggests, but does not disclose, that a plurality of signal lines SL are arranged to transmit a signal between circuit cells over a plurality of circuit cells. The plurality of circuit cells are arranged along an extension direction (x-direction) of power supply lines VDD and VSS. The plurality of signal lines are arranged to extend in the x-direction. In order to supply signals to predetermined circuit cells, the plurality of signal lines are connected to gate wirings through contact holes. The gate wiring connects gate electrodes of the P-type transistor and the N-type transistor which are formed in the P-type channel region and the N-type channel region, respectively. The gate wiring prevents insulation breakdown at a gate insulating film or an insulating film formed on a sidewall of the gate electrode in fabrication. When the contact hole is directly on a gate electrode, such insulation breakdown may be caused.

SUMMARY

In one embodiment, a semiconductor device may include, but is not limited to, a semiconductor substrate, a first transistor of a first conductivity type, a second transistor of a second conductivity type, a first capacitor, and a first wiring. The semiconductor substrate includes first, second, and third regions. The third region is sandwiched between the first and second regions. The first transistor of the first conductivity type is disposed in the first region. The second transistor of the second conductivity type is disposed in the second region. The first capacitor is disposed in the third region. The first wiring electrically couples one of main electrodes of the first transistor and one of main electrodes of the second transistor. The first wiring passes above the first capacitor.

In another embodiment, a semiconductor device may include, but is not limited to, a first line having a substantially fixed potential, a semiconductor substrate, a first transistor, and a first capacitor. The first line is elongated in a first direction. The semiconductor substrate includes a first region of a first conductivity type. The first transistor includes first source and first drain regions of a second conductivity type and a first gate electrode with an intervention of a first gate insulating film. The first source and first drain regions are disposed in the first region. The first gate electrode is disposed in a first portion of the first region. The first gate electrode is disposed between the first source and first drain regions. The first capacitor includes a first electrode region of the second conductivity type and a second electrode disposed in a second portion of the first region on the first electrode region with an intervention of a capacitor insulating film. The first capacitor is arranged so that the first transistor is sandwiched between the first line and the first capacitor.

In still another embodiment, a device may include, but is not limited to, a plurality of circuit cells, first and second power supply lines, a plurality of first transistors, a plurality of second transistors, and a first capacitor. The plurality of circuit cells are arranged in a first direction. Each of the circuit cells includes a first region of a first conductivity type and a second region of a second conductivity type. The first and second regions are arranged in a second direction different from the first direction in the each of the circuit cells. The first and second power supply lines are elongated in the first direction in substantially parallel to each other. The plurality of first transistors are each disposed in the first region of a first associated one of the circuit cells and coupled to the first power supply line. The plurality of second transistors are each disposed in the second region of a second associated one of the circuit cells and coupled to the second power supply line. The first capacitor is disposed in the first region of at least a circuit cell of the circuit cells to be sandwiched between the first and the second transistors of the at least one of the circuit cells.

BRIEF DESCRIPTION OF THE DRAWINGS

The above features and advantages of the present invention will be more apparent from the following description of certain preferred embodiments taken in conjunction with the accompanying drawings, in which:

FIG. 2 is a fragmentary plan view illustrating a semiconductor device in accordance with one embodiment of the present invention;

FIG. 3 is a fragmentary plan view showing layouts of transistors and compensation capacitors over a semiconductor substrate used in the semiconductor device in accordance with one embodiment of the present invention;

FIG. 4 is a fragmentary plan view showing a layout of gate electrodes over FIG. 3 in accordance with one embodiment of the present invention;

FIG. 6 is a fragmentary plan view showing a layout of power supply lines over FIG. 5 in accordance with one embodiment of the present invention;

FIG. 7 is a fragmentary plan view showing layouts of signal lines and conductive plugs over FIG. 6 in accordance with one embodiment of the present invention;

FIG. 8 is a fragmentary cross sectional elevation view, taken along an A1-A2 line of FIG. 2, illustrating the semiconductor device in accordance with one embodiment of the present invention;

FIG. 13 is a fragmentary plan view illustrating a semiconductor device in accordance with another embodiment of the present invention;

FIG. 14 is a fragmentary plan view illustrating a semiconductor device excluding power supply lines VSS and VDD and a wiring pattern of the first layer wiring from FIG. 13;

FIG. 15 is a fragmentary plan view illustrating a semiconductor device in accordance with another embodiment of the present invention;

FIG. 16 is a fragmentary plan view showing layouts of transistors and compensation capacitors over a semiconductor substrate used in the semiconductor device in accordance with another embodiment of the present invention;

FIG. 17 is a fragmentary plan view showing a layout of gate electrodes over FIG. 16 in accordance with one embodiment of the present invention;

FIG. 18 is a fragmentary plan view showing layouts of a wiring pattern of a first layer wiring, a part of contact plugs, a part of conductive plugs, power supply lines, and signal lines over FIG. 17 in accordance with one embodiment of the present invention;

FIG. 22 is a fragmentary plan view illustrating a semiconductor device in accordance with another embodiment of the present invention;

FIG. 23 is a fragmentary plan view showing layouts of transistors and compensation capacitors over a semiconductor substrate used in the semiconductor device in accordance with another embodiment of the present invention;

FIG. 24 is a fragmentary plan view showing a layout of gate electrodes over FIG. 23 in accordance with one embodiment of the present invention;

FIG. 26 is a fragmentary plan view illustrating a semiconductor device in accordance with the related art;

FIG. 27 is a fragmentary plan view showing layouts of transistors, compensation capacitors, and gate electrodes in accordance with the related art; and FIG. 28 is a fragmentary plan view illustrating a semiconductor device in accordance with the related art.

DETAILED DESCRIPTION OF THE PREFERRED EMBODIMENTS

Figure 1:
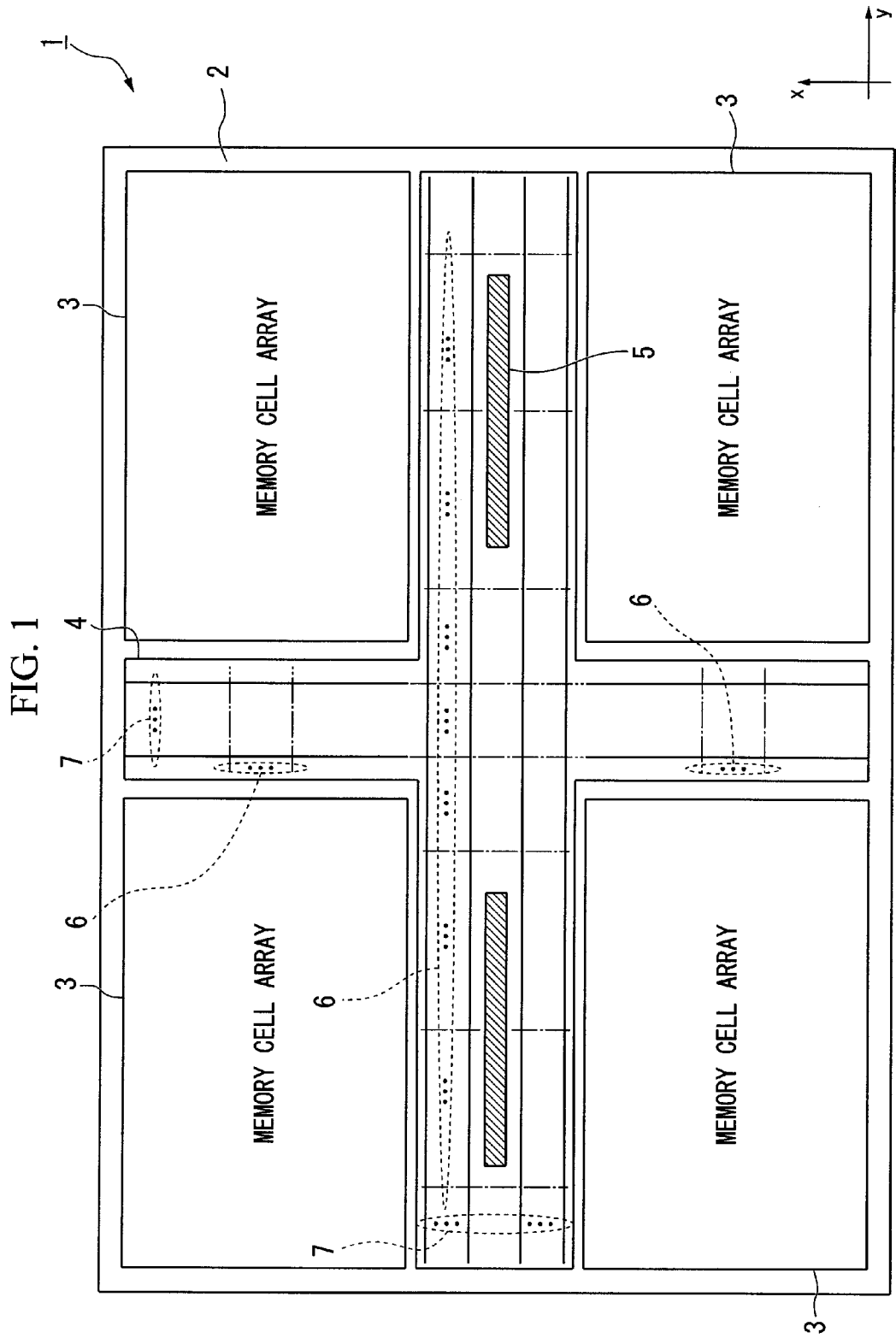
FIG. 1 is a plain view illustrating a layout of a semiconductor device in accordance with one embodiment of the present invention.

Before describing the present invention, the related art will be explained in detail, in order to facilitate the understanding of the present invention.

The gate wiring is formed along an extension line in a y-direction of a diffusion layer of a transistor. The transistor may be a functional transistor. The gate wiring is not formed just above the gate electrode of the transistor in a plan view. A power supply lead-in wiring and a signal lead-out wiring are disposed over the diffusion layer of the transistor. As shown in the drawings, the gate wiring, the power supply lead-in wiring and the signal lead-out wiring belong to first level wirings, which are lowest in the multi-level wiring structure. The first level wiring will be referred to as the first layer wiring. The power supply lead-in wiring supplies electric power to the transistor. The signal lead-out wiring outputs a signal from the transistor. If the gate wiring is arranged just above the gate electrode of the transistor, a sufficient interval may not be secured between adjacent wirings. Also, a short-circuit can be formed between the gate wiring and the power supply lead-in wiring or the signal lead-out wiring, the power supply lead-in wiring or the signal lead-out wiring being formed over the diffusion layer.

In order to form a contact for connecting the signal line to the gate wiring, the signal line needs to pass over the gate wiring. The gate wiring is formed on the same wiring layer as the power supply lead-in wiring for supplying electric power to the diffusion layer of the transistor. Consequently, some circuit cells among the plurality of circuit cells have the gate wiring which is arranged only between a gate electrode of the P-type transistor and a gate electrode of the N-type transistor due to positions of peripheral wirings.

Japanese Unexamined Patent Application, First Publication, No. JP-A-2006-253393 discloses the following. The P-type transistor in the circuit cell is arranged, in the P-channel region, adjacent to the PN boundary between the P channel region and the N channel region. The N-type transistor in the circuit cell is arranged, in the N-channel region, adjacent to the PN boundary. Such arrangement causes shortening of the length of the gate wiring that connects the gate electrodes of the P-type transistor and the N-type transistor. Thus, the number of signal lines to be arranged is decreased.

Hereinafter, a detailed explanation will be described with reference to FIGS. 26 and 27.

FIG. 26 illustrates a part of the known semiconductor device. FIG. 26 also illustrates elements, which are not disposed on a surface of the semiconductor device and are not actually visible, to facilitate understanding of a layout of the elements.

FIG. 27 illustrates only a semiconductor substrate and gate electrodes among elements illustrated in FIG. 26. The gate electrodes are disposed over the semiconductor substrate while interposing a gate insulating film between the gate electrodes and the semiconductor substrate. Here, FIGS. 26 and 27 are plan views created by the inventor to explain the configurations of the known semiconductor device in detail.

FIG. 27 illustrates four circuit cells C101, C102, C103, and C104 by indicating circuit cell frames by dashed-dotted lines.

Each of circuit cells C101, C102, C103, and C104 includes N-channel regions Nch101, Nch102, Nch103, and Nch104 on a first side, respectively. Also, each of circuit cells C101, C102, C103, and C104 includes P-channel regions Pch101, Pch102, Pch103, and Pch104 on a second side. A PN boundary indicated by a dotted broken line is a boundary of N-channel regions and P-channel regions.

In each of the N-channel regions and the P-channel regions as described above, transistor is disposed adjacent to the PN boundary. Compensation capacitors are formed in a space, in which the transistor is not disposed, in each of the N-channel regions and the P-channel regions.

More specifically, in FIG. 27, the N-channel region Nch101 includes a first transistor and a first compensation capacitor. The first transistor includes first and second diffusion layers DN101 and a gate electrode GN101. The first compensation capacitor includes a diffusion layer DNC101 and a gate electrode GNC101. The N-channel region Nch102 includes a second transistor and a second compensation capacitor. The second transistor includes first and second diffusion layers DN102 and gate electrodes GN102a and GN102b. The second compensation capacitor includes a diffusion layer DNC102 and a gate electrode GNC102. The N-channel region Nch103 includes a third transistor and a third compensation capacitor. The third transistor includes first and second diffusion layers DN103 and gate electrodes GN103a, GN103b and GN103c. The third compensation capacitor includes a diffusion layer DNC103 and a gate electrode GNC103. The N-channel region Nch104 includes a fourth transistor and a fourth compensation capacitor. The fourth transistor has first and second diffusion layers DN104 and a gate electrode GN104. The fourth compensation capacitor includes a diffusion layer DNC104 and a gate electrode GNC104.

The P-channel region Pch101 includes a fifth transistor and a fifth compensation capacitor. The fifth transistor includes first and second diffusion layers DP101 and a gate electrode GP101. The fifth compensation capacitor includes a diffusion layer DPC101 and a gate electrode GPC101 of a compensation capacitor. The P-channel region Pch102 includes a sixth transistor and a sixth compensation capacitor. The sixth transistor first and second diffusion layers DP102 and gate electrodes GP102a and GP102b. The sixth compensation capacitor includes a diffusion layer DPC102 and a gate electrode GPC102. The P-channel region Pch103 includes a seventh transistor and a seventh compensation capacitor. The seventh transistor includes first and second diffusion layers DP103 and gate electrodes GP103a, GP103b and GP103c. The seventh compensation capacitor includes a diffusion layer DPC103 and a gate electrode GPC103. The P-channel region Pch104 includes a seventh transistor and a seventh compensation capacitor. The seventh transistor includes first and second diffusion layers DP104 and a gate electrode GP104. The seventh compensation capacitor includes a diffusion layer DPC104 and a gate electrode GPC104.

FIG. 26 illustrates four signal lines SL101, SL102, SL103, and SL104 and gate wirings GW101, GW102, GW103, GW104, and GW105.

The gate wiring GW101 connects the gate electrode of the N-channel region Nch101 and the gate electrode GP101 of the P-channel region Pch101 via a contact plug CPNG101 and a contact plug CPPG101. Also, the gate wiring GW101 is connected to the signal line SL102 via a first conductive plug.

The gate wiring GW102 connects the gate electrode of the N-channel region Nch102 and the gate electrode GP102 of the P-channel region Pch102 via a contact plug CPNG102 and a contact plug CPPG102. Also, the gate wiring GW102 is connected to the signal line SL101 via a second conductive plug.

The gate wiring GW104 connects the gate electrode of the N-channel region Nch103 and the gate electrode GP103b of the P-channel region Pch103 via a contact plug CPNG103b and a contact plug CPPG103b. Also, the gate wiring GW104 is connected to the signal line SL103 via a third conductive plug.

The gate wiring GW105 connects the gate electrode of the N-channel region Nch103 and the gate electrode GP103c of the P-channel region Pch103 via a contact plug CPNG103c and a contact plug CPPG103c. The gate wiring GW105 is connected to the signal line SL104 via a fourth conductive plug.

However, the gate wiring GW103 in a region B connects the gate electrode of the N-channel region Nch103 and the gate electrode GP103a of the P-channel region Pch103 via a contact plug CPNG103a and a contact plug CPPG103a. The gate wiring GW103 should be connected to a signal line other than the signal lines SL101, SL102, SL103, and SL104 which are connected to the gate wiring GW102, the gate wiring GW101, the gate wiring GW104, and the gate wiring GW105, respectively. However, there is only the signal line SL102 arranged just above the gate wiring GW103. Therefore, it is not possible to connect the gate wiring GW103 to a signal line other than the signal line SL102 when the arrangement shown in FIG. 26 is applied.

This is because the P-type transistor and the N-type transistor in the circuit cells are respectively arranged adjacent to the PN boundary (PN boundary) between the P-channel region and the N-channel region. Therefore, the length of the gate wirings is short and thus the number of signal lines arranged to overlap the gate wirings is decreased.

In order to solve the above-described difficulties, the following methods have been considered.

In a first method, a plurality of signal lines are also arranged in portions where gate wirings are not disposed. The plurality of signal lines are disposed as follows. Here, a signal is input to a predetermined circuit cell through a predetermined signal line. The predetermined signal line passes over the gate wiring in the predetermined circuit cell. In other circuit cells, the predetermined signal line passes through a portion where the gate wirings are not disposed.

However, in this method, a plurality of signal lines intersect with each other, which affects an arrangement of wirings of another wiring layer.

In a second method, an interval between the P-type transistor and the N-type transistor is widened and the gate wiring is lengthened.

However, in this case, it is necessary to increase a distance between each transistors and the PN boundary. If the height of the circuit cells (a length of the y-direction of the circuit cells) is not changed, the size of an area, where the transistors are not disposed, for disposing the compensation capacitor is reduced. Thus, the total capacitance of the compensation capacitor is reduced. An area of the circuit cell is increased if the total capacitance of the compensation capacitor is not changed.

In a third method, a wiring cell for the gate wiring is arranged between circuit cells.

However, in this case, an area of the entire circuit block including a plurality of circuit cells is increased in an x-direction by the area of wiring cells arranged. This is explained in detail with reference to FIG. 28.

A wiring cell C111 for the gate wiring is arranged on the left of the circuit cell C101. A wiring cell C112 for the gate wiring is arranged between the circuit cell C101 and the circuit cell C102. A wiring cell C113 for the gate wiring is arranged between the circuit cell C102 and the circuit cell C103.

The gate wiring GW101 is connected to a wiring GW111 via a connection wiring W111 for the gate wiring. The wiring GW111 for gate wiring is connected to the signal line SL101. Thereby, the gate wiring GW101 is electrically connected to the signal line SL101.

The gate wiring GW102 is connected to a wiring GW112 for gate wiring via a connection wiring W112. The wiring GW112 for gate wiring is connected to the signal line SL102. Thereby, the gate wiring GW102 is electrically connected to the signal line SL102.

The gate wiring GW103 is connected to a wiring GW113 for gate wiring via a connection wiring W113. The wiring GW113 for gate wiring is connected to the signal line SL103. Thereby, the gate wiring GW103 is electrically connected to the signal line SL103.

The gate wirings GW104 and GW105 are respectively connected to the signal line SL104 and the signal line SL105.

Signal lines are electrically connected to the gate wirings, respectively as described above, but an area of the entire circuit block including a plurality of circuit cells is increased in the x-direction by the area of wiring cells disposed.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate, a first transistor of a first conductivity type, a second transistor of a second conductivity type, a first capacitor, and a first wiring. The semiconductor substrate includes first, second, and third regions. The third region is sandwiched between the first and second regions. The first transistor of the first conductivity type is disposed in the first region. The second transistor of the second conductivity type is disposed in the second region. The first capacitor is disposed in the third region. The first wiring electrically couples one of main electrodes of the first transistor and one of main electrodes of the second transistor. The first wiring passes above the first capacitor.

In some cases, the semiconductor device may further include, but is not limited to, a signal line elongating in a first direction. The signal line overlaps the first capacitor. The signal line is electrically coupled to the first wiring. The first, third and second regions are arranged in a second direction different from the first direction.

In some cases, the semiconductor device may further include, but is not limited to, first and second power supply lines coupled respectively to first and second electrodes of the first capacitor.

In some cases, the semiconductor device may include, but is not limited to, the first power supply line being elongated in a first direction and the second power supply line being elongated in the first direction. The first power supply line passes above the first region. The second power supply line passes above the second region.

In some cases, the semiconductor device may include, but is not limited to, the first power supply line being coupled to the other of the main electrodes of the first transistor and the second power supply being coupled to the other of the main electrodes of the second transistor.

In some cases, the semiconductor device may further include, but is not limited to, a third transistor of the first conductivity type and a fourth transistor of the second conductivity type. The first, third and second regions are arranged in a first direction. The semiconductor substrate further includes fourth, fifth and sixth regions. The first and fourth regions are arranged in a second direction different from the first direction. The second and fifth regions are arranged in the second direction. The third and sixth regions are arranged in the second direction. The third and fourth transistors are disposed respectively on the fourth and the fifth regions. The first capacitor is disposed on both of the third and sixth regions.

In some cases, the semiconductor device may further include, but is not limited to, a second wiring electrically coupling one of main electrodes of the third transistor and one of main electrode of the fourth transistor. The second wiring passes above the first capacitor.

In some cases, the semiconductor device may include, but is not limited to, the first region of the first conductivity type and the second region of the second conductivity type.

In some cases, the semiconductor device may further include, but is not limited to, a second capacitor. The third region includes a first portion of the first conductivity type and a second portion of the second conductivity type. The second portion is sandwiched between the first portion and the second region. The first and second capacitors are disposed respectively on the first and second portion of the third region. The first wiring passes above both of the first and the second capacitors.

In some cases, the semiconductor device may further include, but is not limited to, first and second power supply lines. The first portion of the third region includes a first diffusion layer and a first conductive layer serving respectively as first and second electrodes of the first capacitor. The second portion of the third region includes a second diffusion layer and a second conductive layer serving respectively as first and second electrodes of the second capacitor. The first power supply line is coupled to the first diffusion layer of the first portion of the third region and the second conductive layer of the second portion of the third region. The second power supply line is coupled to the second diffusion layer of the first portion of the third region and the first conductive layer of the second portion of the third region.

In some cases, the semiconductor device may include, but is not limited to, the third region including a boundary defined by the first and second portions. The boundary includes a first part elongated in a first direction and a second part elongated in the second direction different from the first direction.

In some cases, the semiconductor device may include, but is not limited to, the first capacitor being a compensation capacitor.

In another embodiment, a semiconductor device may include, but is not limited to, a first line having a substantially fixed potential, a semiconductor substrate, a first transistor, and a first capacitor. The first line is elongated in a first direction. The semiconductor substrate includes a first region of a first conductivity type. The first transistor includes first source and first drain regions of a second conductivity type and a first gate electrode with an intervention of a first gate insulating film. The first source and first drain regions are disposed in the first region. The first gate electrode is disposed in a first portion of the first region. The first gate electrode is disposed between the first source and first drain regions. The first capacitor includes a first electrode region of the second conductivity type and a second electrode disposed in a second portion of the first region on the first electrode region with an intervention of a capacitor insulating film. The first capacitor is arranged so that the first transistor is sandwiched between the first line and the first capacitor.

In some cases, the semiconductor device may further include, but is not limited to, a second transistor. The second transistor includes second source and second drain regions of the first conductivity type and a second gate electrode with an intervention of a second gate insulating film. The second source and second drain regions are disposed in a second region. The second gate electrode is disposed in a first portion of the second region. The second gate electrode is disposed between the second source and second drain regions. The semiconductor substrate includes the second region of the second conductivity type. The first and second regions are arranged in a second direction different from the first direction.

In still another embodiment, a device may include, but is not limited to, a plurality of circuit cells, first and second power supply lines, a plurality of first transistors, a plurality of second transistors, and a first capacitor. The plurality of circuit cells are arranged in a first direction. Each of the circuit cells includes a first region of a first conductivity type and a second region of a second conductivity type. The first and second regions are arranged in a second direction different from the first direction in the each of the circuit cells. The first and second power supply lines are elongated in the first direction in substantially parallel to each other. The plurality of first transistors are each disposed in the first region of a first associated one of the circuit cells and coupled to the first power supply line. The plurality of second transistors are each disposed in the second region of a second associated one of the circuit cells and coupled to the second power supply line. The first capacitor is disposed in the first region of at least a circuit cell of the circuit cells to be sandwiched between the first and the second transistors of the at least one of the circuit cells.

In some cases, the semiconductor device may include, but is not limited to, the plurality of first transistors being arranged in line in the first direction and the second transistors being arranged in line in the first direction.

In some cases, the semiconductor device may further include, but is not limited to, a second capacitor disposed in the second region of at least one of the circuit cells to be sandwiched between first and the second transistors of the at least one of the circuit cells.

In some cases, the semiconductor device may further include, but is not limited to, a second capacitor disposed in the first region of a different circuit cell from the at least circuit cell of the circuit cells. The first capacitor is coupled to the second capacitor.

In some cases, the semiconductor device may include, but is not limited to, each of the circuit cells including a boundary defined by a junction of the first and second regions. The boundaries of the circuit cells are aligned to form a straight line elongating in the first direction.

20. In some cases, the semiconductor device may include, but is not limited to, each of the circuit cells including a boundary defined by a junction of the first and second regions. The boundaries of the circuit cells are aligned to form a line that includes a first part elongated in the first direction and a second part elongated in the second direction.

Hereinafter, a semiconductor device according to an embodiment of the invention will be described in detail with reference to the drawings. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples. The invention is not limited thereto and may be appropriately modified within a scope which does not deviate from the concept of the invention.

FIG. 1 is a plan view illustrating the entire layout of a semiconductor device (semiconductor chip) according to the present embodiment.

A semiconductor chip 1 includes a plurality of memory cell arrays 3 and a peripheral circuit arrangement region 4 provided in a peripheral portion of the memory cell arrays 3. The plurality of memory cell arrays 3 and the peripheral circuit arrangement region 4 are disposed over a semiconductor substrate 2. The peripheral circuit arrangement region 4 includes a pad arrangement region 5 and a plurality of wiring layers. A metal wiring is formed in each wiring layer.

In further detail, circuits, which control an operation of the semiconductor device, are arranged in the peripheral circuit arrangement region 4. Specifically, a plurality of write/read control circuits, an internal power generation circuit, and the like are given as the circuits. The plurality of write/read control circuits control a data exchange between the outside of the semiconductor device and a memory cell of the memory cell array. Each of the plurality of write/read control circuits, the internal power generation circuit, and the like is arranged in a corresponding area having a predefined position or size in the peripheral circuit arrangement region. At least a part of the plurality of write/read control circuits, the internal power generation circuit, and the like is designed using an automatic layout design.

In the pad arrangement region 5, a plurality of pads such as a clock terminal pad, an address terminal pad, a command terminal pad, a data input/output terminal pad, and a power supply terminal pad, which are not shown, are arranged.

The plurality of wiring layers includes a first layer wiring, a second layer wiring 6, and a third wiring layer 7. The first layer wiring is lowest in the multi-level wiring structure. The second layer wiring 6 is disposed over the first wiring. The third wiring layer 7 is disposed over the second layer wiring 6. The first layer wiring includes a plurality of metal wirings connected to diffusion layers of transistors via contact plugs in contact holes.

A second layer wiring 6 includes a plurality of power supply lines and a plurality of signal lines. The plurality of power supply lines and the plurality of signal lines may include, but is not limited to, a metal such as aluminum or copper.

A third wiring layer 7 includes a plurality of power supply lines and a plurality of signal lines. The plurality of power supply lines and the plurality of signal lines may include, but is not limited to, a metal such as aluminum or copper. The third wiring layer is formed by interposing an insulating film over the second layer wiring. If a wiring of the third wiring layer is connected to a wiring of the second layer wiring, a through hole is formed in the insulating film and the wirings are connected via the through hole.

In the present embodiment, the first and third diffusion layers are described as sources of MOS transistors, and the second and fourth diffusion layers are described as drains of the MOS transistors, but are not limited thereto. The first and third diffusion layers may be drains of MOS transistors, and the second and fourth diffusion layers may be sources of the MOS transistors. In either case, the same operation effect can be obtained.

Hereinafter, when a first conductivity type is N-type, a first region is an N-channel region. A first transistor is an N-type transistor. A first capacitor is a compensation capacitor in the N-channel region. A first power supply line corresponds to VSS. In this case, a second conductivity type is P-type. A second region is a P-channel region. A second transistor is a P-type transistor. A second capacitor is a compensation capacitor in the P-channel region. A second power supply line corresponds to VDD.

When the first conductivity type is P-type and the second conductivity type is N-type, the elements described above have opposite conductivity type.

First Embodiment

FIG. 2 is a plan view showing a layout of a part of a circuit blocks arranged in the peripheral circuit arrangement region 4 according to the first embodiment of the present invention. FIG. 2 also illustrates elements, which are not disposed on a surface of the semiconductor device and are not actually visible, to facilitate understanding of a layout of the elements.

Figure 5:
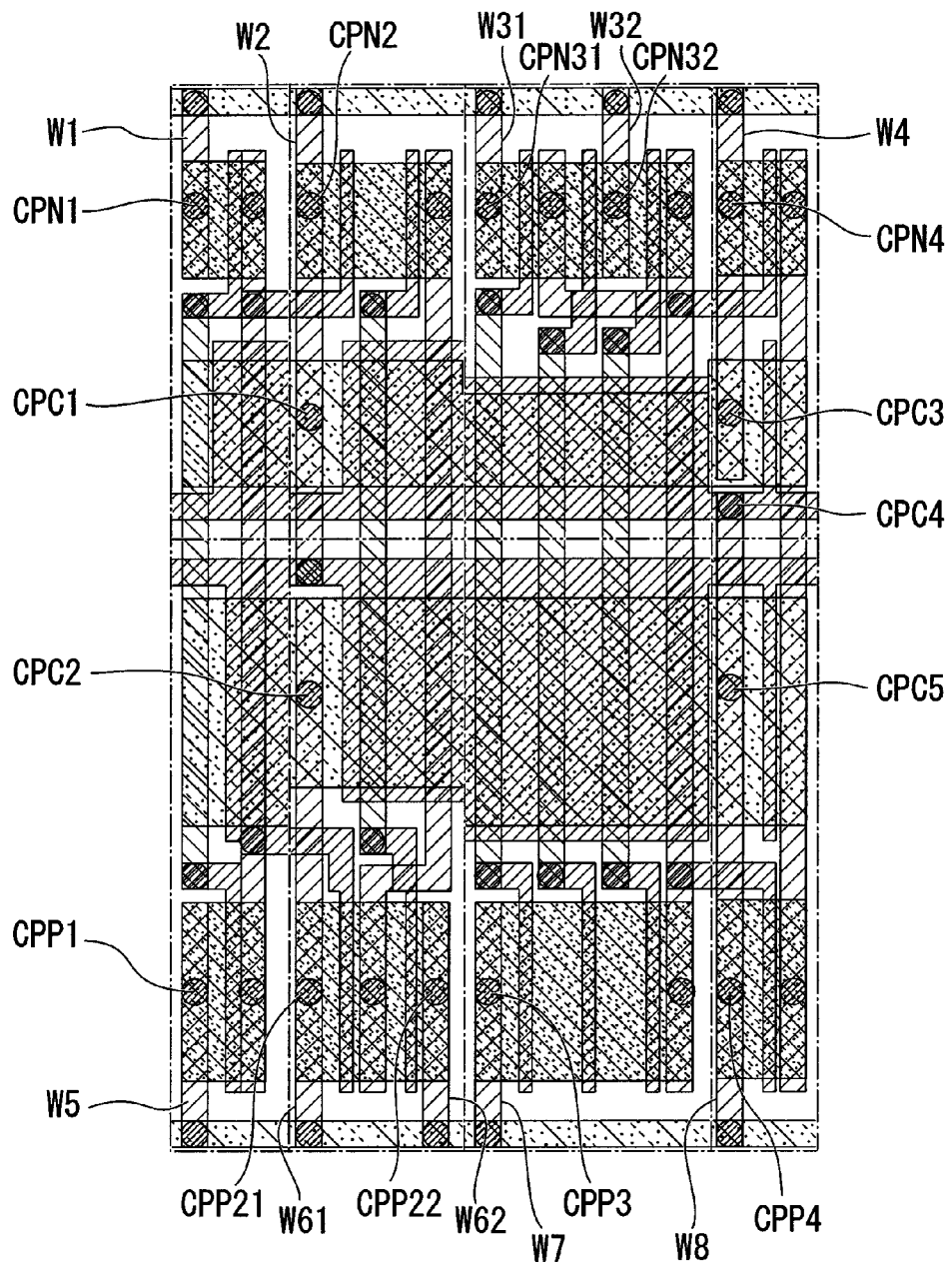
FIG. 5 is a fragmentary plan view showing layouts of a wiring pattern of a first layer wiring and contact plugs over FIG. 4 in accordance with one embodiment of the present invention.
Figure 9:
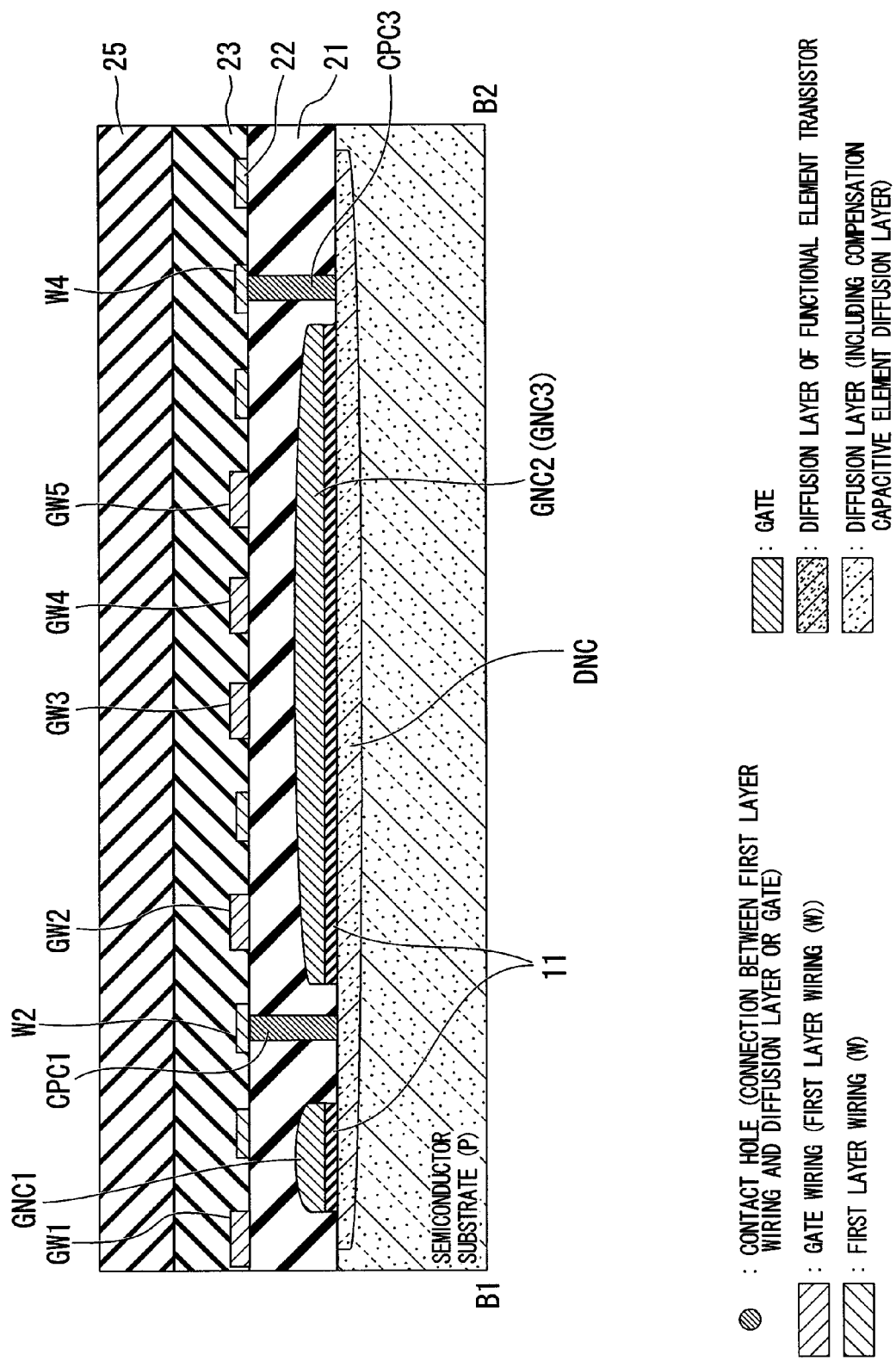
FIG. 9 is a fragmentary cross sectional elevation view, taken along a B1-B2 line of FIG. 2, illustrating the semiconductor device in accordance with one embodiment of the present invention.
Figure 10:
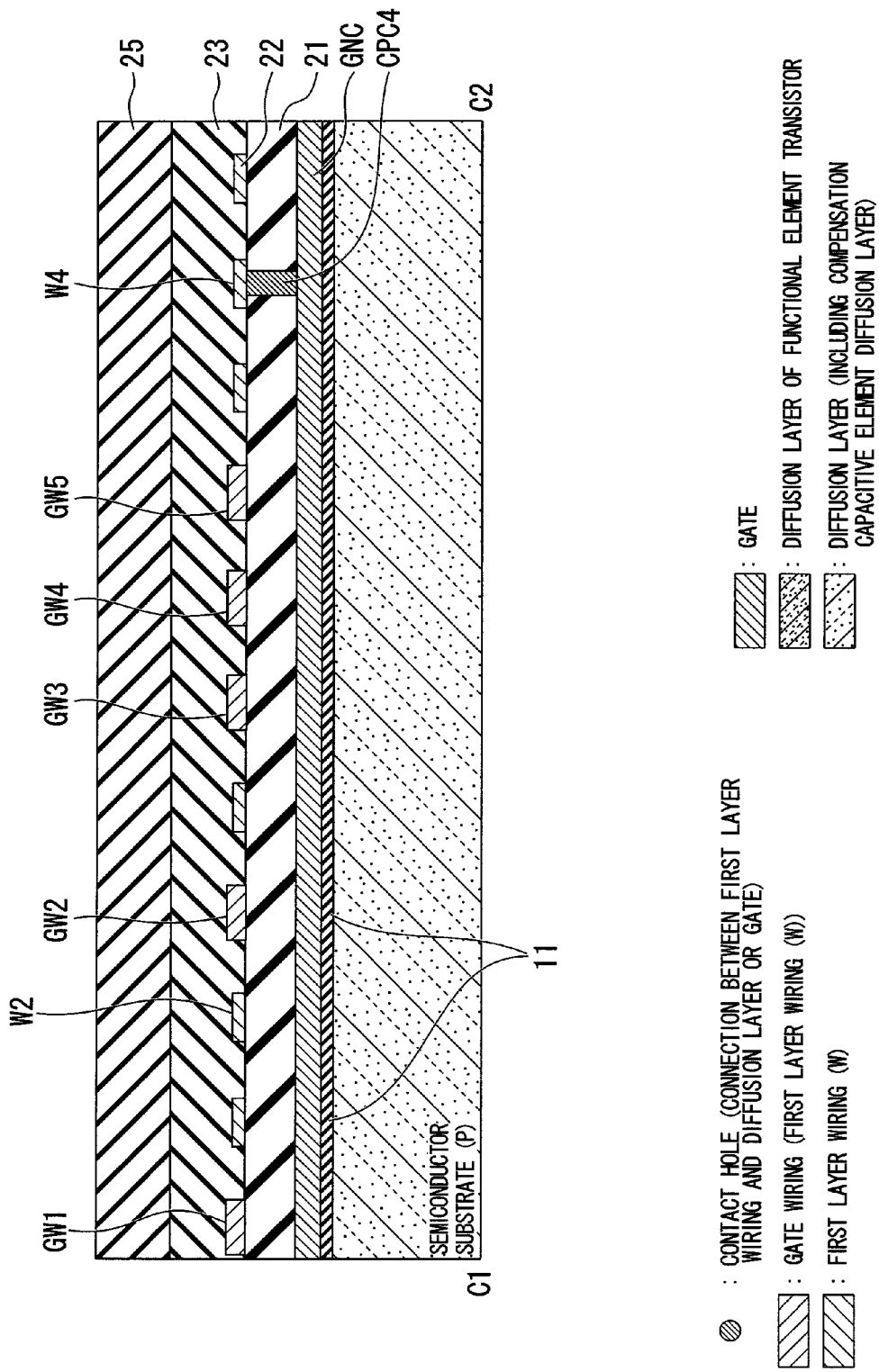
FIG. 10 is a fragmentary cross sectional elevation view, taken along a C1-C2 line of FIG. 2, illustrating the semiconductor device in accordance with one embodiment of the present invention.
Figure 11:
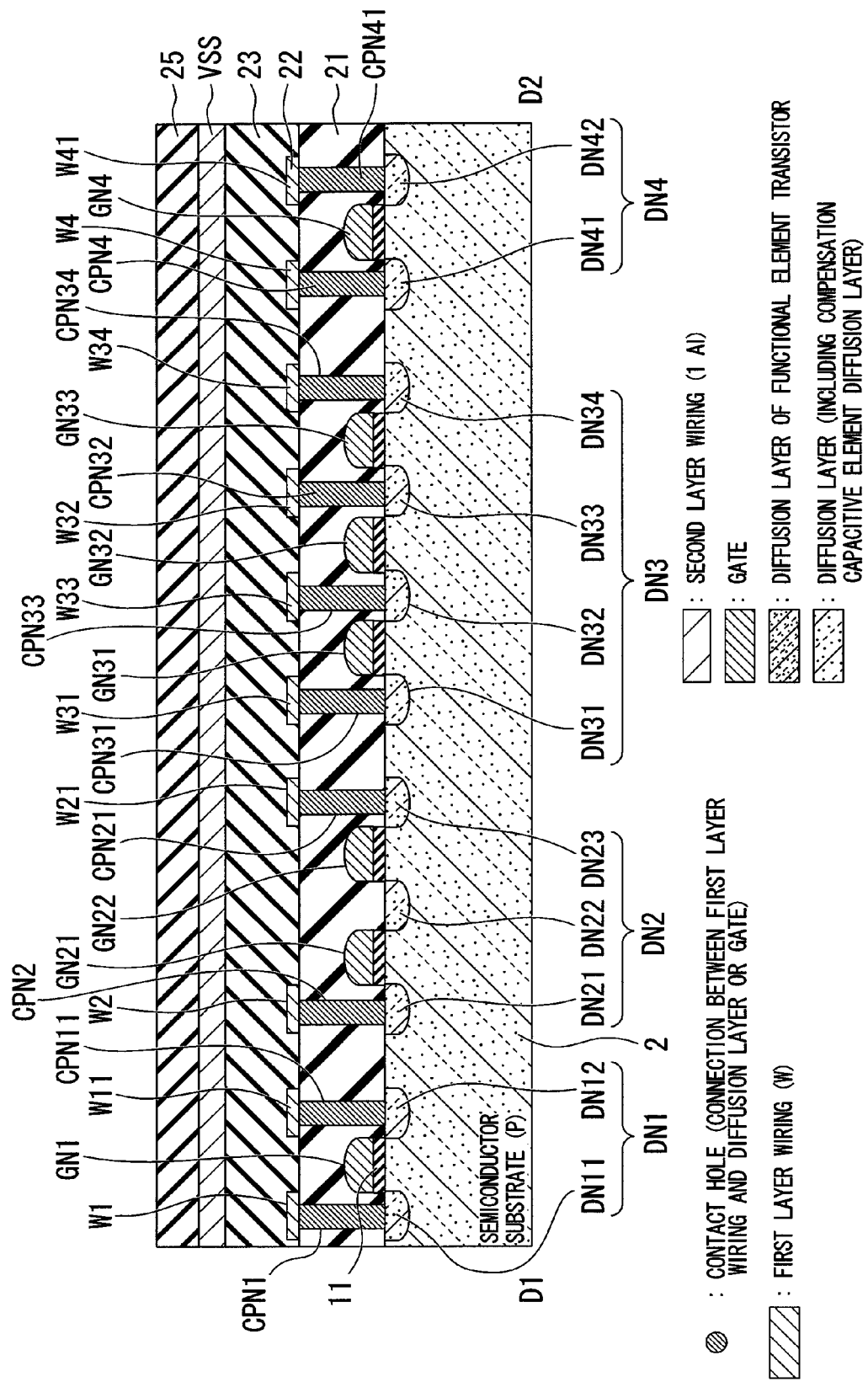
FIG. 11 is a fragmentary cross sectional elevation view, taken along a D1-D2 line of FIG. 2, illustrating the semiconductor device in accordance with one embodiment of the present invention.

FIG. 3 is a fragmentary plan view showing layouts of transistors and compensation capacitors over a semiconductor. FIG. 4 is a fragmentary plan view showing a layout of gate electrodes over FIG. 3. FIG. 5 is a fragmentary plan view showing layouts of a wiring pattern of a first layer wiring and contact plugs over FIG. 4. FIG. 6 is a fragmentary plan view showing a layout of power supply lines over FIG. 5. FIG. 7 is a fragmentary plan view showing layouts of signal lines and conductive plugs over FIG. 5. FIG. 8 is a fragmentary cross sectional elevation view taken along an A1-A2 line of FIG. 2. FIG. 9 is a fragmentary cross sectional elevation view taken along a B1-B2 line of FIG. 2. FIG. 10 is a fragmentary cross sectional elevation view taken along a C1-C2 line of FIG. 2. FIG. 11 is a fragmentary cross sectional elevation view taken along a D1-D2 line of FIG. 2.

A predetermined circuit patterns are regarded to be formed in a circuit cell where configuration is not illustrated.

As shown in FIG. 2, a semiconductor device 1 according to the first embodiment of the present invention may include, but is not limited to, first and second semiconductor regions which are bounded by the boundary. The first and second semiconductor regions are different in conductivity type from each other. In some cases, the first semiconductor region may be an N type semiconductor region, the second semiconductor region may be a P type semiconductor region, and the boundary may be defined by a junction of the N type semiconductor region and the P type semiconductor region or a trench isolation. The semiconductor device 1 may also include, but is not limited to, a plurality of semiconductor regions, each extending over the first and second semiconductor regions and through the boundary, which will be referred to as a circuit cell. The circuit cell is a semiconductor region but is not a circuit itself. The semiconductor device 1 may thus include the plurality of circuit cells. The combination of the first and second semiconductor regions may also include, but is not limited to, the plurality of circuit cells. Each of the plurality of circuit cells extends over the first and second semiconductor regions and through the boundary. The plurality of circuit cells are arranged side by side in an x-direction (first direction). Each of the plurality of circuit cells extends in a y-direction (second direction) substantially perpendicular to the first direction. Each of the plurality of circuit cells is separated into a first circuit cell semiconductor region of a first conductivity type and a second circuit cell semiconductor region of a second conductivity type different from the first conductivity type. The first conductivity type may be one of N type and P type, and the second conductivity type may be the other. The first circuit cell semiconductor region and the second circuit cell semiconductor region are arranged side by side in the y-direction (second direction). The first and second circuit cell semiconductor regions are bounded by a part of the boundary between the first and second semiconductor regions.

The semiconductor device 1 may further include, but is not limited to, first and second power supply lines, first and second transistors of the first and second conductivity types, and a first capacitor. The first and second transistor may be functional transistors. The first semiconductor region may include, but is not limited to, at least the first transistor of the first conductivity type to which a first potential is supplied from the first power line. The second semiconductor region may include, but is not limited to, at least a second transistor of the second conductivity type to which a second potential is supplied from the second power line. The first capacitor may extend in at least one circuit cell of the plurality of circuit cells. The first capacitor is disposed in the first semiconductor region. The first capacitor is disposed between the first transistor and the second transistor. The first capacitor is disposed between the first and second power supply lines. The first and second transistors are disposed between the first and second power supply lines. The first transistor is closer to the first power supply line than the first capacitor. The first transistor is closer to the first capacitor than the first power supply line. The first power supply line may partially overlap the first transistor. The second transistor is closer to the second power supply line than the first capacitor. The second transistor is closer to the first capacitor than the second power supply line. The second power supply line may partially overlap the second transistor.

The first capacitor is electrically coupled to the first power supply line. The first capacitor includes a first electrode coupled to the first power supply line. The first capacitor is provided to stabilize the potential of the first power supply line. The first capacitor can reduce noise of the first power supply line. The first capacitor may be realized by, but not limited to, a compensation capacitor. In some cases, the first power supply line may be one of a VSS and a VDD and the second power supply line may be the other of the VSS and VDD. The first and second power supply lines are distanced from each other in the y-direction and extend in parallel to the x-direction.

Hereinafter, the configuration of the semiconductor device 1 according to the first embodiment of the present invention shown in FIG. 2 will be described in detail with reference to FIGS. 3 to 11.

FIG. 3 shows an arrangement of diffusion layers on a surface of a semiconductor substrate. FIG. 3 illustrates four circuit cells C1, C2, C3, and C4 by indicating a circuit cell frame by a dashed-dotted line.

The circuit cell C1 includes an N-channel region Nch1 and a P-channel region Pch1. The circuit cell C2 includes an N-channel region Nch2 and a P-channel region Pch2. The circuit cell C3 includes an N-channel region Nch3 and a P-channel region Pch3. The circuit cell C4 includes an N-channel region Nch4 and a P-channel region Pch4. The N-channel regions Nch1, Nch2, Nch3, and Nch4 are disposed on a first side with respect to a PN boundary indicated by a dashed-two dotted line. The P-channel regions Pch1, Pch2, Pch3, and Pch4 are disposed on a second side with respect to the PN boundary. Each N-channel region may be an example of the first circuit cell semiconductor region described above. Each P-channel region Pch1 may be an example of the second circuit cell semiconductor region described above. The N-channel regions Nch1, Nch2, Nch3, and Nch4 form the first semiconductor region. The P-channel regions Pch1, Pch2, Pch3, and Pch4 form the second semiconductor region.

In the present embodiment, the PN boundary is linear in the x-direction.

Each of the N-channel regions and P-channel regions has the diffusion layers of one of the first and second transistors and a diffusion layer of the compensation capacitor.

In the present embodiment, the compensation capacitors are arranged in the vicinity of the PN boundary. The transistors may be arranged in opposing side areas of the circuit cell. The transistors may be arranged in the vicinity of the power supply lines as shown in FIG. 3. The compensation capacitors are closer to the PN boundary than the transistors as shown in FIG. 3.

In this embodiment, the transistors in the N-channel regions Nch1, Nch2, Nch3, and Nch4 are substantially the same as each other in a first dimension defined in the y-direction and are different from each other in a second dimension defined in the x-direction. Similarly, the transistors in the P-channel regions Pch1, Pch2, Pch3, and Pch4 are substantially the same as each other in a first dimension defined in the y-direction and are different from each other in a second dimension defined in the x-direction. However, the dimensions of the transistor are not limited thereto. The transistors in the N-channel regions Nch1, Nch2, Nch3, and Nch4 are different from each other in the first and second dimensions. The transistors in the P-channel regions Pch1, Pch2, Pch3, and Pch4 are different from each other in the first and second dimensions.

In this embodiment, a diffusion layer of the compensation capacitors is common between adjacent circuit cells in the N-type channel region. Also, a diffusion layer of the compensation capacitors is common between adjacent circuit cells in the P-type channel region. However, these diffusion layers of the compensation capacitors are not united. That is, a single diffusion layer is formed for the compensation capacitors in each of the N-channel region and the P-channel region.

The N-channel region Nch1 includes first and second diffusion layers DN1 of a transistor (N-type transistor) and an N-channel region common diffusion layer DNC of a compensation capacitor. The N-channel region Nch2 includes first and second diffusion layers DN2 of a transistor and the common diffusion layer DNC of a compensation capacitor. The N-channel region Nch3 includes first and second diffusion layers DN3 of a transistor and the common diffusion layer DNC of a compensation capacitor. The N-channel region Nch4 includes first and second diffusion layers DN4 of a transistor and the common diffusion layer DNC of a compensation capacitor. A pair of the first and second diffusion layers DN1 is spatially separated from the common diffusion layer DNC in plain view. Another pair of the first and second diffusion layers DN2 is spatially separated from the common diffusion layer DNC in plain view. Still another pair of the first and second diffusion layers DN3 is spatially separated from the common diffusion layer DNC in plain view. Yet another pair of the first and second diffusion layers DN4 is spatially separated from the common diffusion layer DNC in plain view.

The P-channel region Pch1 includes first and second diffusion layers DP1 of a transistor (P-type transistor) and a P-channel region common diffusion layer DPC of a compensation capacitor. The P-channel region Pch2 includes first and second diffusion layers DP2 of a transistor and the common diffusion layer DPC of a compensation capacitor. The P-channel region Pch3 includes first and second diffusion layers DP3 of a transistor and the common diffusion layer DPC of a compensation capacitor. The P-channel region Pch4 includes first and second diffusion layers DP4 of a transistor and the common diffusion layer DPC of a compensation capacitor. A pair of first and second diffusion layers DP1 is spatially separated from the common diffusion layer DPC in plain view. Another pair of first and second diffusion layers DP2 is spatially separated from the common diffusion layer DPC in plain view. Still another pair of first and second diffusion layers DP3 is spatially separated from the common diffusion layer DPC in plain view. Yet another pair of the first and second diffusion layers DP4 is spatially separated from the common diffusion layer DPC in plain view.

The common diffusion layer DNC is disposed between the first and second diffusion layers DN1 and the first and second diffusion layers DP1. The common diffusion layer DNC is disposed between the first and second diffusion layers DN2 and the first and second diffusion layers DP2. The common diffusion layer DNC is disposed between the first and second diffusion layers DN3 and the first and second diffusion layers DP3. The common diffusion layer DNC is disposed between the first and second diffusion layers DN4 and the first and second diffusion layers DP4. The common diffusion layer DPC is disposed between the common diffusion layer DNC and the first and second diffusion layers DP1. The common diffusion layer DPC is disposed between the common diffusion layer DNC and the first and second diffusion layers DP2. The common diffusion layer DPC is disposed between the common diffusion layer DNC and the first and second diffusion layers DP3. The common diffusion layer DPC is disposed between the common diffusion layer DNC and the first and second diffusion layers DP4.

The first and second diffusion layers are arranged at each side of a gate electrode, respectively. However, the first and second diffusion layers are shown as one element including the portion of the gate electrode in FIG. 3. The first diffusion layer and the second diffusion layer use a common symbol so as to avoid complexity in the figure.

FIG. 4 is a plain view illustrating gate electrodes over FIG. 3.

In the N-channel regions, gate electrodes GN1, GN21, GN22, GN31, GN32, GN33, and GN4 are arranged. The gate electrode GN1 belongs to the transistor of the N-channel region Nch1, which has the pair of first and second diffusion layers DN1. The gate electrodes GN21 and GN22 belong to the transistors of the N-channel region Nch2, which have the pair of first and second diffusion layers DN2. Two adjacent N-type transistors, which have the gate electrodes GN21 and GN22 respectively, share a single diffusion layer between the two adjacent N-type transistors. The gate electrodes GN31, GN32, and GN33 belong to the transistors of the N-channel region Nch3, which have the pair of first and second diffusion layers DN3. Two adjacent ones of the three N-type transistors, which have the gate electrodes GN31, GN32, and GN33 respectively, share a diffusion layer between the two adjacent ones. The gate electrode GN4 belongs to the transistor of the N-channel region Nch4, which has the pair of the first and second diffusion layers DN4.

In the P-channel regions, gate electrodes GP1, GP21, GP22, GP31, GP32, GP33, and GP4 are arranged. The gate electrode GP1 belongs to the transistor of the P-channel region Pch1, which has the pair of first and second diffusion layers DP1. The gate electrodes GP21 and GP22 belong to the transistor of the P-channel region Pch2, which has the pair of first and second diffusion layers DP2. P-type transistors, which have the gate electrodes GP21 and GP22 respectively, share a single diffusion layer between the two adjacent P-type transistors. The gate electrodes GP31, GP32, and GP33 belong to the transistors of the P-channel region Pch3, which have the pair of first and second diffusion layers DP3. Two adjacent ones of the three P-type transistors, which have the gate electrodes GP31, GP32, and GP33 respectively, share a diffusion layer between the two adjacent ones. The gate electrode GP4 belongs to the transistor of the P-channel region Pch4, which has the pair of the first and second diffusion layers DP4.

Gate electrodes GNC1, GNC2, GNC3, and GNC4 for the common diffusion layer DNC of the compensation capacitors are arranged as gate electrodes of the compensation capacitors in the N-channel regions. The gate electrodes GNC1, GNC2, GNC3, and GNC4 are commonly connected to a gate wiring GNC extending along the PN boundary.

Gate electrodes GPC1, GPC2, GPC3, and GPC4 for the common diffusion layer DPC of the compensation capacitors are arranged as gate electrodes of the compensation capacitors in the P-channel regions. The gate electrodes GPC1, GPC2, GPC3, and GPC4 are commonly connected to a gate wiring GPC extending along the PN boundary.

That is, the gate electrodes GNC1, GNC2, GNC3, and GNC4 are patterned in the predetermined shapes over the common diffusion layer DNC of the compensation capacitor in the N-channel region while a first gate insulating film is interposed between each of the gate electrodes GNC1, GNC2, GNC3, and GNC4 and the common diffusion layer DNC. The gate electrodes GNC1, GNC2, GNC3, and GNC4 are commonly connected to the gate wiring GNC extending along the PN boundary. The gate electrodes GPC1, GPC2, GPC3, and GPC4 are patterned in the predetermined shapes over the common diffusion layer DPC of the compensation capacitor in the P-channel region while a second gate insulating film is interposed between each of the gate electrodes GPC1, GPC2, GPC3, and GPC4 and the common diffusion layer DPC. The gate electrodes GPC1, GPC2, GPC3, and GPC4 are commonly connected to the gate wiring GPC extending along the PN boundary. Each of the gate electrodes GNC1, GNC2, GNC3, and GNC4, the first gate insulating film, and the common diffusion layer DNC constitutes the compensation capacitor. Similarly, each of the gate electrodes GPC1, GPC2, GPC3, and GPC4, the second gate insulating film, and the common diffusion layer DNC constitutes the compensation capacitor.

FIG. 5 is a fragmentary plan view showing layouts of wirings (wiring patterns) of a first layer wiring, a plurality of contact holes through which the wirings of the first layer wiring is connected to diffusion layers, contact plugs filled therein, a plurality of contact holes through which the wirings of the first layer wiring is connected to gate electrodes, and contact plugs filled therein. These elements are overlapped with the elements shown in FIG. 4. The first layer wiring is a first level wiring which is lowest in multi-level wiring structure. FIG. 6 is a fragmentary plan view showing layouts of a first power supply line VSS, a second power supply line VDD, first through holes, and conductive plugs which are overlapped with the elements shown in FIG. 5. The first power supply line VSS and the second power supply line VDD are formed in the first layer wiring. The first power supply line VSS and the second power supply line VDD are connected to wirings of the first layer via first through holes. The conductive plugs fill in the first through holes.

Details will be described with reference to FIGS. 5 and 6.

The first diffusion layer DN1 (source) of the transistor in the N-channel region Nch1 is connected to a wiring W1 via a contact plug CPN1. The wiring W1 is connected to the first power supply line VSS of the second layer wiring via a conductive plug DPN1 in one of the first through holes. The wiring W1 belongs to the first layer wiring. The wiring W1 may be made of tungsten. The first power supply line VSS of the second layer wiring passes above the first diffusion layer DN1.

The first diffusion layer DN2 (source) of the transistor of the N-channel region Nch2 is connected to a wiring W2 via a contact plug CPN2. The wiring W2 is connected to the first power supply line VSS of the second layer wiring via a conductive plug DPN2 in one of the first through holes. The wiring W2 belongs to the first layer wiring. The wiring W2 may be made of tungsten. The first power supply line VSS of the second layer wiring passes above the first diffusion layer DN2.

The first diffusion layer DN3 (source) of the transistor of the N-channel region Nch3 is connected to a wiring W31 via a contact plug CPN31. The wiring W31 is connected to the first power supply line VSS of the second layer wiring via a conductive plug DPN31 in one of the first through holes. Other first diffusion layer DN3 (source) is connected to a wiring W32 via a contact plug CPN32. The wiring W32 is connected to the first power supply line VSS of the second layer wiring via a conductive plug DPN32 in one of the first through holes. The wirings W31 and W32 belong to the first layer wiring. The wirings W31 and W32 may be made of tungsten. The first power supply line VSS of the second layer wiring passes above the first diffusion layer DN3.

The first diffusion layer DN4 (source) of the transistor of the N-channel region Nch4 is connected to a wiring W4 via a contact plug CPN4. The wiring W4 is connected to the first power supply line VSS of the second layer wiring via a conductive plug DPN4 in one of the first through holes. The wiring W4 belongs to the first layer wiring. The wiring W4 may be made of tungsten. The first power supply line VSS of the second layer wiring passes above the first diffusion layer DN4.

The first diffusion layer (source) DP1 of the transistor of the P-channel region Pch1 is connected to a wiring W5 via a contact plug CPP1. The wiring W5 is connected to the second power supply line VDD of the second layer wiring via a conductive plug DPP1 in one of the first through holes. The wiring W5 belongs to the first layer wiring. The wiring W5 may be made of tungsten. The second power supply line VDD of the second layer wiring passes above the first diffusion layer DP1.

The first diffusion layer (source) DP2 of the transistor of the P-channel region Pch2 is connected to a wiring W61 via a contact plug CPP21. The wiring W61 is connected to the second power supply line VDD of the second layer wiring via a conductive plug DPP21 in one of the first through holes. Other first diffusion layer DP2 (source) of the transistor of the P-channel region Pch2 is connected to a wiring W62 via a contact plug CPP22. The wiring W62 is connected to the second power supply line VDD of the second layer wiring via a conductive plug DPP22 in one of the first through holes. The wirings W61 and W62 belong to the first layer wiring. The wirings W61 and W62 may be made of tungsten. The second power supply line VDD of the second layer wiring passes above the first diffusion layer DP2.

The first diffusion layer DP3 (source) of the transistor of the P-channel region Pch3 is connected to a wiring W7 via a contact plug CPP3. The wiring W7 is connected to the second power supply line VDD of the second layer wiring via a conductive plug DPP3 in one of the first through holes. The wiring W7 belongs to the first layer wiring. The wiring W7 may be made of tungsten. The second power supply line VDD of the second layer wiring passes above the first diffusion layer DP3.

The first diffusion layer DP4 (source) of the transistor of the P-channel region Pch4 is connected to a wiring W8 via a contact plug CPP4. The wiring W8 is connected to the second power supply line VDD of the second layer wiring via a conductive plug DPP4 in one of the first through holes. The wiring W8 belongs to the first layer wiring. The wiring W8 may be made of tungsten. The second power supply line VDD of the second layer wiring passes above the first diffusion layer DP4.

The common diffusion layer DNC of the compensation capacitor formed in the N-channel region is electrically connected to the wiring W2 of the first layer wiring via a contact plug CPC1 in one of the contact holes. Also, the common diffusion layer DNC is electrically connected to the wiring W4 of the first layer wiring via a contact plug CPC3 in one of the contact holes.

The wiring W2 is electrically connected to the first power supply line VSS via a conductive plug DPN2 in one of the first through holes. The wiring W4 is electrically connected to the first power supply line VSS via a conductive plug DPN4 in one of the first through holes. Accordingly, the power potential of the first power supply line VSS is supplied to the diffusion layer of the compensation capacitor in the N-channel region via the wirings W2 and W4 of the first layer wiring.

The wiring W2 is also electrically connected to the gate electrode GPC. Accordingly, the power potential of the first power supply line VSS is supplied to gate electrode GPC of the compensation capacitor in the P-channel region via the wiring W2.

The common diffusion layer DPC of the compensation capacitor formed in the P-channel region is electrically connected to the wiring W61 in the first layer wiring via a contact plug CPC2 in one of the contact holes. The common diffusion layer DPC is electrically connected to the wiring W8 of the first layer wiring via a contact plug CPC5 in one of the contact holes.

The wiring W61 is electrically connected to the second power supply line VDD via a conductive plug DPP21 in one of the first through holes. The wiring W8 is electrically connected to the second power supply line VDD via a conductive plug DPP4 in one of the first through holes. Accordingly, the power potential of the second power supply line VDD is supplied to the diffusion layer of the compensation capacitor formed in the P-channel region via the wirings W61 and W8 of the first layer wiring.

The wiring W8 is also electrically connected to the gate electrode GNC via a conductive plug CPC4 in one of the first through holes. Accordingly, the power potential of the second power supply line VDD is supplied to the gate electrode GNC of the compensation capacitor formed in the N-channel region via the wiring W8.

FIG. 7 is a fragmentary plan view showing layouts of signal lines, gate wirings, the first through holes, and conductive plugs, which are overlapped with the elements shown in FIG. 6. Gate wirings GW1, GW2, GW3, GW4, and GW5 belong to the first layer wirings. Signal lines SL1, SL2, SL3, SL4, and SL5 belong to the second layer wirings. The signal lines SL1, SL2, SL3, SL4, and SL5 elongates in the x-direction. The signal lines SL1, SL2, SL3, SL4, and SL5 and the gate wirings GW1, GW2, GW3, GW4, and GW5 are connected to each other through the first through holes. Each of the signal lines SL1, SL2, SL3, SL4, and SL5 crosses the gate wirings GW1, GW2, GW3, GW4, and GW5. The conductive plugs fill in the first through holes in FIG. 6.

The gate wiring GW1 connects the gate electrode GN1 of the transistor of the N-channel region Nch1 and the gate electrode GP1 of the transistor of the P-channel region Pch1. The gate wiring GW1 extends between the gate electrode GN1 of the transistor of the N-channel region Nch1 and the gate electrode GP1 of the transistor of the P-channel region Pch1. The gate wiring GW1 is connected to the signal line SL2 via a conductive plug DPT1 in one of the first through holes. The gate wiring GW1 overlaps the common diffusion layer DNC and the common diffusion layer DPC. The signal line SL2 overlaps the common diffusion layer DNC.

The gate wiring GW2 connects the gate electrode GN22 of the transistor of the N-channel region Nch2 and the gate electrode GP22 of the transistor of the P-channel region Pch2. The gate wiring GW2 extends between the gate electrode GN22 of the transistor of the N-channel region Nch2 and the gate electrode GP22 of the transistor of the P-channel region Pch2. The gate wiring GW2 is connected to a signal line SL1 via a conductive plug DPT2 in one of the first through holes. The gate wiring GW2 overlaps the common diffusion layer DNC and the common diffusion layer DPC. The signal line SL1 overlaps the common diffusion layer DNC.

The gate wiring GW3 connects the gate electrode GN31 of the transistor of the N-channel region Nch3 and the gate electrode GP31 of the transistor of the P-channel region Pch3. The gate wiring GW3 extends between the gate electrode GN31 of the transistor of the N-channel region Nch3 and the gate electrode GP31 of the transistor of the P-channel region Pch3. The gate wiring GW3 is connected to a signal line SL3 via a conductive plug DPT3 in one of the first through holes. The gate wiring GW3 overlaps the common diffusion layer DNC and the common diffusion layer DPC.

The gate wiring GW4 connects the gate electrode GN32 of the transistor of the N-channel region Nch3 and the gate electrode GP32 of the transistor of the P-channel region Pch3.

The gate wiring GW4 extends between the gate electrode GN32 of the transistor of the N-channel region Nch3 and the gate electrode GP32 of the transistor of the P-channel region Pch3. The gate wiring GW4 is connected to a signal line SL4 via a conductive plug DPT4 in one of the first through holes. The gate wiring GW4 overlaps the common diffusion layer DNC and the common diffusion layer DPC. The signal line SL4 overlaps the common diffusion layer DPC.

The gate wiring GW5 connects the gate electrode GN33 of the transistor of the N-channel region Nch3 and the gate electrode GP33 of the transistor of the P-channel region Pch3. The gate wiring GW5 extends between the gate electrode GN33 of the transistor of the N-channel region Nch3 and the gate electrode GP33 of the transistor of the P-channel region Pch3. The gate wiring GW5 is connected to a signal line SL5 via a conductive plug DPT5 in one of the first through holes. The gate wiring GW5 overlaps the common diffusion layer DNC and the common diffusion layer DPC. The signal line SL5 overlaps the common diffusion layer DPC.

In the present embodiment, the transistors are disposed at a circuit cell end side (that is, a vicinity of power supply line) in each region of the N-channel region and the P-channel region as described above. The compensation capacitors are disposed at a vicinity of the PN boundary in each region of the N-channel region and the P-channel region. A length of the gate wirings, each of which electrically connects the gate electrode of the transistor of the N-channel region and the gate electrode of the transistor of the P-channel region, can be configured to be greater than that of the known semiconductor device. The gate wirings overlap the compensation capacitors as shown in FIG. 7. Thus, the number of arranged signal lines can be greater than that of the known semiconductor device.

Since the length of the gate wiring can be greater than that of the known semiconductor device, the signal lines directed to each circuit cell can be arranged without intersection of the signal lines or an insertion of wiring cells.

FIG. 8 is a fragmentary cross sectional elevation view, taken along an A1-A2 line of FIG. 2.

The N-channel region Nch2 is disposed on an A1 side. The P-channel region Pch2 is disposed on an A2 side.

The first diffusion layer DN2 of an N-type transistor N2 arranged in the N-channel region Nch2 is electrically connected to the wiring W2 in a first layer wiring 22 via the contact plug CPN2. The contact plug CPN2 fills one of the contact holes formed in an interlayer insulating film 21. The interlayer insulating film 21 covers the gate insulating film 11 and the gate electrodes GN1, GN21, GN22, GN31, GN32, GN33, GN4, GP1, GP21, GP22, GP31, GP32, GP33, and GP4.

The common diffusion layer DNC of the compensation capacitor is electrically connected to the wiring W2 via the contact plug CPC1 in one of the contact hole formed in the interlayer insulating film 21.

The wiring W2 is electrically connected to the first power supply line VSS in a second layer wiring 24 via the conductive plug DPN2. The conductive plug DPN2 fills one of the first through holes formed in an interlayer insulating film 23. The interlayer insulating film 23 covers the wiring W2. The second layer wiring 24 is covered by a third interlayer insulating film 25.

The first diffusion layer DP2 of a P-type transistor P2 arranged in the P-channel region Pch2 is electrically connected to the wiring W61 in the first layer wiring 22 via the contact plug CPP21. The contact plug CPP21 fills one of the contact holes formed in the interlayer insulating film 21.

The common diffusion layer DPC of the compensation capacitor is electrically connected to the wiring W61 via the contact plug CPC2 in one of the contact holes formed in the interlayer insulating film 21.

The wiring W61 is electrically connected to the second power supply line VDD formed in the second layer wiring 24 via the conductive plug DPP21 in one of the first through holes formed in the interlayer insulating film 23 covering the wiring W2.

FIG. 9 is a fragmentary cross sectional elevation view, taken along a B1-B2 line of FIG. 2.

Over the common diffusion layer DNC of the compensation capacitor formed in the semiconductor substrate 2, the gate electrode GNC1 is formed while the gate insulating film 11 is interposed between the common diffusion layer DNC and the gate electrode GNC1. The gate electrode GNC2 (GNC3) is formed over the common diffusion layer DNC while the gate insulating film 11 is interposed between the common diffusion layer DNC and the gate electrode GNC2 (GNC3).

The common diffusion layer DNC of the compensation capacitor is electrically connected to the wiring W2 in the first layer wiring via the contact plug CPC1 in one of the contact holes formed in the first interlayer insulating film 21. The common diffusion layer DNC of the compensation capacitor is also electrically connected to the wiring W4 in the first layer wiring via the contact plug CPC3 in one of the contact holes formed in the first interlayer insulating film 21.

FIG. 10 is a fragmentary cross sectional elevation view, taken along a C1-C2 line of FIG. 2.

The gate electrode GNC of the compensation capacitor is common in the N-channel regions Nch1, Nch2, Nch3, and Nch4. The gate electrode GNC is formed over the semiconductor substrate 2 while the gate insulating film 11 is interposed between the gate electrode GNC and the semiconductor substrate 2.

The gate electrode GNC is electrically connected to the wiring W4 in the first layer wiring 22 via the contact plug CPC4 in one of the contact holes formed in the first interlayer insulating film 21. The first interlayer insulating film 21 covers the gate electrode GNC.

FIG. 11 is a fragmentary cross sectional elevation view, taken along a D1-D2 line of FIG. 2.

A diffusion layer DN11 of the transistor is arranged in the N-channel region Nch1. The diffusion layer DN11 is electrically connected to the wiring W1 in the first layer wiring via the contact plug CPN1 in one of the contact holes formed in the interlayer insulating film 21. A second diffusion layer DN12 is electrically connected to a wiring W11 in the first layer wiring via a contact plug CPN11. The wiring W11 may be made of tungsten.

A diffusion layer DN21 of the transistor is arranged in the N-channel region Nch2. The diffusion layer DN21 is electrically connected to the wiring W2 in the first layer wiring via the contact plug CPN2 in one of the contact holes formed in the interlayer insulating film 21. A second diffusion layer DN23 is electrically connected to a wiring W21 in the first layer wiring via a contact plug CPN21. The wiring W21 may be made of tungsten.

A diffusion layer DN31 of the transistor is arranged in the N-channel region Nch3. The diffusion layer DN31 is electrically connected to the wiring W31 in the first layer wiring via the contact plug CPN31 in one of the contact holes formed in the interlayer insulating film 21. A second diffusion layer DN32 is electrically connected to a wiring W33 in the first layer wiring via the contact plug CPN33. A second diffusion layer DN33 is electrically connected to a wiring W32 in the first layer wiring via a contact plug CPN32. A second diffusion layer DN34 is electrically connected to a wiring W34 in the first layer wiring via a contact plug CPN34. The wirings W32 and W33 may be made of tungsten.

A diffusion layer DN41 of the transistor is arranged in the N-channel region Nch4. The diffusion layer DN41 is electrically connected to the wiring W4 in the first layer wiring via the contact plug CPN4 in one of the contact holes formed in the interlayer insulating film 21. A second diffusion layer DN42 is electrically connected to a wiring W41 in the first layer wiring via a contact plug CPN41. The wiring W41 may be made of tungsten.

The interlayer insulating film 23 covers the wirings W1, W11, W2, W21, W31, W32, W33, W34, W4, and W41. The first power supply line VSS is formed on the interlayer insulating film 23.

Figure 12:
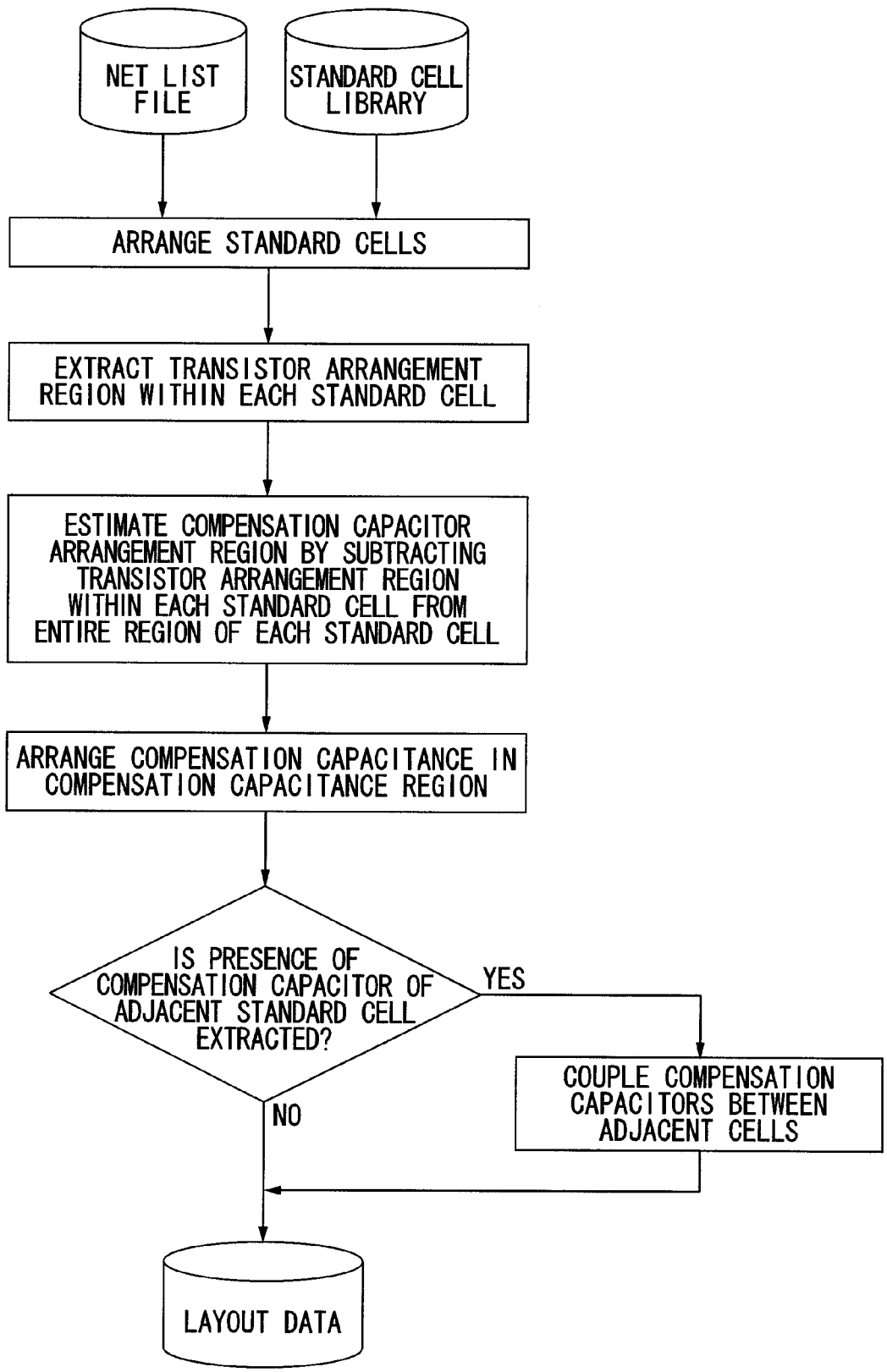
FIG. 12 is a flow chart of a layout design of the semiconductor device in accordance with one embodiment of the present invention.

FIG. 12 is a flow chart of a layout design of the semiconductor device according to the present embodiment.

Connection information of each circuit cell based on a circuit diagram of a predetermined area is stored in a net list file. A circuit cell (standard cell) is stored in a standard cell library.

The standard cell is a circuit cell where transistors are arranged in advance in a vicinity of the power supply lines. The standard cell library includes the plurality of standard cells as circuit cells.

The standard cell library may include a circuit cell, such as the circuit cell as disclosed in Japanese Unexamined Patent Application, First Publication, No. JP-A-2006-253393, other than the plurality of standard cells where the transistors are arranged in advance in a vicinity of the power supply lines. In this case, a process of selecting a plurality of standard cells where transistors are arranged in advance in a vicinity of the power supply lines as circuit cells from the standard cell library is taken.

In extraction of a transistor arrangement region, a region obtained by adding a minimum required interval between adjacent elements (a transistor and a compensation capacitor) upon ion implantation or the like to a region where a transistor is actually formed may be regarded as a transistor formation region.

In coupling of the compensation capacitor between adjacent cells, for example, the compensation capacitor in each circuit cell is expanded to adjacent circuit cells. The overlapped region of the compensation capacitor is then extracted. The overlapped region is designated as a region where the compensation capacitors are connected between the adjacent cells.

Modified Example of First Embodiment

FIG. 13 shows a part of a semiconductor device, which is a modified example of the first embodiment of the present invention. FIG. 13 is a fragmentary plan view also illustrating elements, which are not disposed on a surface of the semiconductor device and are not actually visible, to facilitate understanding of a layout of the elements.

FIG. 13 illustrates only one circuit cell.

The circuit cell includes an N-channel region Nch on a first side and a P-channel region Pch on a second side with respect to a PN boundary indicated by a dashed-two dotted line.

The PN boundary is also linear in the present embodiment.

In this embodiment, the N-channel region includes a transistor and a compensation capacitor. However, this embodiment is different from the first embodiment in that the P-channel region includes the transistor and does not include the compensation capacitor.

This embodiment is the same as the first embodiment in that the compensation capacitor is arranged in a vicinity of the PN boundary and the transistor is arranged at a circuit cell end side (that is, a vicinity of a power supply line).

FIG. 14 is a diagram excluding power supply lines VSS and VDD and a wiring pattern of the first layer wiring in FIG. 13.

The N-channel region Nch includes a diffusion layer DN51 of the transistor and a diffusion layer DNC51 of the compensation capacitor. The P-channel region Pch includes a diffusion layer DP51 of the transistor. The diffusion layers are arranged at both sides of a gate electrode, but the diffusion layers are shown as one element including the portion of the gate electrode in FIG. 14. The diffusion layer DN51 is spatially separated from the diffusion layer DNC51. The diffusion layer DNC51 is disposed between the diffusion layer DN51 and the diffusion layer DP51.

The transistor of the N-channel region Nch includes a gate electrode GN51, a gate electrode GN52, and a first gate insulating film. The compensation capacitor of the N-channel region Nch includes a gate electrode GNC51 and a second the gate insulating film. The compensation capacitor is constituted by the gate electrode GNC51, the second gate insulating film, and a diffusion layer DNC51. The transistor of the P-channel region Pch includes a gate electrode GP51, a gate electrode GP52, and a third gate insulating film.

Returning to FIG. 13, the diffusion layer (source) DN51 of the transistor of the N-channel region Nch is connected to a wiring W51 via a contact plug CPN51. The wiring W51 is connected to the first power supply line VSS via a conductive plug DPN51. The wiring W51 may be made of tungsten.

The diffusion layer (source) DP51 of the transistor of the P-channel region Pch is connected to a wiring W52 via a contact plug CPN52. The wiring W52 is connected to the second power supply line VDD via a conductive plug DPP51. The wiring W52 may be made of tungsten.

The diffusion layer DNC51 of the compensation capacitor of the N-channel region Nch is connected to a wiring W53 via a contact plug CPN54. The wiring W53 is connected to the first power supply line VSS via a conductive plug DPN52. The gate electrode GNC51 of the compensation capacitor of the N-channel region Nch is connected to a wiring W54 via a contact plug CPN55, and the wiring W54 is connected to the first power supply line VSS via a conductive plug DPP52. Thereby, the compensation capacitor functions as a capacitor element. The wirings W53 and W54 may be made of tungsten.

The gate electrode GN51 of the transistor of the N-channel region Nch and the gate electrode GP51 of the transistor of the P-channel region Pch are connected by a gate wiring GW51 via a contact plug. The gate wiring GW51 extends between the gate electrode GN51 of the transistor of the N-channel region Nch and the gate electrode GP51 of the transistor of the P-channel region Pch. The gate wiring GW1 overlaps the diffusion layer DNC51.

In the present embodiment, the transistors are disposed at a circuit cell end side (that is, a vicinity of power supply line) in each region of the N-channel region and the P-channel region as described above. The compensation capacitors are disposed at a vicinity of the PN boundary in each region of the N-channel region and the P-channel region. The gate wirings, each of which electrically connects the gate electrode of the transistor of the N-channel region and the gate electrode of the transistor of the P-channel region, overlap the compensation capacitors. A length of the gate wirings can be configured to be greater than that of the known semiconductor device. Thus, the number of arranged signal lines can be greater than that of the known semiconductor device.

Since the length of the gate wiring can be greater than that of the known semiconductor device, the signal lines directed to each circuit cell can be arranged without intersection of the signal lines or an insertion of wiring cells.

Second Embodiment

FIG. 15 illustrates a part of a semiconductor device of the second embodiment of the present invention, which is a layout of a part of a circuit block arranged in a peripheral circuit region 4. FIG. 15 is a fragmentary plan view also illustrating elements, which are not disposed on a surface of the semiconductor device and are not actually visible, to facilitate understanding of a layout of the elements.

FIG. 16 illustrates four circuit cells C1, C2, C3, and C4 by indicating a circuit cell frame by a dashed-dotted line. The second embodiment is the same as the first embodiment in that each circuit cell has N-channel regions Nch1, Nch2, Nch3, and Nch4 and P-channel regions Pch1, Pch2, Pch3, and Pch4. The N-channel regions Nch1, Nch2, Nch3, and Nch4 are disposed on a first side with respect to a PN boundary indicated by a dashed-two dotted line. The P-channel regions Pch1, Pch2, Pch3, and Pch4 are disposed on a second side with respect to the PN boundary. Each N-channel region may be an example of the first circuit cell semiconductor region described above. Each P-channel region Pch1 may be an example of the second circuit cell semiconductor region described above. The N-channel regions Nch1, Nch2, Nch3, and Nch4 form the first semiconductor region. The P-channel regions Pch1, Pch2, Pch3, and Pch4 form the second semiconductor region. The second embodiment is an example in which the PN boundary is not linear in an x-direction. The PN boundary is decided in accordance with the size of transistors of the P-channel regions Pch1, Pch2, Pch3, and Pch4 as shown in FIG. 16. A part of the PN boundary B-B' is closer to the second power supply line VDD than a part of the PN boundary A-A' and a part of the PN boundary C-C'. A common diffusion layer DNC61 of N-channel region of a compensation capacitor is provided between N-channel regions Nch1, Nch2, Nch3, and Nch4 and the PN boundary.

In the present embodiment, a diffusion layer is common among adjacent circuit cells.

The compensation capacitor is formed in the N-channel region. The compensation capacitor in the N-channel region of the present embodiment is greater in area than that of the first embodiment shown in FIG. 2. The compensation capacitors are arranged in the vicinity of the PN boundary. The compensation capacitors are closer to the PN boundary than the transistors.

Here, the compensation capacitor formed is a plate capacitor including a diffusion layer and a gate electrode. A capacitance value C is expressed by the following equation:

$C = \varepsilon \cdot S/d$ ($C$=Capacitance, $\varepsilon$=Dielectric constant, $S$=Diffusion Layer-gate overlap area, and $d$=Gate insulating film thickness).

In general, a gate insulating film formed in the N-channel region is thinner than a gate insulating film formed in the P-channel region (for example, a thickness of the gate insulating film of the N-channel region is dN=2.8 μm and a thickness of the gate insulating film of the P-channel region is dP=3.8 μm). Thus, if the compensation capacitors of the N-channel region and the P-channel region have the same area as each other, a capacitance value of the compensation capacitor formed in the N-channel region is larger by dP/dN=3.8/2.8=1.35 times.

In this embodiment, the PN boundary is determined according to the dimension of the y-direction (width direction) of the transistor in the P-channel region of each circuit cell. Specifically, when the dimension of the y-direction (width direction) of the transistor in the P-channel region is short, the PN boundary is arranged near the transistor (P-type transistor). The transistor is arranged in the P-channel region, and the compensation capacitor is formed in only the N-channel region. As a result, even when an empty region is the same in area as that in the case where the PN boundary is arranged in a straight line in the x-direction, an area ratio of the compensation capacitor in the N-channel region to whole compensation capacitor in the present embodiment is larger than that in the first embodiment. A capacitance value of the entire compensation capacitor in the present embodiment is larger than that in the first embodiment for the above-described reason.

Hereinafter, a semiconductor device according to the present embodiment will be described in detail.

The N-channel region Nch1 includes first and second diffusion layers DN1 of a transistor and an N-channel region common diffusion layer DNC61 of a compensation capacitor. The N-channel region Nch2 includes first and second diffusion layers DN2 of a transistor and the common diffusion layer DNC61 of a compensation capacitor. The N-channel region Nch3 includes first and second diffusion layers DN3 of a transistor and the common diffusion layer DNC61 of a compensation capacitor. The N-channel region Nch4 includes first and second diffusion layers DN4 of a transistor and the common diffusion layer DNC61 of a compensation capacitor. A pair of the first and second diffusion layers DN1 is spatially separated from the common diffusion layer DNC61 in plain view. Another pair of the first and second diffusion layers DN2 is spatially separated from the common diffusion layer DNC61 in plain view. Still another pair of the first and second diffusion layers DN3 is spatially separated from the common diffusion layer DNC61 in plain view. Yet another pair of the first and second diffusion layers DN4 is spatially separated from the common diffusion layer DNC61 in plain view.

The P-channel region Pch1 includes first and second diffusion layers DP1 of a transistor, but does not have a diffusion layer of a compensation capacitor. The P-channel region Pch2 includes first and second diffusion layers DP2 of a transistor, but does not have the diffusion layer of a compensation capacitor. The P-channel region Pch3 includes first and second diffusion layers DP3 of a transistor, but does not have the diffusion layer of a compensation capacitor. The P-channel region Pch4 includes first and second diffusion layers DP4 of a transistor, but does not have the diffusion layer of a compensation capacitor. A pair of the first and second diffusion layers DP1 is spatially separated from the common diffusion layer DNC61 in plain view. Another pair of the first and second diffusion layers DP2 is spatially separated from the common diffusion layer DNC61 in plain view. Still another pair of the first and second diffusion layers DP3 is spatially separated from the common diffusion layer DNC61 in plain view. Yet another pair of the first and second diffusion layers DP4 is spatially separated from the common diffusion layer DNC61 in plain view.

The common diffusion layer DNC61 is disposed between the first and second diffusion layers DN1 and the first and second diffusion layers DP1. The common diffusion layer DNC61 is disposed between the first and second diffusion layers DN2 and the first and second diffusion layers DP2. The common diffusion layer DNC61 is disposed between the first and second diffusion layers DN3 and the first and second diffusion layers DP3. The common diffusion layer DNC61 is disposed between the first and second diffusion layers DN4 and the first and second diffusion layers DP4.

In this embodiment, a length (width) of the y-direction of the transistor arranged in each channel region is identical. A length (width) of the x-direction is different.

The first and second diffusion layers are arranged at both sides of the gate electrode, but the first and second diffusion layers are shown as one element including the portion of the gate electrode in FIG. 16. In the specification, the first diffusion layer and the second diffusion layer use a common symbol so as to avoid complexity in FIG. 16.

FIG. 17 is a fragmentary plan view showing a layout of gate electrodes over FIG. 16.

The transistor is the same as that of the first embodiment.

That is, in the N-channel regions, gate electrodes GN1, GN21, GN22, GN31, GN32, GN33, and GN4 are arranged. The gate electrode GN1 belongs to transistor of the N-channel region Nch1, which has the pair of first and second diffusion layers DN1. The gate electrodes GN21 and GN22 belong to transistor of the N-channel region Nch2, which has the pair of first and second diffusion layers DN2. Two adjacent N-type transistors, which have the gate electrodes GN21 and GN22 respectively, share a single diffusion layer between the two adjacent N-type transistors. The gate electrodes GN31, GN32, and GN33 belong to the transistors of the N-channel region Nch3, which have the pair of first and second diffusion layers DN3. Two adjacent ones of the three N-type transistors, which have the gate electrodes GN31, GN32, and GN33 respectively, share a diffusion layer between the two adjacent ones. The gate electrode GN4 belongs to the transistor of the N-channel region Nch4, which has the pair of the first and second diffusion layers DN4.

In the P-channel regions, gate electrodes GP1, GP21, GP22, GP31, GP32, GP33, and GP4 are arranged. The gate electrode GP1 belongs to the transistor of the P-channel region Pch1, which has the pair of first and second diffusion layers DP1. The gate electrodes GP21 and GP22 belong to the transistor of the P-channel region Pch2, which has the pair of first and second diffusion layers DP2. P-type transistors, which have the gate electrodes GP21 and GP22 respectively, share a single diffusion layer between the two adjacent P-type transistors. The gate electrodes GP31, GP32, and GP33 belong to the transistors of the P-channel region Pch3, which have the pair of first and second diffusion layers DP3. Two adjacent ones of the three P-type transistors, which have the gate electrodes GP31, GP32, and GP33 respectively, share a diffusion layer between the two adjacent ones. The gate electrode GP4 belongs to the transistor of the P-channel region Pch4, which has the pair of the first and second diffusion layers DP4.

This embodiment is different from the first embodiment in the following configurations. A common gate electrode GNC61 is arranged over the common diffusion layer DNC61 of the compensation capacitor as the gate electrode of the compensation capacitor in the N-channel region Nch. The common gate electrode GNC61 includes a portion GNC61a extending along the PN boundary. The P-channel region Pch does not have the compensation capacitor.

FIG. 18 is a fragmentary plan view showing a wiring (wiring pattern) of a first layer wiring, a contact holes which connect the wirings of the first layer wiring and diffusion layers, contact plugs filled therein, contact holes which connect the wirings of the first layer wiring and gate electrodes, a contact plug filled therein, first through holes, conductive plugs in the first through holes, and signal lines. These elements are overlapped with the elements shown in FIG. 17. Gate wirings GW1, GW2, GW3, GW4, and GW5 belong to the first layer wirings. The wiring (wiring pattern) of a first layer wiring is a first level wiring which is lowest in multi-level wiring structure.

The common diffusion layer DNC61 of the compensation capacitor in the N-channel region is electrically connected to a wiring W72 via a contact plug CPC71 in one of the contact holes. The common diffusion layer DNC61 is electrically connected to a wiring W74 in the first layer wiring via a contact plug CPC72 in one of the contact holes. The wirings W72 and W74 belong to the first layer wiring. The wirings W72 and W74 may be made of tungsten.

The wiring W72 is electrically connected to the first power supply line VSS via a conductive plug DPN72 in one of the first through holes. The wiring W74 is electrically connected to the first power supply line VSS via the conductive plug DPN74 in one of the first through holes. A power supply potential of the first power supply line VSS is supplied to the common diffusion layer DNC61 of the compensation capacitor in the N-channel region via the wirings W72 and W74 of the first layer wiring.

A connection relation between the gate wirings GWs and the signal lines is as follows.

The gate wiring GW1 connects a gate electrode GN1 of the transistor of the N-channel region Nch1 and a gate electrode GP1 of the transistor of the P-channel region Pch1. The gate wiring GW1 extends between the gate electrode GN1 of the transistor of the N-channel region Nch1 and the gate electrode GP1 of the transistor of the P-channel region Pch1. The gate wiring GW1 overlaps the common diffusion layer DNC61. The gate wiring GW1 is connected to a signal line SL2 via a conductive plug DPT71 in one of the first through holes. The signal line SL2 overlaps the common diffusion layer DNC61.

The gate wiring GW2 connects a gate electrode GN22 of the transistor of the N-channel region Nch2 and a gate electrode GP22 of the transistor of the P-channel region Pch2. The gate wiring GW2 extends between the gate electrode GN22 of the transistor of the N-channel region Nch2 and the gate electrode GP22 of the transistor of the P-channel region Pch2. The gate wiring GW2 is connected to a signal line SL1 via a conductive plug DPT72 in one of the first through holes. The gate wiring GW2 overlaps the common diffusion layer DNC61. The signal line SL1 overlaps the common diffusion layer DNC61.

The gate wiring GW3 connects a gate electrode GN31 of the transistor of the N-channel region Nch3 and a gate electrode GP31 of the transistor of the P-channel region Pch3. The gate wiring GW3 extends between the gate electrode GN31 of the transistor of the N-channel region Nch3 and the gate electrode GP31 of the transistor of the P-channel region Pch3. The gate wiring GW3 is connected to a signal line SL3 via a conductive plug DPT73 in one of the first through holes. The gate wiring GW3 overlaps the common diffusion layer DNC61. The signal line SL3 overlaps the common diffusion layer DNC61.

The gate wiring GW4 connects a gate electrode GN32 of the transistor of the N-channel region Nch3 and a gate electrode GP32 of the transistor of the P-channel region Pch3. The gate wiring GW4 extends between the gate electrode GN32 of the transistor of the N-channel region Nch3 and the gate electrode GP32 of the transistor of the P-channel region Pch3. The gate wiring GW4 is connected to a signal line SL4 via a conductive plug DPT74 in one of the first through holes. The gate wiring GW4 overlaps the common diffusion layer DNC61. The signal line SL4 overlaps the common diffusion layer DNC61.

The gate wiring GW5 connects a gate electrode GN33 of the transistor of the N-channel region Nch3 and a gate electrode GP33 of the transistor of the P-channel region Pch3. The gate wiring GW5 extends between the gate electrode GN33 of the transistor of the N-channel region Nch3 and the gate electrode GP33 of the transistor of the P-channel region Pch3. The gate wiring GW5 is connected to a signal line SL5 via a conductive plug DPT5 in one of the first through holes. The gate wiring GW5 overlaps the common diffusion layer DNC61. The signal line SL5 overlaps the common diffusion layer DNC61.

The configuration of the compensation capacitor of the present embodiment is different from that of the first embodiment. However, the present embodiment is the same as the first embodiment in terms of arranging the transistor at a circuit cell end side (that is, a vicinity of a power supply line) and arranging the compensation capacitor in a vicinity of the PN boundary. Accordingly, the gate wirings, each of which electrically connects the gate electrode of the transistor of the N-channel region and the gate electrode of the transistor of the P-channel region, overlap the compensation capacitor. The gate wirings pass above the compensation capacitor. The gate wirings extend over the compensation capacitor. A length of the gate wirings can be greater than that of the known semiconductor device. Thus, the number of arranged signal lines can be greater than that of the known semiconductor device.

Since the length of the gate wiring can be greater than that of the known semiconductor device, the signal lines directed to each circuit cell can be arranged without intersection of the signal lines or an insertion of wiring cells.

Figure 19:
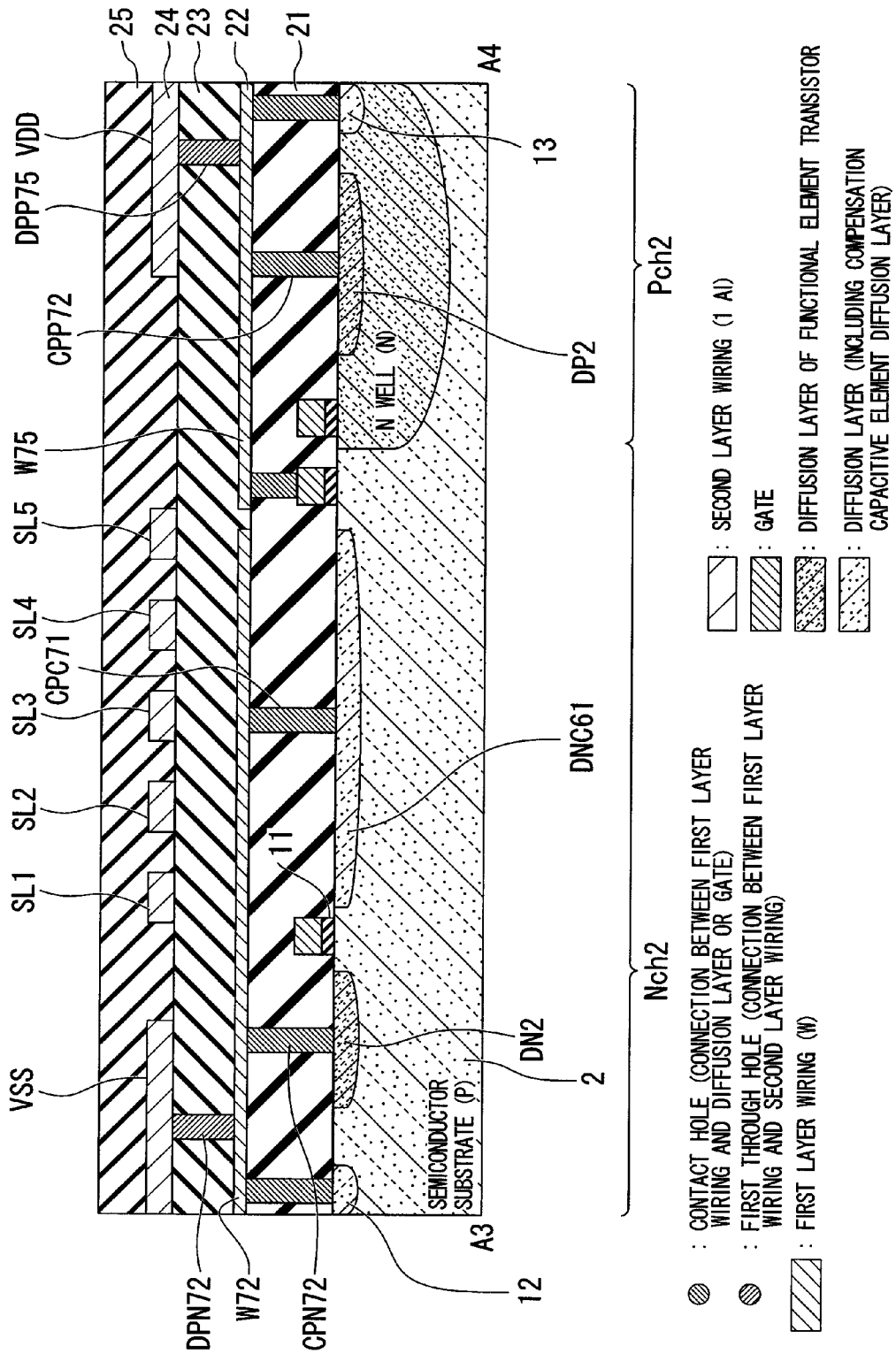
FIG. 19 is a fragmentary cross sectional elevation view, taken along an A3-A4 line of FIG. 15, illustrating the semiconductor device in accordance with another embodiment of the present invention.

FIG. 19 is a fragmentary cross sectional elevation view, taken along an A3-A4 line of FIG. 15.

Although not particularly shown, an insulating film for element separation is formed between elements.

The N-channel region Nch2 is disposed on an A3 side. The P-channel region Pch2 is disposed on A4 side.

The first diffusion layer DN2 of an N-type transistor N2 arranged in the N-channel region Nch2 is electrically connected to the wiring W72 in a first layer wiring 22 via the contact plug CPN72. The contact plug CPN72 fills one of the contact holes formed in an interlayer insulating film 21. The interlayer insulating film 21 covers a gate insulating film 11 and the gate electrodes GN1, GN21, GN22, GN31, GN32, GN33, GN4, GP1, GP21, GP22, GP31, GP32, GP33, and GP4.

The diffusion layer DNC61 of the compensation capacitor is electrically connected to the wiring W72 via the contact plug CPC71 in the contact hole formed in the interlayer insulating film 21.

The wiring W72 is electrically connected to the first power supply line VSS in a second layer wiring 24 via the conductive plug DPN72. The conductive plug DPN72 fills one of the first through holes formed in an interlayer insulating film 23. The interlayer insulating film 23 covers the wiring W2. The second layer wiring 24 is covered by a third interlayer insulating film 25.

The first diffusion layer DP2 of a P-type transistor P2 arranged in the P-channel region Pch2 is electrically connected to a wiring W75 in the first layer wiring 22 via a contact plug CPP72. The contact plug CPP72 fills one of the contact holes formed in the interlayer insulating film 21. The wiring W75 may be made of tungsten.

The wiring W75 is electrically connected to the second power supply line VDD in the second layer wiring 24 via a conductive plug DPP75 in one of the first through holes formed in the interlayer insulating film 23.

Figure 20:
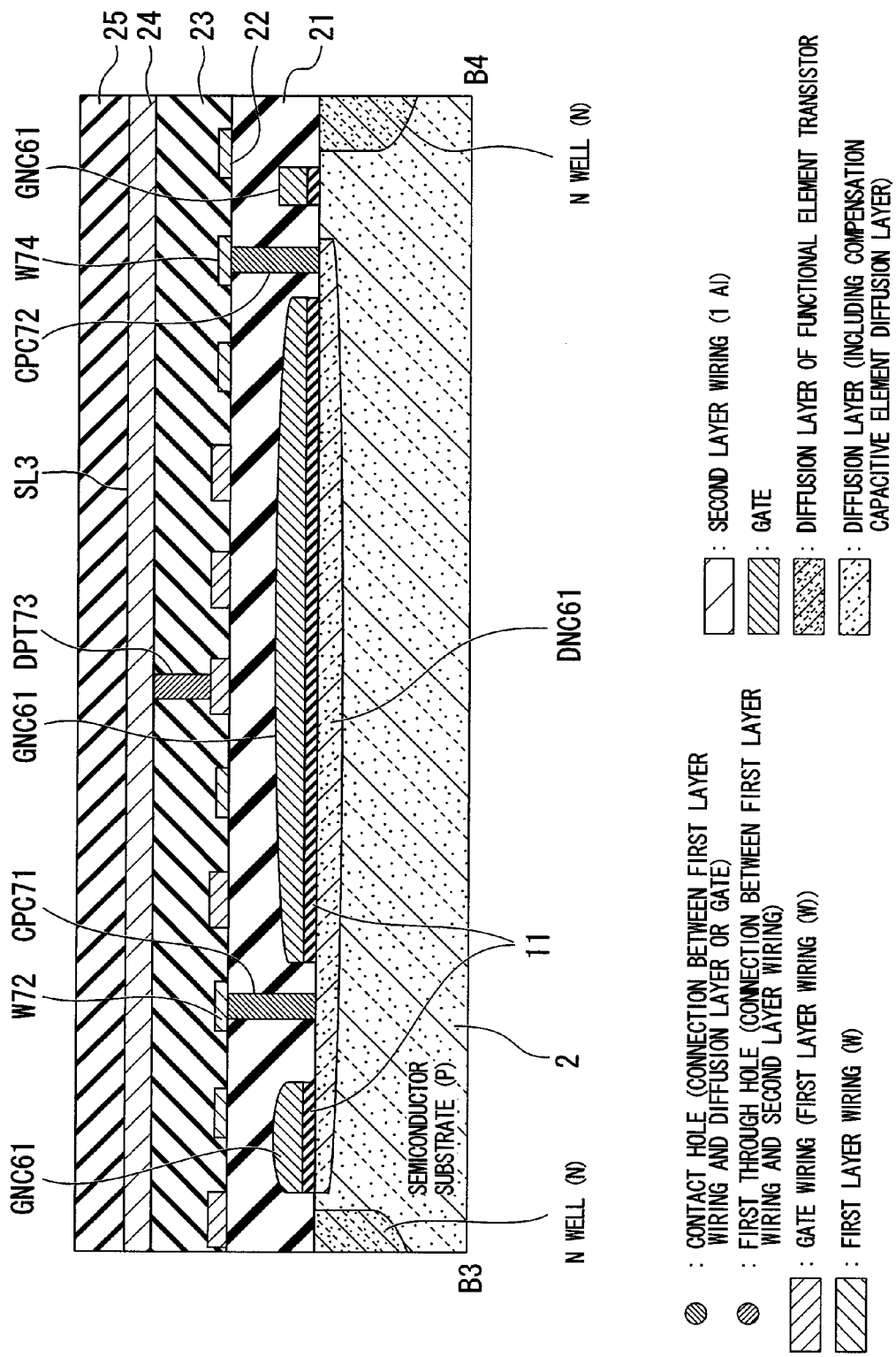
FIG. 20 is a fragmentary cross sectional elevation view, taken along a B3-B4 line of FIG. 15, illustrating the semiconductor device in accordance with another embodiment of the present invention.

FIG. 20 is a fragmentary cross sectional elevation view, taken along a B3-B4 line of FIG. 15.

On the common diffusion layer DNC61 of the compensation capacitor formed in the semiconductor substrate 2, the gate electrode GNC61 is formed while the gate insulating film 11 is interposed between the common diffusion layer DNC61 and the gate electrode GNC61.

The common diffusion layer DNC61 of the compensation capacitor is electrically connected to the wiring W72 in the first layer wiring via the contact plug CPC71 in one of the contact holes formed in the interlayer insulating film 21. The common diffusion layer DNC of the compensation capacitor is also electrically connected to the wiring W74 in the first layer wiring via the contact plug CPC72 in one of the contact holes formed in the first interlayer insulating film 21.

Figure 21:
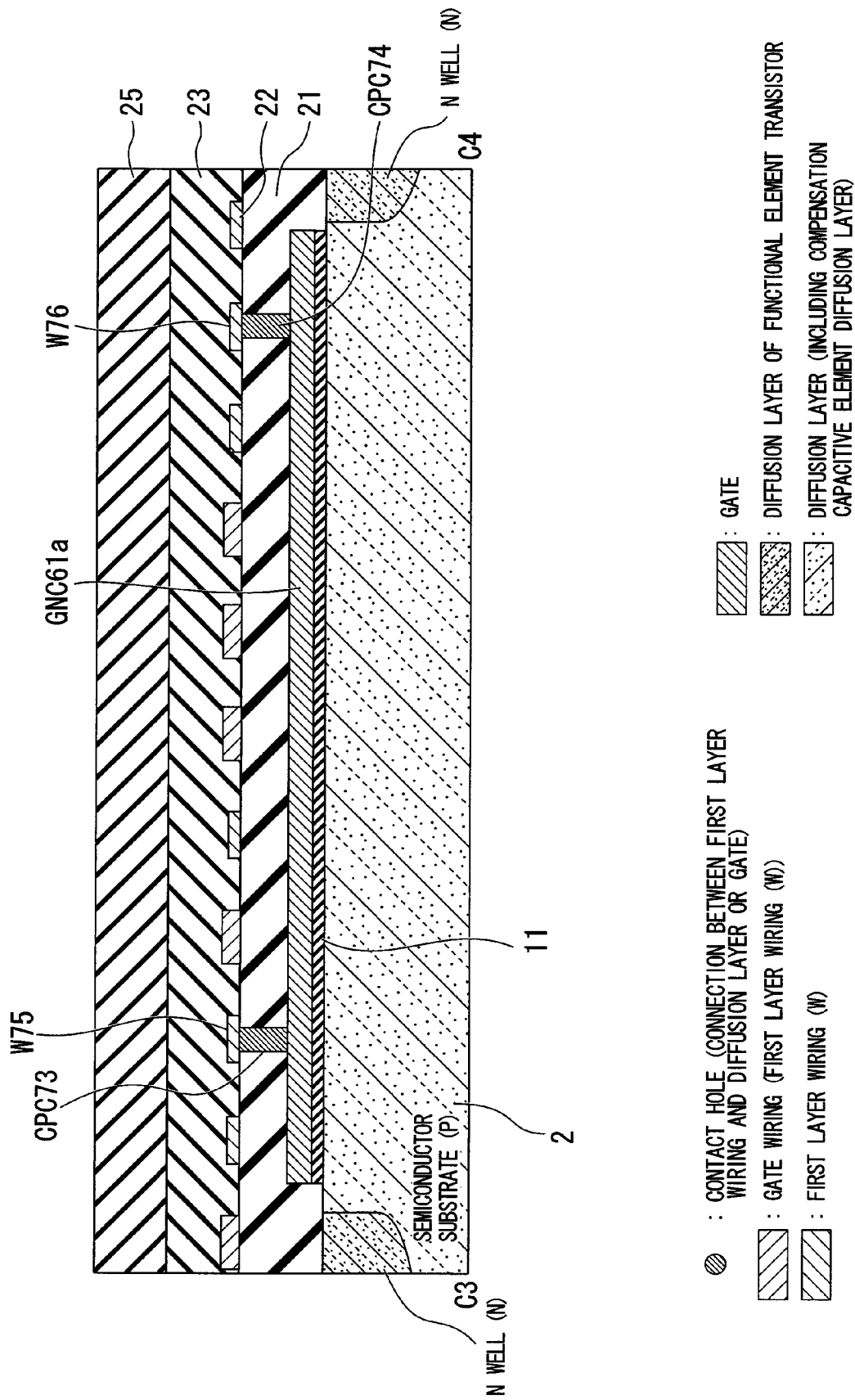
FIG. 21 is a fragmentary cross sectional elevation view, taken along a C3-C4 line of FIG. 15, illustrating the semiconductor device in accordance with another embodiment of the present invention.

FIG. 21 is a fragmentary cross sectional elevation view, taken along a C3-C4 line of FIG. 15.

The portion GNC61a of the gate electrode of the compensation capacitor common in the N-channel regions Nch1, Nch2, Nch3, and Nch4 is formed over the semiconductor substrate 2 while via the gate insulating film 11 is interposed between the portion GNC61a and the semiconductor substrate 2.

The portion GNC61a of the gate electrode is electrically connected to the wiring W75 in the first layer wiring 22 via the contact plug CPC73. The contact plug CPC73 fills one of the contact holes formed in the first interlayer insulating film 21. The first interlayer insulating film 21 covers the portion GNC61a. The portion GNC61a of the gate electrode is also electrically connected to a wiring W76 in the first layer wiring 22 via the contact plug CPC74. The wiring W76 may be made of tungsten.

Third Embodiment

FIG. 22 shows a part of a semiconductor device according to the third embodiment of the present invention, which is a layout of a part of a circuit block arranged in a peripheral circuit region 4. FIG. 22 is a fragmentary plan view elements, which are not disposed on a surface of the semiconductor device and are not actually visible, to facilitate understanding of a layout of the elements.

The present embodiment is a combination of the first embodiment and the second embodiment. A PN boundary is not formed in one straight line in an x-direction. The PN boundary is decided according to the size of transistors of P-channel regions Pch1, Pch2, Pch3, and Pch4 as shown in FIG. 22. A compensation capacitor is arranged in the P-channel region. Two compensation capacitors are arranged in an N-channel region.

FIG. 23 illustrates six circuit cells C1, C2, C3, C4, C5, and C6 by indicating a circuit cell frame by a dashed-dotted line. Each circuit cell has N-channel regions Nch1, Nch2, Nch3, Nch4, Nch5, and Nch6 and P-channel regions Pch1, Pch2, Pch3, Pch4, Pch5, and Pch6. Each N-channel region may be an example of the first circuit cell semiconductor region described above. Each P-channel region Pch1 may be an example of the second circuit cell semiconductor region described above. The N-channel regions Nch1, Nch2, Nch3, and Nch4 form the first semiconductor region. The P-channel regions Pch1, Pch2, Pch3, and Pch4 form the second semiconductor region. The N-channel regions Nch1, Nch2, Nch3, Nch4, Nch5, and Nch6 are disposed on a first side with respect to the PN boundary. The P-channel regions Pch1, Pch2, Pch3, Pch4, Pch5, and Pch6 are disposed on a second side with respect to the PN boundary. The PN boundary is not linear in the x-direction. As shown in FIG. 23, a part of the PN boundary X-X' is closer to the second power supply line VDD than a part of the PN boundary Y-Y'. The part of the PN boundary Y-Y' is closer to the first power supply line VSS than a part of the PN boundary Z-Z'. The part of the PN boundary X-X' is closer to the second power supply line VDD than the part of the PN boundary Z-Z'. A part of the PN boundary Y-X' is disposed in the circuit cell C3. A part of the PN boundary Y'-Z is disposed in the circuit cell C5.

Hereinafter, the semiconductor device according to this embodiment will be described in detail.

The N-channel region Nch1 includes first and second diffusion layers DN1 of a transistor and a common diffusion layer DNC81 of a compensation capacitor. The N-channel region Nch2 includes first and second diffusion layers DN2 of a transistor and the common diffusion layer DNC81 of a compensation capacitor. The N-channel region Nch3 includes first and second diffusion layers DN3 of a transistor, but does not have a compensation capacitor. The N-channel region Nch4 includes first and second diffusion layers DN4 of a transistor, but does not have a compensation capacitor. The N-channel region Nch5 includes first and second diffusion layers DN5 of a transistor and a common diffusion layer DNC82 of a compensation capacitor. The N-channel region Nch6 includes first and second diffusion layers DN6 of a transistor and the common diffusion layer DNC82 of a compensation capacitor. A pair of first and second diffusion layers DN1 is spatially separated from the common diffusion layer DNC81 in plain view. A pair of first and second diffusion layers DN2 is spatially separated from the common diffusion layer DNC81 in plain view. A pair of first and second diffusion layers DN5 is spatially separated from the common diffusion layer DNC82 in plain view. A pair of first and second diffusion layers DN6 is spatially separated from the common diffusion layer DNC82 in plain view.

The P-channel region Pch1 includes first and second diffusion layers DP1 of a transistor, but does not have a compensation capacitor. The P-channel region Pch2 includes first and second diffusion layers DP3 of a transistor, but does not have a compensation capacitor. The P-channel region Pch4 includes first and second diffusion layers DP4 of a transistor, but does not have a compensation capacitor. The P-channel region Pch5 includes first and second diffusion layers DP5 of a transistor and a common diffusion layer DPC81 of a compensation capacitor. The P-channel region Pch6 includes first and second diffusion layers DP6 of a transistor and the common diffusion layer DPC81 of a compensation capacitor. A pair of first and second diffusion layers DP5 is spatially separated from the common diffusion layer DPC81 in plain view. A pair of first and second diffusion layers DP6 is spatially separated from the common diffusion layer DPC81 in plain view.

The common diffusion layer DNC81 is disposed between the first and second diffusion layers DN1 and the first and second diffusion layers DP1. The common diffusion layer DNC81 is disposed between the first and second diffusion layers DN2 and the first and second diffusion layers DP2. The common diffusion layer DNC82 is disposed between the first and second diffusion layers DN5 and the first and second diffusion layers DP5. The common diffusion layer DNC82 is disposed between the first and second diffusion layers DN6 and the first and second diffusion layers DP6. The common diffusion layer DPC81 is disposed between the common diffusion layer DNC82 and the first and second diffusion layers DP5. The common diffusion layer DPC81 is disposed between the common diffusion layer DNC82 and the first and second diffusion layers DP6.

In the present embodiment, both of a length (width) of the x-direction and a length (width) of the y-direction of the transistor arranged in each channel region may be different. Alternatively, the length (width) of the y-direction may be identical but the length (width) of the x-direction may be different.

The first and second diffusion layers are arranged at both sides of the gate electrode, but the first and second diffusion layers are shown as one element including the portion of the gate electrode in FIG. 23. In the present embodiment, the first diffusion layer and the second diffusion layer use a common symbol so as to avoid the complexity on the drawings.

FIG. 24 is a fragmentary plan view showing a layout of gate electrodes over FIG. 23.

In the N-channel regions, gate electrodes GN81, GN82, GN83, GN84a, GN84b, GN85a, GN85b, GN85c, and GN86 are arranged. The gate electrode GN81 belongs to the transistor of the N-channel region Nch1, which has the pair of first and second diffusion layers DN1. The gate electrode GN82 belongs to the transistors of the N-channel region Nch2, which have the pair of first and second diffusion layers DN2. The gate electrode GN83 belongs to the transistors of the N-channel region Nch3, which have the pair of first and second diffusion layers DN3. The gate electrodes GN84a and GN84b belong to the transistor of the N-channel region Nch4, which has the pair of the first and second diffusion layers DN4. The gate electrodes GN85a, GN85b, and GN85c belong to the transistor of the N-channel region Nch5, which has the pair of the first and second diffusion layers DN5. The gate electrode GN86 belongs to the transistor of the N-channel region Nch6, which has the pair of the first and second diffusion layers DN6.

In the P-channel regions, gate electrodes GP81, GP82, GP83, GP84a, GP84b, GP85a, GP85b, GP85c, and GP86 are arranged. The gate electrode GP81 belongs to the transistor of the P-channel region Pch1, which has the pair of first and second diffusion layers DP1. The gate electrode GP82 belongs to the transistor of the P-channel region Pch2, which has the pair of first and second diffusion layers DP2. The gate electrode GP83 belongs to the transistors of the P-channel region Pch3, which have the pair of first and second diffusion layers DP3. The gate electrodes GP84a and GP84b belong to the transistor of the P-channel region Pch4, which has the pair of the first and second diffusion layers DP4. The gate electrodes GP85a, GP85b, and GP85c belong to the transistor of the P-channel region Pch5, which has the pair of the first and second diffusion layers DP5. The gate electrode GP86 belongs to the transistor of the P-channel region Pch6, which has the pair of the first and second diffusion layers DP6.

Figure 25:
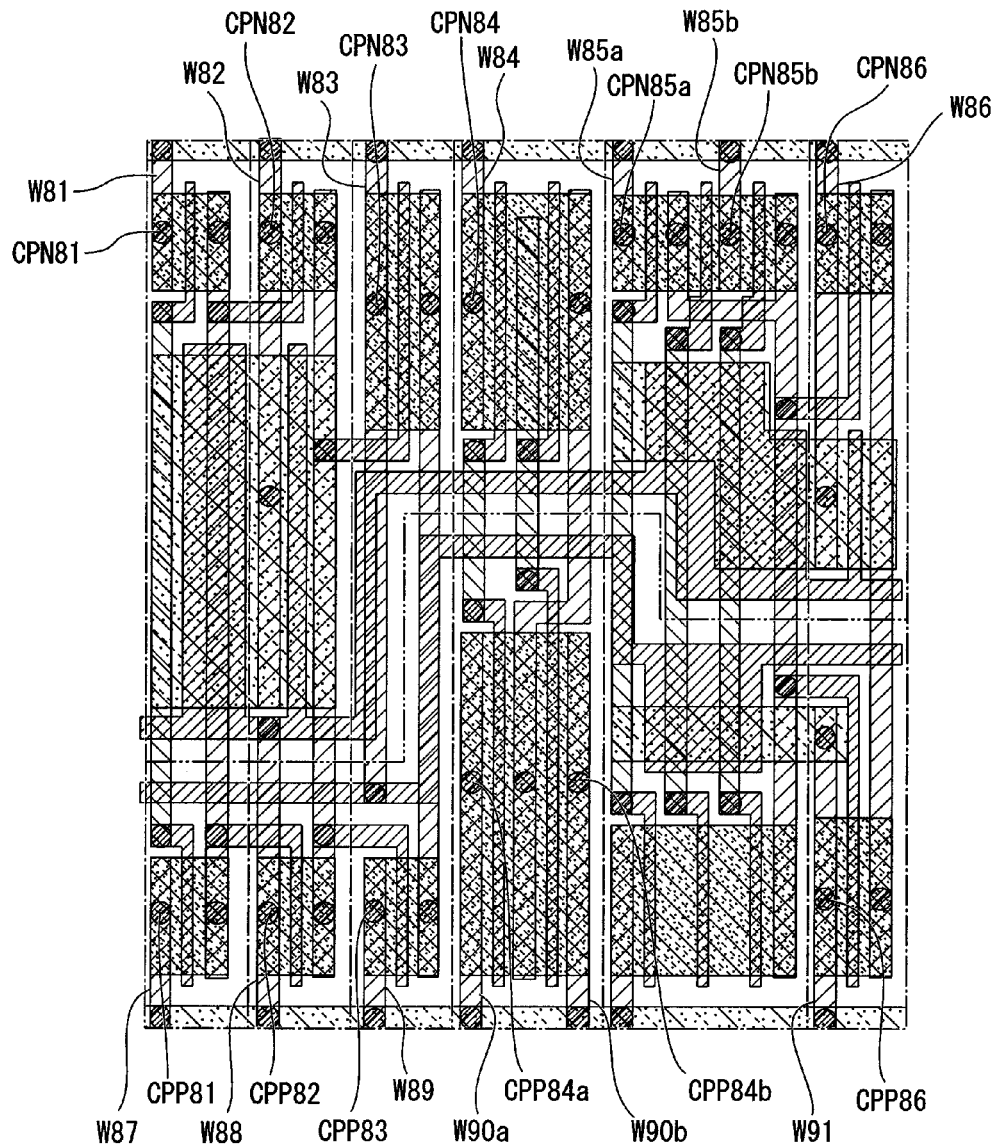
FIG. 25 is a fragmentary plan view showing layouts of a wiring pattern of a first layer wiring and contact plugs over FIG. 23 in accordance with another embodiment of the present invention.

FIG. 25 is a fragmentary plan view showing layouts of wirings (wiring patterns) of a first layer wiring including a gate wiring, a plurality of contact holes connecting the wirings of the first layer wiring and diffusion layers, contact plugs filled therein, a plurality of contact holes connecting the wirings of the first layer wiring and gate wirings, and contact plugs filled therein. These elements are overlapped with the elements shown in FIG. 24.

The following description will be given with reference to FIGS. 25 and 22.

The first diffusion layer (source) DN1 of the transistor of the N-channel region Nch1 is connected to a wiring W81 via a contact plug CPN81. The wiring W81 is connected to the first power supply line VSS of the second layer wiring via a conductive plug DPN81 in one of first through holes. The wiring W81 belongs to the first layer wiring. The wiring W81 may be made of tungsten.

The first diffusion layer (source) DN2 of the transistor of the N-channel region Nch2 is connected to a wiring W82 wiring via a contact plug CPN82. The wiring W82 is connected to the first power supply line VSS of the second layer wiring via a conductive plug DPN82 in one of the first through holes. The wiring W82 belongs to the first layer wiring. The wiring W82 may be made of tungsten.

The first diffusion layer (source) DN3 of the transistor of the N-channel region Nch3 is connected to a wiring W83 via a contact plug CPN83. The wiring W83 is connected to the first power supply line VSS of the second layer wiring via a conductive plug DPN83 in one of the first through holes. The wiring W83 belongs to the first layer wiring. The wiring W83 may be made of tungsten.

The first diffusion layer (source) DN4 of the transistor of the N-channel region Nch4 is connected to a wiring W84 via a contact plug CPN84. The wiring W84 is connected to the first power supply line VSS of the second layer wiring via a conductive plug DPN84 in one of the first through holes. The wiring W84 belongs to the first layer wiring. The wiring W84 may be made of tungsten.

The first diffusion layer (source) DN5 of the transistor of the N-channel region Nch5 is connected to a wiring W85a via a contact plug CPN85a. The wiring W85a is connected to the first power supply line VSS of the second layer wiring via a conductive plug DPN85a in one of the first through holes. The first diffusion layer (source) DN5 is connected to a wiring W85b via a contact plug CPN85b. The wiring W85b is connected to the first power supply line VSS of the second layer wiring via a conductive plug DPN85b in one of the first through holes. The wirings W85a and W85b belong to the first layer wiring. The wirings W85a and 85b may be made of tungsten.

The first diffusion layer (source) DN6 of the transistor of the N-channel region Nch6 is connected to a wiring W86 via a contact plug CPN86. The wiring W86 is connected to the first power supply line VSS of the second layer wiring via a conductive plug DPN86 in one of the first through holes. The wiring W86 belongs to the first layer wiring. The wiring W86 may be made of tungsten.

The first diffusion layer (source) DP1 of the transistor of the P-channel region Pch1 is connected to a wiring W87 via a contact plug CPP81. The wiring W87 is connected to the second power supply line VDD of the second layer wiring via a conductive plug DPP81 in one of the first through holes. The wiring W87 belongs to the first layer wiring. The wiring W87 may be made of tungsten.

The first diffusion layer (source) DP2 of the transistor of the P-channel region Pch2 is connected to a wiring W88 via a contact plug CPP82. The wiring W88 is connected to the second power supply line VDD of the second layer wiring via a conductive plug DPP82 in one of the first through holes. The wiring W87 belongs to the first layer wiring. The wiring W88 may be made of tungsten.

The first diffusion layer (source) DP3 of the transistor of the P-channel region Pch3 is connected to a wiring W89 via a contact plug CPP83. The wiring W89 is connected to the second power supply line VDD of the second layer wiring via a conductive plug DPP83 in one of the first through holes. The wiring W89 belongs to the first layer wiring. The wiring W89 may be made of tungsten.

The first diffusion layer (source) DP4 of the transistor of the P-channel region Pch4 is connected to a wiring W90a via a contact plug CPP84a. The wiring W90a is connected to the second power supply line VDD of the second layer wiring via a conductive plug DPP84a in one of the first through holes. The first diffusion layer (source) DP4 is connected to a wiring W90b via a contact plug CPP84b. The wiring W90b is connected to the second power supply line VDD of the second layer wiring via a conductive plug DPP84b in one of the first through holes. The wirings W90a and W90b belong to the first layer wiring. The wirings W90a and W90b may be made of tungsten.

The first diffusion layer (source) DP6 of the transistor of the P-channel region Pch6 is connected to a wiring W91 via a contact plug CPP86. The wiring W91 is connected to the second power supply line VDD of the second layer wiring via a conductive plug DPP86 in one of the first through holes. The wiring W91 belongs to the first layer wiring. The wiring W91 may be made of tungsten.

The gate wiring GW81 connects the gate electrode GN81 of the transistor of the N-channel region Nch1 and the gate electrode GP81 of the transistor of the P-channel region Pch1. The gate wiring GW81 extends between the gate electrode GN81 of the transistor of the N-channel region Nch1 and the gate electrode GP81 of the transistor of the P-channel region Pch1. The gate wiring GW81 is connected to a signal line SL3 via a conductive plug DPT81 in one of the first through holes. The gate wiring GW81 overlaps the common diffusion layer DNC81.

The gate wiring GW82 connects the gate electrode GN84a of the transistor of the N-channel region Nch4 and the gate electrode GP84a of the transistor of the P-channel region Pch4. The gate wiring GW2 extends between the gate electrode GN84a of the transistor of the N-channel region Nch4 and the gate electrode GP84a of the transistor of the P-channel region Pch4. The gate wiring GW82 is connected to a signal line SL4 via a conductive plug DPT82 in one of the first through holes.

The gate wiring GW83 connects the gate electrode GN84b of the transistor of the N-channel region Nch4 and the gate electrode GP84b of the transistor of the P-channel region Pch4. The gate wiring GW83 extends between the gate electrode GN84b of the transistor of the N-channel region Nch4 and the gate electrode GP84b of the transistor of the P-channel region Pch4. The gate wiring GW83 is connected to a signal line SL1 via a conductive plug DPT83 in one of the first through holes.

The A gate wiring GW84 connects the gate electrode GN85a of the transistor of the N-channel region Nch5 and the gate electrode GP85a of the transistor of the P-channel region Pch5. The gate wiring GW84 extends between the gate electrode GN85a of the transistor of the N-channel region Nch5 and the gate electrode GP85a of the transistor of the P-channel region Pch5. The gate wiring GW84 is connected to a signal line SL2 via a conductive plug DPT84 in one of the first through holes. The gate wiring GW84 overlaps the common diffusion layer DNC82 and the common diffusion layer DPC81.

The gate wiring GW85 connects the gate electrode GN85b of the transistor of the N-channel region Nch5 and the gate electrode GP85b of the transistor of the P-channel region Pch5. The gate wiring GW85 extends between the gate electrode GN85b of the transistor of the N-channel region Nch5 and the gate electrode GP85b of the transistor of the P-channel region Pch5. The gate wiring GW85 is connected to a signal line SL5 via a conductive plug DPT85 in one of the first through holes. The gate wiring GW85 overlaps the common diffusion layer DNC82 and the common diffusion layer DPC81.

The gate wiring GW86 connects a gate electrode GN85c of the transistor of the N-channel region Nch5 and a gate electrode GP85c of the transistor of the P-channel region Pch5. The gate wiring GW86 extends between the gate electrode GN85c of the transistor of the N-channel region Nch5 and the gate electrode GP85c of the transistor of the P-channel region Pch5. The gate wiring GW86 is connected to a signal line SL6 via a conductive plug DPT86 in one of the first through holes. The gate wiring GW86 overlaps the common diffusion layer DNC82 and the common diffusion layer DPC81.

In the present embodiment, the transistors are disposed at a circuit cell end side (that is, a vicinity of power supply line) in each region of the N-channel region and the P-channel region as described above. The compensation capacitors are disposed at a vicinity of the PN boundary in each region of the N-channel region and the P-channel region. A length of the gate wirings, each of which electrically connects the gate electrode of the transistor of the N-channel region and the gate electrode of the transistor of the P-channel region, can be configured to be greater than that of the known semiconductor device. Thus, the number of arranged signal lines can be greater than that of the known semiconductor device.

Since the length of the gate wiring can be greater than that of the known semiconductor device, the signal lines directed to each circuit cell can be arranged without intersection of the signal lines or an insertion of wiring cells.

The power supply line has a fixed potential. In some cases, the fixed potential may be the same as the power potential. In other cases, the fixed potential may be different from the power potential. The fixed potential may be, but is not limited to, an internal potential different from the power potential. The fixed potential may be the ground, a positive, or a negative level.

The present invention is applicable in industries that manufacture/use semiconductor devices provided with compensation elements.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
    a semiconductor substrate including first, second and third regions, the third region sandwiched between the first and second regions;
    a first transistor of a first conductivity type disposed in the first region;
    a second transistor of a second conductivity type disposed in the second region;
    a first capacitor disposed in the third region; and
    a first wiring electrically coupling one of main electrodes of the first transistor and one of main electrodes of the second transistor, the first wiring passing above the first capacitor.
2. The semiconductor device according to claim 1, further comprising:
    a signal line extending in a first direction, the signal line overlapping the first capacitor, the signal line being electrically coupled to the first wiring, and
    wherein the first, third and second regions are arranged in a second direction different from the first direction.
3. The semiconductor device according to claim 1, further comprising:
    first and second power supply lines coupled respectively to first and second electrodes of the first capacitor.
4. The semiconductor device according to claim 3, wherein the first power supply line is elongated in a first direction and passes above the first region,
    wherein the second power supply line is elongated in the first direction and passes above the second region.
5. The semiconductor device according to claim 4, wherein the first power supply line is coupled to the other of the main electrodes of the first transistor,
    wherein the second power supply is coupled to the other of the main electrodes of the second transistor.
6. The semiconductor device according to claim 1, further comprising:
    a third transistor of the first conductivity type; and
    a fourth transistor of the second conductivity type, and
    wherein the first, third and second regions are arranged in a first direction,
    wherein the semiconductor substrate further includes fourth, fifth and sixth regions,
    wherein the first and fourth regions are arranged in a second direction different from the first direction,
    wherein the second and fifth regions are arranged in the second direction,
    wherein the third and sixth regions are arranged in the second direction,
    wherein the third and fourth transistors are disposed respectively on the fourth and the fifth regions,
    wherein the first capacitor is disposed on both of the third and sixth regions.
7. The semiconductor device according to claim 6, further comprising:
    a second wiring electrically coupling one of main electrodes of the third transistor and one of main electrode of the fourth transistor, the second wiring passing above the first capacitor.
8. The semiconductor device according to claim 1, wherein the first region is of the first conductivity type and the second region is of the second conductivity type.
9. The semiconductor device according to claim 8, further comprising:
    a second capacitor, and
    wherein the third region includes a first portion of the first conductivity type and a second portion of the second conductivity type,
    wherein the second portion is sandwiched between the first portion and the second region,
    wherein the first and second capacitors are disposed respectively on the first and second portion of the third region,
    wherein the first wiring passes above both of the first and second capacitors.
10. The semiconductor device according to claim 9, further comprising:
    first and second power supply lines, and
    wherein the first portion of the third region includes a first diffusion layer and a first conductive layer serving respectively as first and second electrodes of the first capacitor, wherein the second portion of the third region includes a second diffusion layer and a second conductive layer serving respectively as first and second electrodes of the second capacitor, wherein the first power supply line is coupled to the first diffusion layer of the first portion of the third region and the second conductive layer of the second portion of the third region, wherein the second power supply line is coupled to the second diffusion layer of the first portion of the third region and the first conductive layer of the second portion of the third region.

11. The semiconductor device according to claim 9, wherein the third region includes a boundary defined by the first and second portions, the boundary including a first part elongated in a first direction and a second part elongated in the second direction different from the first direction.

12. The semiconductor device according to claim 1, wherein the first capacitor is a compensation capacitor.

13. A device comprising:
   a semiconductor substrate including,
      a first region of a first conductivity type,
      a second region of a second conductivity type, the second region being in contact with the first region to form a PN junction;
   first and second power supply lines arranged respectively over the first and second regions;
   a first transistor of a first channel type disposed in a first part of the first region, the first part being between the PN junction and the first power supply line;
   a second transistor of a second channel type disposed in a second part of the second region, the second part being between the junction separation and the second power supply line;
   a first capacitor disposed in a third part of the first region, the third part being between the junction separation and the first part of the first region; and
   a first wiring electrically coupling one of main electrodes of the first transistor and one of main electrodes of the second transistor, the first wiring passing above the first capacitor.

14. The device as claimed in claim 13, wherein the first transistor includes a first gate electrode, the second transistor includes a second gate electrode and the device further comprises a second wiring electrically coupling the first gate electrode and the second gate electrode.

15. The device as claimed in claim 13, wherein the first and second conductivity regions are arranged in a first direction, and each of the first and second power supply lines extends in a second direction that crosses to the first direction.

16. The device as claimed in claim 15, wherein the first transistor includes a first gate electrode, the second transistor includes a second gate electrode and the device further comprises a second wiring electrically coupling the first gate electrode and the second gate electrode.

17. The device as claimed in claim 16, further comprising a signal line arranged over the third part of the first conductivity region and electrically coupled to the second wiring.

18. The device as claimed in claim 13, further comprising a second capacitor disposed in a fourth part of the second region,
   wherein the fourth part is between the junction separation and the second part of the second region.

19. The device as claimed in claim 13, wherein the other of the main electrodes of the first transistor coupled to the first power supply line and the other of the main electrodes of the second transistor coupled to the second power supply line.

20. The device as claimed in claim 13, further comprising a multi-level wiring structure formed over the semiconductor substrate and including a first wiring layer, a second wiring layer that is over first wiring layer,
   wherein the first transistor includes the main electrodes formed as first source and first drain diffusion layers each of which is formed in the semiconductor substrate and a first gate electrode formed as the first wiring layer, the second transistor includes the main electrodes formed as second source and second drain diffusion layers each of which is formed in the semiconductor substrate and a second gate electrode formed as the first wiring layer, the first capacitor includes a first electrode formed as a diffusion layer in the semiconductor substrate and a second electrode formed as the first wiring layer, and the first wiring is formed as the second wiring layer.

* * * * *